(12) United States Patent
Aurola

(10) Patent No.: US 10,833,080 B2
(45) Date of Patent: *Nov. 10, 2020

(54) SEMICONDUCTOR LOGIC ELEMENT AND LOGIC CIRCUITRIES

(71) Applicant: HYPERION SEMICONDUCTORS OY, Helsinki (FI)

(72) Inventor: Artto Aurola, Helsinki (FI)

(73) Assignee: HYPERION SEMICONDUCTORS OY, Espoo (FI)

(*) Notice: Subject to any disclaimer, the term of this patent is extended or adjusted under 35 U.S.C. 154(b) by 0 days.

This patent is subject to a terminal disclaimer.

(21) Appl. No.: 16/318,001

(22) PCT Filed: Jul. 13, 2017

(86) PCT No.: PCT/FI2017/050537
§ 371 (c)(1),
(2) Date: Jan. 15, 2019

(87) PCT Pub. No.: WO2018/011472
PCT Pub. Date: Jan. 18, 2018

(65) Prior Publication Data
US 2019/0244958 A1  Aug. 8, 2019

(30) Foreign Application Priority Data

Jul. 14, 2016  (FI) .................................... 20160183

(51) Int. Cl.
*H01L 27/092* (2006.01)
*H01L 27/085* (2006.01)
(Continued)

(52) U.S. Cl.
CPC .... *H01L 27/092* (2013.01); *H01L 21/823807* (2013.01); *H01L 27/0207* (2013.01);
(Continued)

(58) Field of Classification Search
None
See application file for complete search history.

(56) References Cited

U.S. PATENT DOCUMENTS

| 9,948,304 B2* | 4/2018 | Aurola ................. H01L 27/098 |
| 2010/0109708 A1 | 5/2010 | Koyama et al. |
| 2010/0264956 A1 | 10/2010 | Yin et al. |

FOREIGN PATENT DOCUMENTS

CA  2 973 650 A1  7/2016

OTHER PUBLICATIONS

Melek et al., "Ultra-Low Voltage CMOS Logic Circuits," 2014 Argentine School of Micro-Nanoelectronics, Technology and Applications (EAMTA), Mendoza, 2014, pp. 1-7.
(Continued)

*Primary Examiner* — Herve-Louis Y Assouman
(74) *Attorney, Agent, or Firm* — Nixon & Vanderhye

(57) ABSTRACT

Disclosed is a semiconductor logic element having a field effect transistor of the first conductivity type and a field effect transistor of the second conductivity type. A gate of the first FET is an input of the semiconductor logic element, a drain of the second FET is referred to as the output of the semiconductor logic element and a source of the second FET is the source of the semiconductor logic element. By applying applicable potentials to the terminals of the field effect transistors it is possible to influence the state of the output of the logic element. Also disclosed are different kinds of logic circuitries with the described logic element.

25 Claims, 16 Drawing Sheets

(51) Int. Cl.
  *H01L 27/098* (2006.01)
  *H01L 21/8238* (2006.01)
  *H01L 27/02* (2006.01)
  *H01L 27/12* (2006.01)
  *H03K 19/003* (2006.01)
  *H03K 19/0952* (2006.01)
  *H03K 19/20* (2006.01)
  *H03K 19/094* (2006.01)

(52) U.S. Cl.
  CPC .......... *H01L 27/085* (2013.01); *H01L 27/098* (2013.01); *H01L 27/1203* (2013.01); *H03K 19/003* (2013.01); *H03K 19/094* (2013.01); *H03K 19/0952* (2013.01); *H03K 19/20* (2013.01)

(56) References Cited

OTHER PUBLICATIONS

International Search Report, PCT/FI2017/050537, dated Nov. 7, 2017.
Finnish Search Report, FI 20160183, dated Nov. 17, 2016.
S.M. Sharroush, "Analysis of the Subthreshold CMOS Logic Inverter", Ain Shams Engineering Journal (2016). Article in press, available online Jun. 30, 2016. D0I:10.1 016/j.asej.2016.05.005; abstract; figures 1,4; sections 1-2.
Written Opinion, PCT/FR2017/050537, dated Nov. 7, 2017.
Cited in the Supplementary European Search Report issued in European Patent Application No. EP 17 82 7058 dated Jan. 17, 2020.
Shao, H. et al., "A robust, input voltage adaptive and low energy consumption level converter for sub-threshold logic," 33rd European Solid State Circuits Conference, Sep. 2007, pp. 312-315.

\* cited by examiner

SEMICONDUCTOR LOGIC ELEMENT AND LOGIC CIRCUITRIES

FIELD OF THE INVENTION

The invention relates to semiconductor solutions. More specifically, the invention relates to semiconductor logic elements replacing, at least partly, traditional semiconductor logic elements in complementary binary logic.

BACKGROUND OF THE INVENTION

For sake of clarity of the disclosure the following remarks are done. In this text the term complementary binary logic refers to a logic circuitry comprising a set of logic elements that correspond either to semiconductor logic elements or to complementary semiconductor logic elements each of them having an input and an output. During a steady state in the complementary binary logic circuitry
- the potential at an input or at an output can have only two different values which are referred to as logic potentials, and
- there are no conductive paths between the nodes in the set of semiconductor logic elements that are at different potentials enabling thus low steady state power consumption.

In addition, it is only possible in complementary binary logic to establish a network of logic elements having the outputs of logic elements connected to the inputs of other logic elements and wherein the inputs/outputs of logic elements are biased only at a two different potentials that are the same throughout the network.

It is important to note that the term logic separates a semiconductor logic element and logic circuitries comprising semiconductor logic elements from analog regulation elements/circuitries. It should be also noted that in this text the terms binary logic, complementary logic, and logic are utilized generally in a context referring to the complementary binary logic since no other logic types are examined in this text. Furthermore, in this text the Complementary Metal Oxide Semiconductor (CMOS) logic is referred to as traditional Complementary Conductor Insulator Semiconductor (CCIS) logic due to broader and more accurate scope. In a similar fashion a Metal Oxide Semiconductor Field Effect Transistor (MOSFET) is referred to as Conductor Insulator Semiconductor Field Effect Transistor (CISFET). The traditional CCIS logic is based on two opposite type enhancement mode CISFETs.

FIG. 2 illustrate a schematic layout of the two opposite type enhancement mode CISFET and FIG. 1 illustrates a schematic cross-section of the two opposite type enhancement mode CISFET along the dashed line 271 of FIG. 2. The backslash lines in FIGS. 1 and 2 refer to first conductivity type and the slash lines refer to second conductivity type. The two different conductivity types refer to p and n type but which way they are arranged is not relevant.

The CISFET on the left hand side comprises a first conductivity type source doping 111 corresponding to source, a first conductivity type drain doping 113 corresponding to drain and output, an external gate 125 corresponding to gate and output, a layer of gate insulator material 161 surrounding the external gate (except at the location of the gate contact), a second conductivity type back-gate doping 147, and a second conductivity type contact doping 117 to the back-gate doping 147. The CISFET on the right hand side comprises a second conductivity type source doping 112 corresponding to source, a second conductivity type drain doping 114 corresponding to drain and output, an external gate 126 corresponding to gate and input, a layer of gate insulator material 161 surrounding the external gate (except at the location of the gate contact), a first conductivity type back-gate doping 148, and a first conductivity type contact doping 118 to the back-gate doping 148. The both CISFETs and the contact dopings are surrounded by an insulator trench 162. Beneath the CISFETs there is a semiconductor substrate 100 of either conductivity type.

The back-gate doping can be connected to a separate node referred to as auxiliary gate node and the potential on the auxiliary gate node can be used to adjust the threshold voltage of the corresponding CISFET. In case the back-gate doping of the CISFET is of the same conductivity type as the semiconductor substrate then the auxiliary gate node is common to all CISFETs of this type. When the back-gate doping of the CISFET is of the opposite conductivity type than the substrate then this type CISFETs have individual auxiliary gate nodes. It is possible to have individual auxiliary gate nodes for both type CISFETs by incorporating underneath the CISFETs an insulator layer and by incorporating deep enough trenches that reach to this insulator layer but this would increase the cost. Another option is to provide a suitable well doping of the opposite doping type than the substrate that can be used for isolating the substrate from the same conductivity type back-gate doping. The back-gate doping can be connected also to the source of the corresponding CISFET but in this case the ability to adjust the threshold voltage is lost. The second type CISFET on the right comprising the source, input, and output corresponds to a traditional semiconductor logic element comprising a source, input, and output. Similarly, the first type CISFET on the left comprising the source, input, and output corresponds to a traditional complementary semiconductor logic element having afore described source, input, and output. The traditional semiconductor logic element and the traditional complementary semiconductor logic element enable the realization of traditional complementary binary logic being capable of performing logic operations. Consequently, the said two opposite type CISFETs enable the realization of traditional CCIS logic being capable of performing logic operations.

In the traditional CCIS logic it is a common arrangement that in a set of traditional semiconductor logic elements and of traditional complementary semiconductor logic elements the second conductivity type source of the traditional semiconductor logic element is connected to a first logic potential, that the first conductivity type source in the traditional complementary semiconductor logic element is connected to a second logic potential, that the gate 126 acts as the input and the drain 114 as the output of the traditional semiconductor logic element, that the gate 125 acts as the input and the drain 113 as the output of the traditional complementary semiconductor logic element, and that the inputs and outputs of the traditional semiconductor and complementary semiconductor logic elements can be during steady state only at the first logic potential or at the second logic potential. Furthermore, in the traditional semiconductor logic element a channel connecting the source and the drain is
- nonconductive when the source and input are at first logic potential, and
- conductive when the source is at first logic potential and the input is at second logic potential. Similarly in a traditional complementary semiconductor logic element a channel connecting the source and the drain is nonconductive when the source and input are at second logic potential, and conductive when the source is at second logic potential and the input is at first logic potential. In the traditional CCIS logic afore said common arrangement is utilized in order to perform logic operations. An important operational feature of afore said arrangement in the traditional CCIS logic is that when the input is at the same logic potential than the source in the traditional semiconductor logic element or in the traditional complementary semiconductor logic element then the output can be at either logic potential (at first logic potential or at second logic potential), i.e., the input has no control over the output. On the other hand when the input and the source are at different logic potentials then the output is set to the same logic potential as the source, i.e., the input determines the logic potential on the output.

A great and unique benefit of the traditional CCIS logic is that it consumes only very little power. This is due to the fact there are no conductive current paths between two nodes that are at different potentials in the part of the traditional CCIS logic circuitry that is in steady state, i.e., during steady state the power consumption is due to leakage only which is not the case in any other published semiconductor logic arrangement. A big benefit of the traditional CCIS logic is also that the corresponding traditional semiconductor logic elements and traditional complementary semiconductor logic elements consume only very little area and thus a lot of circuitry can be packed into a small area resulting in low cost. Another big benefit of the traditional CCIS logic is that in the conductive stage the channel corresponds to an inversion layer of mobile charge carriers meaning that a lot of charge can be packed into the channel resulting in fast operation. Beside the low power consumption, low cost, and fast operation the traditional CCIS logic has, however, also numerous problems that are described in the yet unpublished patent application PCT/FI2016/050014, which is hereby included as a reference. Particularly, the problem of the traditional semiconductor logic element as well as of the traditional complementary semiconductor logic element is that a single defect can result in the formation of a permanent conductive path between at least two logic lines (one logic line being connected to the input and the other logic line being connected to the output) corrupting simultaneously at least two logic lines.

It should be noted that there are also other less beneficial ways than CISFETs to realize a traditional semiconductor logic element and a traditional complementary semiconductor logic element that are based on Junction Field Effect Transistors (JFET) and/or on MEtal Semiconductor Field Effect Transistors (MESFET) as described in PCT/FI2016/050014. The MESFET is later on referred to in this document as Conductor Semiconductor Field Effect Transistor (CSFET).

In the patent application PCT/FI2016/050014 an alternative way to realize complementary logic has been described. Particularly in this patent application it has been described how to create a novel semiconductor logic element that can replace the traditional semiconductor logic element as well as how to create a novel complementary semiconductor logic element that can replace the traditional complementary semiconductor logic element. The benefit of the novel semiconductor logic element as well as of the novel complementary semiconductor logic element is that a single defect cannot result in the formation of a permanent conductive path between two logic lines (one logic line being connected to the input and the other one to the output).

The novel semiconductor logic element comprises a first Field Effect Transistor (FET) and a second FET and the novel complementary semiconductor logic element comprises a complementary first FET and a complementary second FET. In the novel semiconductor logic element the input corresponds to the gate of the first FET and the output corresponds to the drain of the second FET. In addition there is an internal node corresponding to the drain of the first FET as well as to the gate of the second FET. In the novel complementary semiconductor logic element the input corresponds to the gate of the complementary first FET and the output corresponds to the drain of the complementary second FET. In addition there is an internal node corresponding to the drain of the complementary first FET as well as to the gate of the complementary second FET. In addition it is advantageous to utilize both in the novel semiconductor logic element as well as in the novel complementary semiconductor logic element a 'drag along' capacitor between the input and the internal node. For further details please refer to afore said patent application PCT/FI2016/050014 that is hereby laid open as a reference.

In case the semiconductor logic element according to PCT/FI2016/050014 comprises a depletion mode second FET wherein there is a pn and/or Schottky junction between the gate and the source of the second FET then when the input is rendered from first input logic potential to second input logic potential the internal node of the semiconductor logic will be clamped at the first output logic potential after the input reaches a clamping onset potential. The outcome of the input being rendered from the clamping onset potential to the second input logic potential has no effect on the end result, i.e., to how conductive the channel of the second FET will be after the internal node has settled roughly to the first output logic potential at which the source of the second FET is biased. This means that clamping of the internal node generates unnecessary current flow during switching that does not speed up the charging of the logic line that is connected to the output, but only increases the switching related power consumption of the corresponding circuitry. Beside the conductivity of the second channel, the charging speed of the output from the second output logic potential to first output logic potential depends on the resistance and capacitance of the wiring attached to the output as well as on the potential difference between the first output logic potential and the second output logic potential.

Consequently, in case the semiconductor logic element according to PCT/FI2016/050014 comprises a depletion mode second FET wherein there is a pn and/or Schottky junction between the gate and the source of the second FET then the clamping of the internal node to the first output logic potential increases the switching related power consumption of said semiconductor logic element without improving the speed. Furthermore, the logic line connected to the output of the semiconductor logic element may be connected to several inputs of other semiconductor logic elements and complementary semiconductor logic elements wherein clamping may also take place. Thus the second channel may charge a substantial clamping related capacitive load meaning that the clamping may increase considerably the current flow in the second channel and thereby the switching related power consumption of the entire circuitry.

Irrespective of the fact whether in a semiconductor logic element according to PCT/FI2016/050014 the second FET is a depletion mode or enhancement mode field effect transistor a further problem that may arise during switching is short circuit current induced switching related power consumption, which takes place when a logic line that is connected to an output of a semiconductor logic element according to PCT/FI2016/050014 and to the output of at least one of: complementary semiconductor logic element according to PCT/FI2016/050014, traditional complementary semiconductor logic element. In this case during switching there may be a conductive path between two nodes (e.g. between the second source of second FET and a second source of a complementary second FET) that are biased at different potentials. This short circuit switching related power consumption can be severe and may even substantially exceed the clamping induced switching related power consumption.

It is also important to understand that the smaller the input related capacitance can be made the smaller the current will be that is running during switching in the logic line that is connected to the input. This means that the more the input related capacitance can be reduced the smaller the switching related power consumption will be.

Particularly in mobile and Internet of Things (IoT) applications it is highly desirable to minimize the switching related power consumption of semiconductor based logic in order to increase the time period between changing or charging of batteries.

BRIEF DESCRIPTION OF THE INVENTION

The following presents a simplified summary in order to provide basic under-standing of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

An objective of the invention is to introduce novel semiconductor logic elements, and circuitries, providing lower switching related power consumption than corresponding semiconductor logic elements described in PCT/FI2016/050014.

Another objective of the invention is to provide novel semiconductor logic elements that can replace the traditional semiconductor logic element in the traditional complementary logic. Yet another object of the invention is to provide novel complementary semiconductor logic elements that can replace the complementary traditional semiconductor logic element in the traditional complementary logic.

The objectives of the invention are reached by a semiconductor logic element as defined by the respective independent claims.

According to a first aspect, a semiconductor logic element comprising a field effect transistor of the first conductivity type hereinafter referred to as the first FET and a field effect transistor of the second conductivity type hereinafter referred to as the second FET is provided wherein the semiconductor logic element comprises an internal node wherein the internal node is at least partly formed with a drain of the first FET and a gate of the second FET and wherein the gate of the first FET is hereinafter referred to as an input of the semiconductor logic element wherein the input is configured to be coupled either to a first input logic potential or to a second input logic potential, and wherein the drain of the second FET is referred to as the output of the semiconductor logic element, and wherein a source of the second FET is the source of the semiconductor logic element, wherein the semiconductor logic element is configured so that when a source of the first FET is arranged at a first source potential and when the source of the second FET is at a first output logic potential and when the input is at the first input logic potential, a nonconductive channel is established between the source of the first FET and the drain of the first FET adjusting the internal node to a potential causing a channel between the source of the second FET and the drain of the second FET to be in a nonconductive state thus enabling the output of the semiconductor logic element to be either at the first output logic potential or at a second output logic potential; and wherein the semiconductor logic element is further configured so that when the source of the first FET is arranged at a first source potential and when the source of the second FET is at first output logic potential and when the input is at the second input logic potential, the channel between the source of the first FET and the drain of the first FET is arranged to be in a nonconductive state enabling the internal node to adjust to a potential establishing a conductive channel comprising mobile second conductivity type charge carriers between the source of the second FET and the drain of the second FET thereby adjusting the output to first output logic potential.

The internal node may comprise one of the following: a single doped region acting both as first drain and at least part of second gate, a first drain doping and a second gate.

Further, at least one of the following: the first FET, the second FET may be a depletion mode field effect transistor. Alternatively or in addition, at least one of the following: the first FET, the second FET may be an enhancement mode field effect transistor. The first FET may be one of the following: a junction field effect transistor, a conductor insulator semiconductor field effect transistor, a conductor semiconductor field effect transistor.

The second FET, in turn, may be one of the following: a junction field effect transistor, a conductor insulator semiconductor field effect transistor, a conductor semiconductor field effect transistor. At least one of the following: the first FET, the second FET can be a depletion mode conductor insulator semiconductor field effect transistor that may comprise an auxiliary gate corresponding to an external gate as well as a back-gate doping corresponding to the gate. If the first FET is a depletion mode conductor insulator semiconductor field effect transistor the auxiliary gate of the first FET may be configured to be biased so that a layer of mobile second conductivity type charge carriers is established at the insulator semiconductor interface beneath the external gate of the first FET irrespective of whether the input is biased at first input logic potential or at second input logic potential, and the said layer of mobile second conductivity type charge carriers acting as a part of the first gate and controlling the first channel from the opposite side than the second conductivity type back-gate doping. On the other hand, if the second FET is a depletion mode conductor insulator semiconductor field effect transistor the auxiliary gate of the second FET may be configured to be biased so that a layer of mobile first conductivity type charge carriers is established at the insulator semiconductor interface beneath the external gate of the second FET irrespective of whether the input is biased at first input logic potential or at second input logic potential, and the said layer of mobile first conductivity type charge carriers acting as a part of the second gate and controlling the second channel from the opposite side than the first conductivity type back-gate doping. Furthermore, if the semiconductor logic element comprises a depletion mode conductor insulator semiconductor field effect transistor then the gate may comprise both an external gate as well as a back-gate doping. Alternatively, if the semiconductor logic element comprises a depletion mode conductor semiconductor field effect transistor then the gate may comprise both an external Schottky gate as well as a back-gate doping. Finally, if the semiconductor logic element comprises a depletion mode junction field effect transistor having a front-gate doping and a back-gate doping then the gate may comprise both the front-gate doping and the back-gate doping.

Moreover, if the semiconductor logic element comprises a depletion mode conductor insulator semiconductor field effect transistor then the gate may correspond either to an external gate or to a back-gate doping and wherein the gate controls the channel only from the side where the gate is located. Further, if the semiconductor logic element comprises a depletion mode conductor semiconductor field effect transistor then the gate may correspond either to an external Schottky gate or to a back-gate doping and wherein the gate controls the channel only from the side where the gate is located. Finally, if the semiconductor logic element comprises a depletion mode junction field effect transistor having a front-gate doping and a back-gate doping then the gate may correspond either to the front-gate doping or to the back-gate doping and wherein the gate controls the channel only from the side where the gate is located.

The second FET may correspond to an enhancement mode conductor insulator semiconductor field effect transistor wherein the gate of the second FET corresponds to an external gate and the first FET may correspond to one of the following: a depletion mode junction field effect transistor that comprises a gate confining the channel at least from two sides, a depletion mode conductor semiconductor field effect transistor wherein a gate corresponds to a Schottky gate and a back-gate doping, a depletion mode conductor insulator semiconductor field effect transistor that, in turn, may correspond to one of the following: an external gate corresponding to an auxiliary gate configured to be biased so that a layer of mobile second conductivity type charge carriers is established at the insulator semiconductor interface beneath the external gate of the first FET irrespective of the fact whether the input is biased at first input logic potential or at second input logic potential, and the said layer of mobile second conductivity type charge carriers acting as a part of the first gate and controlling the first channel from the opposite side than the second conductivity type back-gate doping; or a gate corresponding to an external gate and a back-gate doping.

The first conductivity type may be p type and the second conductivity type may be n type. Alternatively, the first conductivity type may be n type and the second conductivity type may be p type.

According to a further aspect, a logic circuitry comprising at least one semiconductor logic element as claimed disclosed above and at least one semiconductor logic element as disclosed above may be provided.

According to a still further aspect, a logic circuitry comprising: a first semiconductor logic element as disclosed above, and a second semiconductor logic element as disclosed above may be provided wherein the first input logic potential of the second semiconductor logic element corresponds to the second input logic potential of the first semiconductor logic element; the second input logic potential of the second semiconductor logic element corresponds to the first input logic potential of the first semiconductor logic element; the first output logic potential of the second semiconductor logic element corresponds to the second output logic potential of the first semiconductor logic element; and the second output logic potential of the second semiconductor logic element corresponds to the first output logic potential of the first semiconductor logic element.

The logic circuit may be configured to operate as an inverter configuration as follows: in the first semiconductor logic element the second source is connected to the first output logic potential of the first semiconductor logic element; in the second semiconductor logic element the second source is connected to the second output logic potential of the first semiconductor logic element; wherein the inputs of the first semiconductor logic element and the second semiconductor logic element are connected together as an input of the inverter configuration, the outputs of the first semiconductor logic element and the second semiconductor logic element are connected together as the output of the inverter configuration, and the input of the inverter configuration is configured to be coupled either to the first or the second input logic potential of the first semiconductor logic element wherein when the input of the inverter configuration is coupled to the first input logic potential of the first semiconductor logic element the output of the inverter configuration sets to the second output logic potential of the first semiconductor logic element, and when the input of the inverter configuration is coupled to the second input logic potential of the first semiconductor logic element the output of the inverter configuration sets to the first output logic potential of the first semiconductor logic element. The first input logic potential of the first semiconductor logic element may be the same as the first output logic potential of the first semiconductor logic element and the second input logic potential of the first semiconductor logic element may be the same as the second output logic potential of the first semiconductor logic element.

Furthermore, a logic circuitry may be provided which logic circuitry comprises at least one semiconductor logic element as disclosed above and at least one complementary semiconductor logic element corresponding to a first conductivity type field effect transistor.

According to still further aspect, a logic circuitry comprising: a semiconductor logic element as disclosed above, and a first conductivity type field effect transistor may be provided, wherein the field effect transistor comprising: a first conductivity type source, a first conductivity type drain, and a gate; wherein in the semiconductor logic element the second source is connected to the first output logic potential of the semiconductor logic element, in the first conductivity type field effect transistor the source is connected to the second output logic potential of the semiconductor logic element, and wherein the first conductivity type drain of the field effect transistor and the output of the semiconductor logic element are connected together as an output of the inverter configuration, and the gate of the field effect transistor and the input of the semiconductor logic element are connected together as an input of the inverter configuration; the input of the inverter configuration is configured to be coupled either to the first or the second input logic potential of the semiconductor logic element; wherein when the input of the inverter configuration is coupled to the first input logic potential of the semiconductor logic element, a conductive channel comprising mobile first conductivity type charge carriers is established between the source and the drain of the field effect transistor so that the output of the inverter configuration sets to the second output logic potential of the semiconductor logic element, and when the input of the inverter configuration is coupled to the second input logic potential of the semiconductor logic element, the channel of the first conductivity type field effect transistor is nonconductive causing the output of the inverter configuration to the first output logic potential of the semiconductor logic element.

The field effect transistor in the logic circuitry may be one of the following: conductor insulator semiconductor field effect transistor, junction field effect transistor, conductor semiconductor field effect transistor. The first input logic potential of the semiconductor logic element may be the same as the first output logic potential of the semiconductor logic element and the second input logic potential of the semiconductor logic element may be the same as the second output logic potential of the semiconductor logic element. According to still further aspect, a multi-level logic circuitry comprising a first and a second logic circuitry as disclosed above may be provided, wherein in the first logic circuitry at least one of the following: the first output logic potential of the first logic circuitry, the second output logic potential of the first logic circuitry may be shifted towards a first direction with respect to the first and second input logic potential of the first logic circuitry; in the second logic circuitry the first and second input logic potentials may be shifted towards the first direction with respect to the first and second input logic potentials of the first logic circuitry; and at least one of the following: the first output logic potential of the second logic circuitry, the second output logic potential of the second logic circuitry may be shifted with respect to the first and second output logic potentials of the second logic circuitry towards the first direction.

A multi-level logic circuitry may also be provided that comprises a first, a second and a third logic circuitry as disclosed above, wherein in the first logic circuitry at least one of the following: the first output logic potential of the first logic circuitry, the second output logic potential may be shifted towards a first direction with respect to the first and second input logic potential of the first logic circuitry; in the second logic circuitry the first and second input logic potentials may be shifted towards the first direction with respect to the first and second input logic potentials of the first logic circuitry; at least one of the following: the first output logic potential of the second logic circuitry, the second output logic potential of the second logic circuitry may be shifted with respect to the first and second input logic potentials of the second logic circuitry towards the first direction; in the third logic circuitry the first and second input logic potentials may be shifted towards the first direction with respect to the first and second input logic potentials of the second logic circuitry; and at least one of the following: the first output logic potential of the third logic circuitry, the second output logic potential of the third logic circuitry may be shifted with respect to the first and second output logic potentials of the third logic circuitry towards the first direction.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

DETAILED DESCRIPTION OF THE INVENTION

Figure 1:
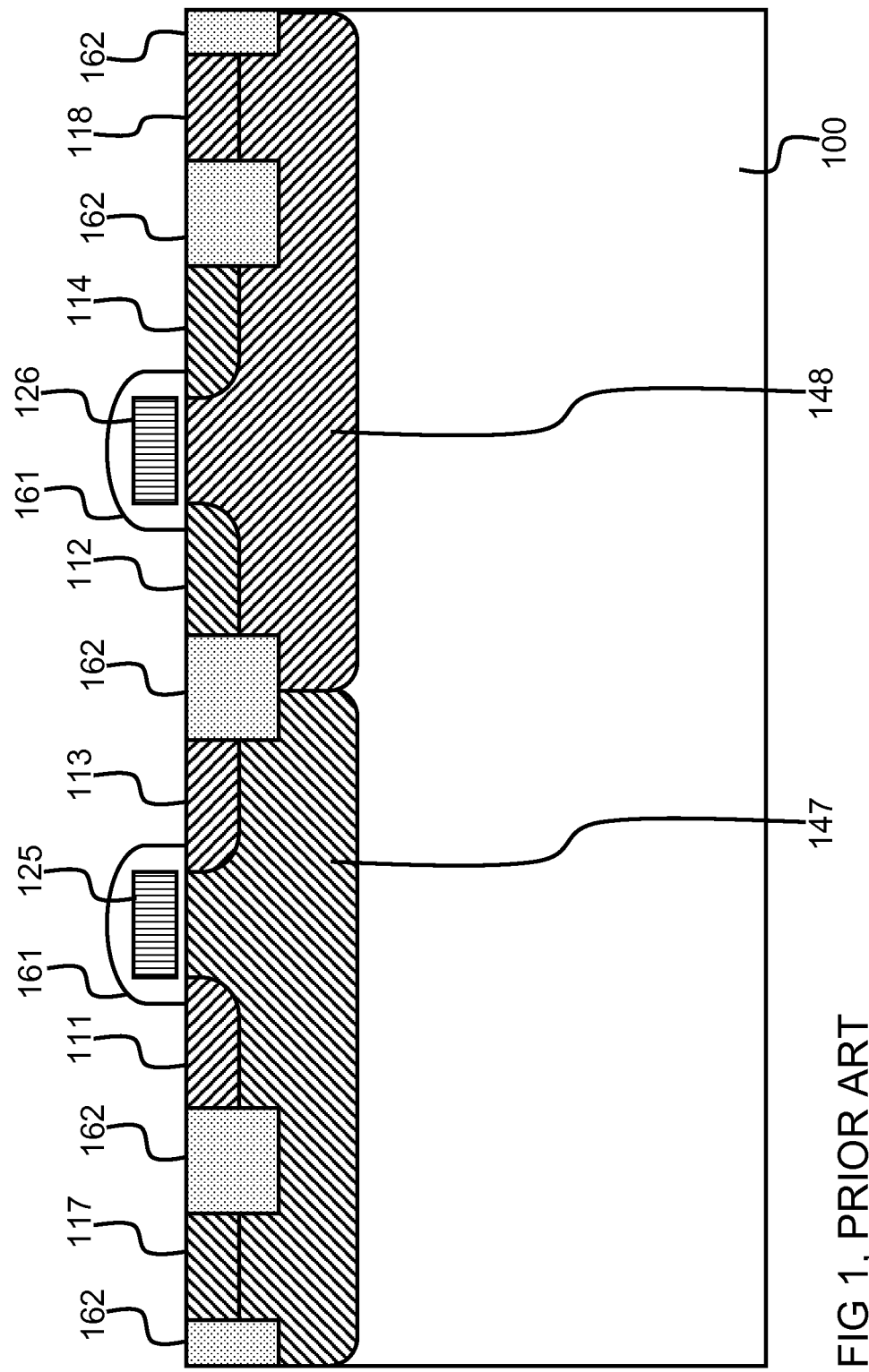
FIG. 1 illustrates a schematic cross-sections of the prior art semiconductor logic element on the right and of the prior art complementary semiconductor logic element on the left both corresponding to traditional CCIS logic.

The specific examples provided in the description given below should not be construed as limiting the scope and/or the applicability of the appended claims. Lists and groups of examples provided in the description given below are not exhaustive unless otherwise explicitly stated.

As already previously said, in this text the term complementary binary logic refers to a logic circuitry comprising a set of logic elements that correspond either to semiconductor logic elements or to complementary semiconductor logic elements each of them having an input and an output.
During a steady state in the complementary binary logic circuitry
  the potential at an input or at an output can have only two different values which are referred to as logic potentials, and
  there are no conductive paths between the nodes in the set of semiconductor logic elements that are at different potentials enabling thus low steady state power consumption.
In addition, it is only possible in complementary binary logic to establish a network of logic elements having the outputs of logic elements connected to the inputs of other logic elements and wherein the inputs/outputs of logic elements are biased only at a two different potentials that are the same throughout the network.

It is important to note that the term logic separates a semiconductor logic element and logic circuitries comprising semiconductor logic elements from analog regulation elements/circuitries. It should be also noted that in this text the terms binary logic, complementary logic, and logic are utilized generally in a context referring to the complementary binary logic since no other logic types are examined in this text.

The semiconductor logic element according to the invention comprises a first conductivity type field effect transistor wherein the first conductivity type refers to the mobile majority charge carriers of the source and drain, i.e. the source and drain are of the first conductivity type. The first conductivity type Field Effect Transistor (FET) is hereinafter referred to as the first type first FET or simply as the first FET. In addition, the semiconductor logic element comprises a second conductivity type second field effect transistor which is hereinafter referred to as the second type second FET or simply as the second FET.

The first conductivity type source of the first FET is hereinafter referred to as the first source. The first source node comprises the first source and optional associated wiring and it is configured to be coupled via the optional wiring or via other means to a first source potential. The gate of the first FET is hereinafter referred to as the first gate. The first gate node comprises the first gate and optional associated wiring. The first gate node is also referred to as the input node or simply as input and it is configured to be coupled via the optional wiring or via other means at least to a first input logic potential or to a second input logic potential. The first conductivity type drain of the first FET is hereinafter referred to as the first drain. The channel of the first FET is hereinafter referred to as the first channel and it is capable of transporting first conductivity type mobile charge carriers.

The second conductivity type source of the second FET is hereinafter referred to as the second source. The second source node comprises the second source and optional associated wiring and it can be configured to be coupled via the wiring or via other means to the first output logic potential. The gate of the second FET is hereinafter referred to as the second gate. The second conductivity type drain of the second FET is hereinafter referred to as the second drain. The second drain node comprises the second drain and optional associated wiring. The second drain node is also referred to as the output node or simply as output. The output potential refers to potential on the output node. The channel of the second FET is hereinafter referred to as the second channel and it is capable of transporting mobile second conductivity type charge carriers.

The first drain and the second gate are connected electrically together as an entity, which is hereinafter referred to as the internal node. The name internal node stems from the fact that there is no external connection to this node unlike in the case of the other nodes of the invented semiconductor logic element. In case the first drain and the second gate are not electrically connected inside semiconductor material then a wiring is used to connect them together as a single entity. In case the first drain and the second gate are electrically connected together inside semiconductor material as a single entity then a wiring is not required to connect them together. The term internal node potential refers to the potential on the internal node.

When the input is at first input logic potential the first channel is nonconductive and the internal node is adjusted to a potential causing the second channel to be nonconductive irrespective of the fact whether the second source/drain is biased at first or second output logic potential. Since the second drain and/or source are biased at either the first or second output logic potential (if transition between states is not taken into account) there is no conductive path between the second source and the second drain (if transition is not taken into account) when input is at first input logic potential. This means that when the second source node is at the first output logic potential the output can be either at first output logic potential or at second output logic potential, i.e., the input has no control over the output potential. On the other hand, when the input is at second input logic potential the first channel is also nonconductive, but the internal node is adjusted to a potential causing the second channel to be conductive when the second source node is connected to first output logic potential. Consequently the output is set to first output logic potential.

Afore described semiconductor logic element is hereinafter referred to as the input capacitance minimizing semiconductor logic element, wherein the distinctive features are
  that the first channel is nonconductive when the input is either at first input logic potential or at second input logic potential,
  that the second channel is nonconductive when the input is at first input logic potential, and
  that the second channel is conductive when the input is at second input logic potential.

A semiconductor logic element that is complementary to the input capacitance minimizing semiconductor logic element is later on referred to as a input capacitance minimizing complementary semiconductor logic element.

The term conductive channel refers to the situation when the channel comprises mobile charge carriers that are of the same type as the majority carriers of the source/drain corresponding to the FET comprising the channel. The term nonconductive refers to the situation when the channel comprises essentially no mobile charge carriers that are of the same type as the majority carriers of the source/drain corresponding to the FET comprising the channel. Even though the channel is nonconductive one can still compare different nonconductive channel states with the terms less conductive or more conductive—the reason for this is that there is still some residual amount of mobile charge carriers present in the channel. Albeit at a first nonconductive state there would be one billionth part of a mobile charge carrier present in the channel and at a second nonconductive state there would be one trillionth part of a mobile charge carrier present in the channel one can still say that the first nonconductive state is more conductive than the second nonconductive state. Similarly one can say that the second nonconductive state is less conductive than the first nonconductive state.

Hereinafter the term clamping resistant semiconductor logic element is referred to the following semiconductor logic element. A semiconductor logic element comprising a field effect transistor of the first conductivity type hereinafter referred to as the first FET and a depletion mode field effect transistor of the second conductivity type hereinafter referred to as the second FET; wherein
the semiconductor logic element comprises an internal node wherein the internal node is at least partly formed with a drain of the first FET and a gate of the second FET, wherein the gate of the first FET is hereinafter referred to as an input of the semiconductor logic element, wherein the input is configured to be coupled either to a first input logic potential or to a second input logic potential, wherein the drain of the second FET is referred to as the output of the semiconductor logic element, wherein a source of the second FET is the source of the semiconductor logic element,
wherein the semiconductor logic element is configured so that when a source of the first FET is arranged at a first source potential and when the source of the second FET is at a first output logic potential and when the input is at the first input logic potential, the internal node is at a potential causing a channel between the source of the second FET and the drain of the second FET to be in a nonconductive state thus enabling the output of the semiconductor logic element to be either at the first output logic potential or at a second output logic potential, and
wherein the semiconductor logic element is further configured so that when the source of the first FET is arranged at a first source potential and when the source of the second FET is at first output logic potential and when the input is at the second input logic potential, the channel between the source of the first FET and the drain of the first FET is arranged to be in a nonconductive state enabling the internal node to adjust to a potential establishing a conductive channel comprising mobile second conductivity type charge carriers between the source of the second FET and the drain of the second FET thereby adjusting the output to first output logic potential and wherein the potential to which the internal node is adjusted to causes the second gate to be reverse biased with respect to the source of the second FET.

Furthermore, in the clamping resistant semiconductor logic element the internal node may comprises one of the following: a single doped region acting both as first drain and at least part of second gate, a first drain doping and a second gate. In the clamping resistant semiconductor logic element the first FET may be a depletion mode field effect transistor. Beneficially, in the clamping resistant semiconductor logic element the potential difference between the first source potential and the first input logic potential is larger than the potential difference between the first input logic potential and the second input logic potential. Moreover, in the clamping resistant semiconductor logic element the first FET may be an enhancement mode field effect transistor. In the clamping resistant semiconductor logic element the first FET can be one of the following: a junction field effect transistor, a conductor insulator semiconductor field effect transistor, a conductor semiconductor field effect transistor. Furthermore in the clamping resistant semiconductor logic element the second FET can be one of the following: a junction field effect transistor, a conductor insulator semiconductor field effect transistor, a conductor semiconductor field effect transistor.

A semiconductor logic element that is complementary to the clamping resistant semiconductor logic element is later on referred to as a clamping resistant complementary semiconductor logic element.

Hereinafter the term short circuit current mitigating semiconductor logic element is referred to the following semiconductor logic element. A semiconductor logic element comprising
  a field effect transistor of the first conductivity type hereinafter referred to as the first FET wherein there is a first auxiliary gate node biased at a suitable first auxiliary gate potential, and
  a field effect transistor of the second conductivity type hereinafter referred to as the second FET; wherein
the semiconductor logic element comprises an internal node wherein the internal node is at least partly formed with a drain of the first FET and a gate of the second FET, wherein the gate of the first FET is hereinafter referred to as an input of the semiconductor logic element, wherein the input is configured to be coupled either to a first input logic potential or to a second input logic potential, wherein the drain of the second FET is referred to as the output of the semiconductor logic element, wherein a source of the second FET is the source of the semiconductor logic element,
wherein the semiconductor logic element is configured so that when a source of the first FET is arranged at a first source potential and when the source of the second FET is at a first output logic potential and when the input is at the first input logic potential, the internal node is at a potential causing a channel between the source of the second FET and the drain of the second FET to be in a nonconductive state thus enabling the output of the semiconductor logic element to be either at the first output logic potential or at a second output logic potential, and
wherein the semiconductor logic element is further configured so that when the source of the first FET is arranged at a first source potential and when the source of the second FET is at first output logic potential and when the input is at the second input logic potential, the channel between the source of the first FET and the drain of the first FET is arranged to be in a nonconductive state enabling the internal node to adjust to a potential establishing a conductive channel comprising mobile second conductivity type charge carriers between the source of the second FET and the drain of the second FET thereby adjusting the output to first output logic potential and wherein the adjusting of the internal node's potential is caused by first auxiliary gate induced clamping.

Furthermore, in the short circuit current mitigating semiconductor logic element the internal node may comprises one of the following: a single doped region acting both as first drain and at least part of second gate, a first drain doping and a second gate. In the short circuit current mitigating semiconductor logic element the first FET may be a depletion mode field effect transistor. Moreover, in the short circuit current mitigating semiconductor logic element the first FET may be an enhancement mode field effect transistor. In the short circuit current mitigating semiconductor logic element the second FET may be a depletion mode field effect transistor. Moreover, in the short circuit current mitigating semiconductor logic element the second FET may be an enhancement mode field effect transistor. In the short circuit current mitigating semiconductor logic element the first FET can be one of the following: a junction field effect transistor, a conductor insulator semiconductor field effect transistor, a conductor semiconductor field effect transistor. Furthermore in the short circuit current mitigating semiconductor logic element the second FET can be one of the following: a junction field effect transistor, a conductor insulator semiconductor field effect transistor, a conductor semiconductor field effect transistor.

A semiconductor logic element that is complementary to the short circuit current mitigating semiconductor logic element is later on referred to as a short circuit current mitigating complementary semiconductor logic element.

Hereinafter the term semiconductor logic element according to PCT/FI2016/050014 is referred to as a semiconductor logic element according to the following description. A semiconductor logic element comprising a field effect transistor of the first conductivity type hereinafter referred to as the first FET and a field effect transistor of the second conductivity type hereinafter referred to as the second FET is provided wherein the semiconductor logic element comprises an internal node wherein the internal node is at least partly formed with a drain of the first FET and a gate of the second FET and wherein the gate of the first FET is hereinafter referred to as an input of the semiconductor logic element wherein the input is configured to be coupled either to a first input logic potential or to a second input logic potential, and wherein the drain of the second FET is referred to as the output of the semiconductor logic element, and wherein a source of the second FET is the source of the semiconductor logic element, wherein the semiconductor logic element is configured so that when a source of the first FET is arranged at a first source potential and when the source of the second FET is at a first output logic potential and when the input is at the first input logic potential, a conductive channel comprising mobile first conductivity type charge carriers is established between the source of the first FET and the drain of the first FET adjusting the internal node to first source potential and thereby causing a channel between the source of the second FET and the drain of the second FET to be in a nonconductive state thus enabling the output of the semiconductor logic element to be either at the first output logic potential or at a second output logic potential; and wherein the semiconductor logic element is further configured so that when the source of the first FET is arranged at a first source potential and when the source of the second FET is at first output logic potential and when the input is at the second input logic potential, the channel between the source of the first FET and the drain of the first FET is arranged to be in a nonconductive state enabling the internal node to adjust to a potential establishing a conductive channel comprising mobile second conductivity type charge carriers between the source of the second FET and the drain of the second FET thereby adjusting the output to first output logic potential. The internal node may comprise one of the following: a single doped region acting both as first drain and at least part of second gate, a first drain doping and a second gate. Further, at least one of the following: the first FET, the second FET may be a depletion mode field effect transistor. Alternatively or in addition, at least one of the following: the first FET, the second FET may be an enhancement mode field effect transistor. The first FET may be one of the following: a junction field effect transistor, a conductor insulator semiconductor field effect transistor, a conductor semiconductor field effect transistor. The second FET, in turn, may be one of the following: a junction field effect transistor, a conductor insulator semiconductor field effect transistor, a conductor semiconductor field effect transistor. This description of a semiconductor logic element according to PCT/FI2016/050014 can be also found in the document PCT/FI2016/050014.

The objective of this invention is to decrease switching related power consumption of a semiconductor logic element according to PCT/FI2016/050014. This can be done by at least one of the following:

by reducing or removing clamping induced switching related power consumption, by reducing or removing short circuit current induced switching related power consumption, by reducing the input capacitance.

In a semiconductor logic element according to PCT/FI2016/050014 and comprising a depletion mode second FET wherein there is a pn and/or Schottky junction between the second source and the second gate the internal node is clamped at the first output logic potential of the second source when the input is connected to second input logic potential. The clamping results in parasitic current flow that does not enhance the conductivity of the second channel. This parasitic current flow increases the switching related power consumption of the corresponding logic circuitry reducing thus the battery life, which is of fundamental importance in many battery powered mobile and Internet of Things (IoT) applications.

Furthermore, in a semiconductor logic element according to PCT/FI2016/050014 there may be during switching short circuit current flow between the second source of the second FET and at least one of the following: a second source of a second FET corresponding to a complementary semiconductor logic element according to PCT/FI2016/050014, a source of a traditional complementary logic element. This short circuit current flow increases the switching related power consumption of the corresponding logic circuitry reducing thus the battery life, which is of fundamental importance in many battery powered mobile and IoT applications.

Moreover, in a semiconductor logic element according to PCT/FI2016/050014 the input capacitance can be relatively large, which results in relatively large current flow in the logic line that is connected to the input. The relatively large current flow results in relatively large power consumption reducing thus the battery life, which is of fundamental importance in may battery powered mobile and IoT applications.

In a clamping resistant semiconductor logic element comprising a depletion mode second FET wherein there is a pn and/or Schottky junction between the second source and the second gate the clamping of the internal node at the first output logic potential of the second source can be prevented when the input is connected to second input logic potential by enabling the internal node to adjust to a potential causing the second gate to be reverse biased with respect to the second source. This means that one can remove parasitic current flow in the input as well as between the second source and the second gate that does not enhance the conductivity of the second channel. In this manner one can reduce the switching related power consumption of the semiconductor logic element, which is particularly important in battery powered mobile and IoT devices.

In a clamping resistant semiconductor logic element comprising a depletion mode second FET wherein there is a pn and/or Schottky junction between the second source and the second gate the adjusting of the internal node to a potential providing reverse biased junction between the second gate and the second source is established via a potential barrier that is formed inside the semiconductor material when input is at second input potential. Said potential can be formed typically in fully depleted semiconductor material between the first drain and the first source (this potential barrier is located typically in the first channel) wherein first conductivity type mobile charge carriers being thermally generated and collected by the internal node are thermally ejected from the first drain over said potential barrier to the first source when input is at second output logic potential. Alternatively, provided that there is
- a first conductivity type channel doping corresponding to the first channel and being suitably doped,
- first gate having a pn and/or Schottky junction between the first gate and the first channel doping,
- first auxiliary gate having a pn and/or Schottky junction between the first auxiliary gate and the first channel doping,
- the first auxiliary gate being (preferably) electrically connected to the first drain, and
- more second conductivity type mobile charge carriers being thermally generated and collected by the internal node than there is first conductivity type mobile charge carriers being thermally generated and collected by the internal node;

then said potential barrier is formed inside typically fully depleted first channel doping in between the first auxiliary gate (being preferably part of the internal node) and the first gate wherein second conductivity type mobile charge carriers are thermally ejected from the first auxiliary gate over said potential barrier into the first gate when input is at second input logic potential. During steady state the internal node adjusts to a certain potential due to the influence of said potential barrier.

Moreover, the size of afore said potential barrier and thus the size of said certain potential is defined mainly by the temperature and the band-gaps of the semiconductor materials forming the first FET and the second FET.

The clamping resistant semiconductor logic element reduces the switching related power consumption of the corresponding semiconductor logic circuitry
- by preventing clamping of the internal node to the first output logic potential at the second source, and/or
- by preventing or reducing short circuit current induced switching related power consumption.

It should be noted that if in a clamping resistant semiconductor logic element the second FET comprises an auxiliary gate node (i.e. second auxiliary gate node) and there is a pn and/or Schottky junction between the second auxiliary gate and the second source (biased at first output logic potential) then the first auxiliary gate node should be biased such that during steady state there is no significant current flow between the second auxiliary gate node and any other node that would significantly increase the overall power consumption. Typically this precondition necessitates that afore described second auxiliary gate should be reverse biased with respect to the second source unless the magnitude of a forward bias, the band-gap of the semiconductor material forming the second FET, and the operating temperature enable low power operation.

Particularly, if in a clamping resistant semiconductor logic element the second FET comprises
- a second conductivity type channel doping corresponding to the second channel,
- a second gate having a pn and/or Schottky junction between the second gate and the second channel, and
- a second auxiliary gate node having a pn and/or Schottky junction between the second auxiliary gate and the second channel;

then during steady state a current flow between the second auxiliary gate node and the second gate could take place across a fully depleted second channel when the input is at first input logic potential unless a proper second auxiliary gate potential is utilized. Typically this means that the second auxiliary gate node should be biased at a large enough reverse bias with respect to the second source in order to prevent current flow between the second auxiliary gate node and the second gate when input is at first input logic potential (e.g. in case the second FET is a circular junction field effect transistor then current flow between a biased front-gate doping and a biased back-gate doping could take place over a small enough potential barrier located in the depleted second channel). However, the reverse bias on the second auxiliary gate node with respect to the second source should not be so large that the second channel would not be conductive when the input is at second input logic potential.

It is important to note that proper operation of the first FET and the second FET is not only provided by proper biasing of the nodes, but also with proper design of the transistors (e.g. with proper channel dopings and/or band-gaps of semiconductor materials in the first and second FET).

If in the clamping resistant semiconductor logic element the second FET comprises an auxiliary gate node that corresponds solely to an external gate then the auxiliary gate can be either reverse or forward biased with respect to the second source. In both cases it is, however, required that the second FET remains a depletion mode field effect transistor (i.e. channel is conductive when the gate and the source are at the same potential), that the second channel is nonconductive when the input is at first input logic potential, and that the the second channel is conductive when the input is at second input logic potential.

It should be noted that if in the clamping resistant semiconductor logic element
- there is a second auxiliary gate node corresponding solely to an external gate,
- in between the second gate and the second auxiliary gate there is a second conductivity type doping corresponding to the second channel and having a joint pn and/or Schottky junction with the second gate,
- there is a conductive path for first conductivity type charge carriers in between the second gate and a location inside the semiconductor material situated at the semiconductor interface directly beneath the external gate (the external gate corresponding to the second auxiliary gate);

then a layer of mobile first conductivity type charge carriers is established at the insulator semiconductor interface beneath the external gate (i.e. the second auxiliary gate) when the second auxiliary gate is certain amount more reverse biased than the second gate (assuming that the insulator layer in between the external gate and the semiconductor material is neutral) with respect to the second source, and said layer of mobile first conductivity type charge carriers being at the same potential than the second gate and acting as a part of the second gate. Particularly, if the second channel doping were large enough then the second FET would be a depletion mode field effect transistor despite said layer of mobile first conductivity type charge carriers acting as part of the second gate, i.e. the second FET would be a depletion mode transistor under any second auxiliary gate potential. Furthermore, with proper biasing of the second auxiliary gate said layer of mobile first conductivity type charge carriers would be present irrespective of the fact whether the input were at first or second input logic potential, which would be the preferable way of operation. If the second channel doping were not large enough and the second FET would not be a depletion mode field effect transistor when said layer of first conductivity type mobile charge carriers were present, then one should bias the second auxiliary gate such that said layer is not present when input is at first or second logic potential.

It should be also noted that if in the clamping resistant semiconductor logic element
  there is a second auxiliary gate node corresponding solely to an external gate,
  in between the second gate and the second auxiliary gate there is a second conductivity type doping corresponding to the second channel and having a joint pn and/or Schottky junction with the second gate,
  there is no conductive path for first conductivity type charge carriers in between the second gate and a location inside the semiconductor material situated immediately beneath the external gate (i.e. the second auxiliary gate);
  then a layer of mobile first conductivity type charge carriers will be established at the insulator-semiconductor interface beneath the external gate (the external gate corresponds to the second auxiliary gate) when the input is at first input logic potential and when the external gate is suitably biased. If the doping of the second channel is high enough then said layer of mobile first conductivity type charge carriers will neither be at the same potential than the second gate nor act as part of the second gate, but when a quasi-stationary state has been reached (particularly with respect to the layer of mobile first conductivity type charge carriers beneath the second auxiliary gate) the second channel should be nonconductive—otherwise one should remove part of the charge carriers or all of the charge carriers in the layer of mobile first conductivity type charge carriers located beneath the second auxiliary gate e.g. by pulsing the second auxiliary gate from time to time at a potential that is less reverse biased (i.e. more forward biased) with respect to the second source than what is the baseline second auxiliary gate potential in order to maintain a nonconductive second channel. The downside of this would naturally be that during afore said pulsing the second channel would be conductive increasing thus the overall power consumption.

In a clamping resistant semiconductor logic element the first FET can be either a depletion mode or an enhancement mode field effect transistor. If the first FET is a depletion mode field effect transistor then it is beneficial
  that the first gate is reverse biased with respect to the first source when the input is at first input logic potential, and
  that the absolute value of the potential difference between the first source potential and the first input logic potential is larger than the absolute value of the potential difference between the first input logic potential and the second input logic potential.

If in a clamping resistant semiconductor logic element the first FET comprises a pn and/or Schottky junction in between the first gate and the first source then the first gate should not be forward biased with respect to the first source when the input is at first input logic potential unless the magnitude of the forward bias, the temperature, and the band-gap of the first FET's semiconductor material enable low power operation.

If in a clamping resistant semiconductor logic element the first FET comprises an auxiliary gate node (i.e. first auxiliary gate node) and there is a pn and/or Schottky junction in between the first auxiliary gate and the first source one should not have the first auxiliary gate forward biased with respect to the first source unless the magnitude of the forward bias, the temperature, and the first FET's semiconductor material enable low power operation.

If in the clamping resistant semiconductor logic element the first FET is a depletion mode field effect transistor wherein the input corresponds solely to an external gate then the first gate may be either reverse biased or forward biased with respect to the first source when the input is at first input logic potential, but the first gate has to be reverse biased (the absolute magnitude of the reverse bias has to be larger than the absolute magnitude of the threshold voltage) with respect to the first source when the input is at second input logic potential (corresponding to conductive second channel).

If in the clamping resistant semiconductor logic element the first FET is an enhancement mode field effect transistor then the first gate has to be forward biased with respect to the first source when the input is at first input logic potential. This necessitates that the input corresponds solely to an external gate unless the magnitude of the forward bias, the temperature, and the band-gap of the first FET's semiconductor material enable low power operation.

If in the clamping resistant semiconductor logic element the first FET is an enhancement mode field effect transistor wherein the input corresponds solely to an external gate then the first gate has to be biased below the threshold voltage level (i.e. either reverse biased or the absolute magnitude of the forward bias has to be smaller than the absolute magnitude of the threshold voltage) with respect to the first source when the input is at second input logic potential.

If in the clamping resistant semiconductor logic element the first FET comprises a first auxiliary gate node and there is a pn and/or Schottky junction between the first auxiliary gate and the drain of the first FET (i.e. first drain) then (assuming that the first and second FET are made of similar semiconductor material) the potential difference between the first source potential and the first auxiliary gate potential should be large enough so that the internal node is not clamped at the first auxiliary gate potential when input is at second input logic potential, but instead the internal node can freely adjust to a potential that is in between the first source potential and the second input logic potential. Consequently, the absolute magnitude of the potential difference between the first source potential and the first auxiliary gate potential should be larger than the absolute magnitude of the potential difference between the first source potential and the potential to which the internal node adjusts to when the input is set to second input logic potential. If this condition is met then in the clamping resistant semiconductor logic element the internal node will neither be clamped at the first output logic potential at the second source nor at the first auxiliary gate potential at the first auxiliary gate when the input is at second input logic potential. It is important to note that if in a semiconductor logic element
> according to PCT/FI2016/050014, and
> comprising in the first FET a first auxiliary gate having pn and/or Schottky junction between the first auxiliary gate and the first drain;

then the first auxiliary gate should be biased in a manner that enables sufficient potential swing for the internal node between the states when input is at first input logic potential and when input is at second logic potential. For example, if the first auxiliary gate were at the same potential than the first source then there would be no potential swing available for the internal node.

If in a clamping resistant semiconductor logic element the first FET comprises
> a first conductivity type channel doping corresponding to the first channel,
> a first gate having a pn and/or Schottky junction between the first gate and the first channel, and
> a first auxiliary gate node having a pn and/or Schottky junction between the first auxiliary gate and the first channel;

then a current flow between the first auxiliary gate and the first gate could take place across a fully depleted first channel when the input is at second input logic potential unless a proper first auxiliary gate potential (and/or first channel doping) is utilized. Typically this means that the first auxiliary gate should be biased at a large enough reverse bias with respect to the first source in order to prevent current flow between the first auxiliary gate and the first gate when input is at second input logic potential (e.g. in case the first FET is a circular junction field effect transistor then current flow between a biased front-gate doping and a biased back-gate doping could take place over a small enough potential barrier located in the depleted first channel). Moreover, the reverse bias on the first auxiliary gate with respect to the first source should not be so small that the internal node would be clamped to it when the input is at second input logic potential. Finally, the reverse bias on the first auxiliary gate should be large enough to provide a sufficiently large potential swing for the internal node between the states when the input is at first input logic potential and at second input logic potential.

Furthermore, if in the clamping resistant semiconductor logic element the first FET
> is a surface channel enhancement mode field effect transistor comprising a first gate corresponding solely to an external gate,
> comprises a first auxiliary gate having a pn and/or Schottky junction in between the first auxiliary gate and the first drain,
> the first auxiliary gate is electrically connected to the first drain, and
> there are less second conductivity type charge carriers that are thermally generated and collected by the internal node than there are first conductivity type charge carriers that are thermally generated and collected by the internal node;

then (assuming that the first FET and the second FET are formed of the same semiconductor material) the absolute value of the potential difference between the first source potential and the potential to which the internal node adjusts to when the input is set to second input logic potential should be smaller than the absolute value between the first source potential and the first output logic potential since in this manner the internal node will not be clamped at the first output logic potential at the second source. When this condition is met then the absolute value of the potential difference between the first source potential and the potential to which the internal node adjusts to when the input is set to second logic potential is roughly the sum of
> the absolute value of the potential difference between the first source potential and the second input logic potential, and
> the absolute value of the threshold voltage of the first FET.

Moreover, if in the clamping resistant semiconductor logic element the first FET
> comprises a first gate corresponding solely to an external gate,
> comprises a first conductivity type channel doping corresponding to the first channel,
> comprises a first auxiliary gate having a pn and/or Schottky junction in between the first auxiliary gate and the first channel doping,
> there is a conductive path between the first auxiliary gate and a location inside the semiconductor material situated immediately underneath the external gate,
> the first channel is not conductive when the first gate is biased such that there is a layer of mobile second conductivity type charge carriers located inside the semiconductor material directly underneath the external gate and being at the same potential than the first auxiliary gate,
> the first auxiliary gate is electrically connected to the first drain, and
> there are less second conductivity type charge carriers that are thermally generated and collected by the internal node than there are first conductivity type charge carriers that are thermally generated and collected by the internal node;

then (that the first FET and the second FET are formed of the same semiconductor material) the absolute value of the potential difference between the first source potential and the potential to which the internal node adjusts to when the input is set to second input logic potential should be smaller than the absolute value between the first source potential and the first output logic potential since in this manner the internal node will not be clamped at the first output logic potential at the second source. This means naturally that a proper potential is utilized as the second input logic potential.

It should be noted that if in the clamping resistant semiconductor logic element
> there is a first auxiliary gate node corresponding solely to an external gate,
> in between the first gate and the first auxiliary gate there is a first conductivity type doping corresponding to the first channel and having a joint pn and/or Schottky junction with the first gate,
> there is a conductive path for second conductivity type charge carriers in between the first gate and a location inside the semiconductor material situated at the semiconductor interface directly beneath the external gate (corresponding to the first auxiliary gate);

then a layer of mobile second conductivity type charge carriers is established inside the semiconductor material at the insulator semiconductor interface directly beneath the external gate when the first auxiliary gate is certain amount more reverse biased than the first gate (assuming that the insulator layer is neutral) with respect to the first source, and the said layer of mobile second conductivity type charge carriers being at the same potential than the first gate and acting as a part of the first gate. Particularly, if the first channel doping were large enough then the first FET would be a depletion mode field effect transistor despite said layer of mobile second conductivity type charge carriers acting as part of the first gate. Furthermore, with proper biasing of the first auxiliary gate said layer of mobile second conductivity type charge carriers would be present irrespective of the fact whether the input were at first or second input logic potential.

It should be also noted that if in the clamping resistant semiconductor logic element
 there is a first auxiliary gate node corresponding solely to an external gate,
 in between the first gate and the first auxiliary gate there is a first conductivity type doping corresponding to the first channel and having a joint pn and/or Schottky junction with the first gate,
 there is no conductive path for second conductivity type charge carriers in between the first gate and a location inside the semiconductor material situated at the semiconductor interface directly beneath the external gate (corresponding to the first auxiliary gate);
then a layer of mobile second conductivity type charge carriers will be established at the insulator-semiconductor interface beneath the external gate when the input is at second input logic potential and when the external gate is suitably biased. If the doping of the first channel is high enough then said layer of mobile second conductivity type charge carriers will neither be at the same potential than the first gate nor act as part of the first gate, but when a quasi-stationary state has been reached (particularly with respect to the layer of mobile second conductivity type charge carriers beneath the first auxiliary gate) the first channel should be nonconductive—otherwise one should remove part of the charge carriers or all of the charge carriers in the layer of mobile second conductivity type charge carriers located beneath the first auxiliary gate e.g. by pulsing the first auxiliary gate from time to time at a potential that is less reverse biased (i.e. more forward biased) with respect to the first source than what is the baseline first auxiliary gate potential in order to maintain a nonconductive first channel (and a conductive second channel). The major disadvantage of this would naturally be that during afore said pulsing the potential on the output node would be either less well defined or not defined at all.

In case the short circuit current induced switching related power consumption is the major source of switching related power consumption, then it is actually possible to take advantage of first auxiliary gate node induced clamping of the internal in order to reduce the switching related power consumption. The first auxiliary gate node induced clamping of the internal node is hereby defined as a condition when potential of the internal node is defined by the first auxiliary gate and not by the first gate. If in a semiconductor logic element the first FET comprises a first auxiliary gate node wherein there is a pn and/or Schottky junction between the drain of the first FET (i.e. first drain) and the auxiliary gate of the first FET (i.e. first auxiliary gate) then the first auxiliary gate induced clamping of the internal node is realized by biasing the first auxiliary gate at such a potential that the internal node is clamped at a certain potential (e.g. at the first auxiliary gate potential) before the input reaches second input logic potential when the potential at the input is set from first input logic potential to second input logic potential.

It should be noted that generally in a short circuit current mitigating semiconductor logic element the first auxiliary gate should be biased at a sufficiently large reverse bias with respect to the first source in order to provide large enough potential swing for the internal node between the states when input is at first input logic potential and at second input logic potential.

However, if the first auxiliary gate were at a forward bias with respect to the first source the clamping of the internal node would have to take place at an even larger forward bias between the first drain and first auxiliary gate when the input is set to second input logic potential and in addition large enough potential swing would need to be provided for the internal node. In room temperature this could be possible while low power operation would be maintained only in case the first FET would be formed of a large band-gap semiconductor material like e.g. boron nitride. Furthermore, the forward bias between the first drain and the first auxiliary gate could not be maintained indefinitely when the input were at second input logic potential, but one should at certain intervals set the input to first input logic potential and then back to second input logic potential in order to maintain large enough forward bias between the first auxiliary gate and the internal node when input is at second logic potential.

If in a short circuit current mitigating semiconductor logic element the first FET comprises a pn and/or Schottky junction between the first gate and the first source then the first FET should be in general a depletion mode field effect transistor. Furthermore, when the input is at first input logic potential the first gate should not be forward biased with respect to the first source unless the band-gap of the semiconductor material forming the first FET, the magnitude of the forward bias, and the operating temperature would enable low power operation.

If in the short circuit current mitigating semiconductor logic element the first FET is a surface channel enhancement mode field effect transistor comprising a first gate corresponding solely to an external gate, then the reverse bias between the first auxiliary gate node and the first source (at first source potential) should be large enough in order to enable a large enough potential swing for the internal node. Furthermore, when the input is at second input logic potential the reverse bias between the first gate and the first source should be larger than the reverse bias between the first source and the first auxiliary gate (assuming neutral gate insulator material)—in this manner the internal node will be clamped roughly at the first auxiliary gate potential (i.e. the first gate has no more influence on the potential at the internal node when the reverse bias on the first gate exceeds the reverse bias on the first auxiliary gate with respect to the first source).

Furthermore, if in the short circuit current mitigating semiconductor logic element the first FET
 comprises a first gate corresponding solely to an external gate,
 comprises a first conductivity type channel doping corresponding to the first channel,
 comprises a first auxiliary gate having a pn and/or Schottky junction in between the first auxiliary gate and the first channel, and
 there is a conductive path between the first auxiliary gate and a location inside the semiconductor material situated immediately underneath the external gate;
then there will be a layer of second conductivity type mobile charge carriers directly underneath the first gate being at the same potential and acting as part of the first auxiliary gate when the first gate is certain amount more reverse biased (assuming neutral gate insulator) than the first auxiliary gate with respect to the first source. From the point onwards when the layer of second conductivity type charge carriers is formed directly underneath the first gate the potential on the first gate does not affect the potential on the internal node, i.e., first auxiliary gate induced clamping of the internal node is resulted in when the reverse bias on the first gate exceeds a certain value meaning that the second input logic potential should be a larger reverse bias with respect to the first source than said certain value. When first auxiliary gate induced clamping of the internal node is resulted in the potential on the internal node depends of the first channel's depth, on the amount of first conductivity type charge carriers thermally generated and collected by the internal node, as well as on temperature. The potential on the first auxiliary gate would need to be selected also in a manner that enough potential swing is provided for the internal node between the states when input is at first input logic potential and at second input logic potential. Afore said applies also to a short circuit current mitigating semiconductor logic element wherein the first FET comprises a first gate corresponding solely to an external gate, comprises a first conductivity type channel doping corresponding to the first channel, comprises a first auxiliary gate having a pn and/or Schottky junction in between the first auxiliary gate and the first channel, and there is no conductive path between the first auxiliary gate and a location inside the semiconductor material situated immediately underneath the external gate, but the doping of the first channel is so low that a layer of second conductivity type mobile charge carriers will be formed directly underneath the first gate that is at the same potential and acts part of the first auxiliary gate when the reverse bias on the first gate with respect to the first source exceeds a certain value.

If in the short circuit current mitigating semiconductor logic element the first FET is an enhancement mode field effect transistor, in the first FET there is a first gate corresponding solely to an external gate incorporating a surface channel underneath, in the first FET on the opposite side with respect to the first gate there is a first auxiliary gate node corresponding solely to an external gate incorporating a surface channel underneath, in between the first gate and the first external gate there is second conductivity type semiconductor material that is preferably electrically connected to the first drain, and there are less second conductivity type charge carriers that are thermally generated and collected by the internal node than there are first conductivity type charge carriers that are thermally generated and collected by the internal node;

then the first auxiliary gate can be biased such that first auxiliary gate induced clamping of the internal node is resulted in, i.e. the potential on the first auxiliary gate (and not the second input logic potential on the first gate) defines the potential to which the internal node adjusts to when the input is at second input logic potential. If the first FET and the second FET are made of the same semiconductor material and both the first gate and the first auxiliary gate correspond to identical CIS stacks, then the sum of the absolute value of the threshold voltage, and the absolute value of the potential difference between the first source potential and the first auxiliary gate potential, should be smaller than the sum of the absolute value of the threshold voltage, and the absolute value of the potential difference between the first source potential and the second input logic potential;

provided that the semiconductor interface underneath the first auxiliary gate is not inverted (there should not be a layer of mobile first conductivity type charge carriers) when the input is at first input logic potential and that the potential swing of the internal node (i.e. potential difference of the internal node when input is at first input logic potential and at second input logic potential) is sufficiently large.

Generally speaking, if in the short circuit current mitigating semiconductor logic element the first FET comprises a first gate that corresponds solely to an external gate then the first FET can be either a depletion or enhancement mode field effect transistor. In the first case when the input is at second input logic potential the first gate has to be at a large enough reverse bias with respect to the first source in order for the first channel to be nonconductive, and in order to realize first auxiliary gate induced clamping of the internal node.

In the second case when the input is at second input logic potential the first gate has to be at a reverse bias or at a small enough forward bias not exceeding the threshold voltage with respect to the first source in order to establish a nonconductive first channel, and in order to realize first auxiliary gate induced clamping of the internal node.

In a short circuit current mitigating semiconductor logic element the second FET can be either a depletion mode or an enhancement mode field effect transistor. It is important to note that if in the short circuit mitigating semiconductor logic element the second FET (i.e. second gate) is a depletion mode field effect transistor comprising a pn and/or Schottky junction between the gate (i.e. second gate) and the source (i.e. second source) then the absolute magnitude of the potential difference between the first source potential, and the potential on the internal node when first auxiliary gate induced clamping takes place, should be smaller than the absolute magnitude of the potential difference between the first source potential, and the first output logic potential, unless the band-gap of the semiconductor material forming the second FET is significantly larger than the band-gap of the semiconductor material forming the first FET. This condition assures that first auxiliary gate induced clamping of the internal node takes place instead of clamping of the internal node at the second source when the input is at second input logic potential and when the band-gap of the semiconductor material forming the first FET is smaller than or the same as the band-gap of semiconductor material forming the second FET, i.e., this condition assures that when the input is set at the second input logic potential the potential of the internal node is adjusted to a potential causing the second gate to be reverse biased with respect to the second source (as well as causing the second channel to be conductive) provided that the band-gap of the semiconductor material forming the first FET is smaller or the same as the band-gap of semiconductor material forming the second FET.

Furthermore, it is important to note that if in the short circuit current mitigating semiconductor logic element the second FET (i.e. second gate) is an enhancement mode field effect transistor comprising a pn and/or Schottky junction between the second gate and the second source then the internal node has to be forward biased above the threshold voltage level with respect to the second source when the input is at second input logic potential in order to provide a conducting second channel. This fact necessitates that the absolute magnitude of the potential difference between the first source potential and the potential on the internal node during first auxiliary gate induced clamping must be larger than the absolute magnitude of the potential difference between the first source potential and the first output logic potential, that the band-gap of the semiconductor material forming the second FET is significantly larger than the band-gap of the semiconductor material forming the first FET, and that the major part of thermally generated mobile first conductivity type charge carriers that are collected by the internal node are flowing from the first drain to the first source and not from the second gate to the second source when input is set to second input logic potential, which insures that clamping takes place in the first FET and not in the second FET.

If in the short circuit current mitigating semiconductor logic element the second FET comprises an auxiliary gate (i.e. second auxiliary gate) wherein there is a pn and/or Schottky junction between the second auxiliary gate and the second source, then the second auxiliary gate should not be forward biased with respect to the second source unless the magnitude of the forward bias, the band-gap of the semiconductor material forming the second FET, and the temperature enable low power operation without significantly increasing the overall power consumption of the circuitry.

If in the short circuit current mitigating semiconductor logic element the following conditions are met the second FET comprises a second conductivity type channel doping corresponding to the second channel, the second FET comprises an auxiliary gate node having a pn and/or Schottky junction between the second auxiliary gate and the second channel, and the second gate comprises a pn and/or Schottky junction between the second gate and the second channel;

then the second auxiliary gate should be biased such that there is no current flow between the second auxiliary gate and the second gate over a potential barrier located in a typically fully depleted second channel when the input is at first input logic potential.

If in the short circuit current mitigating semiconductor logic element the second FET corresponds to a surface channel field effect transistor comprising a second auxiliary gate node corresponding solely to an external gate then one should preferably bias the second auxiliary gate at a larger forward bias with respect to the second source than the threshold voltage.

It should be noted that if in the short circuit current mitigating semiconductor logic element there is a second auxiliary gate node corresponding solely to an external gate, in between the second gate and the second auxiliary gate there is a second conductivity type doping corresponding to the second channel and having a joint pn and/or Schottky junction with the second gate, there is a conductive path for first conductivity type charge carriers in between the second gate and a location inside the semiconductor material situated at the semiconductor interface directly beneath the external gate (the external gate corresponding to the second auxiliary gate);

then a layer of mobile first conductivity type charge carriers is established at the insulator semiconductor interface beneath the external gate (i.e. the second auxiliary gate) when the second auxiliary gate is certain amount more reverse biased than the second gate (assuming that the insulator layer in between the external gate and the semiconductor material is neutral) with respect to the second source, and said layer of mobile first conductivity type charge carriers being at the same potential than the second gate and acting as a part of the second gate. Particularly, if the second channel doping were large enough then the second FET would be a depletion mode field effect transistor despite said layer of first conductivity type mobile charge carriers acting as part of the second gate, i.e. the second FET would be a depletion mode transistor under any second auxiliary gate potential. Furthermore, with proper biasing of the second auxiliary gate said layer of mobile first conductivity type charge carriers would be present irrespective of the fact whether the input were at first or second input logic potential, which would be the preferable way of operation. If the second channel doping were not large enough and the second FET would not be a depletion mode field effect transistor when said layer of first conductivity type mobile charge carriers were present, then one should preferably bias the second auxiliary gate such that said layer is not present when input is at first or second logic potential.

It should be also noted that if in the short circuit current mitigating semiconductor logic element there is a second auxiliary gate node corresponding solely to an external gate, in between the second gate and the second auxiliary gate there is a second conductivity type doping corresponding to the second channel and having a joint pn and/or Schottky junction with the second gate, there is no conductive path for first conductivity type charge carriers in between the second gate and a location inside the semiconductor material situated immediately beneath the external gate (i.e. the second auxiliary gate);

then a layer of mobile first conductivity type charge carriers will be established at the insulator-semiconductor interface beneath the external gate (the external gate corresponds to the second auxiliary gate) when the input is at first input logic potential and when the external gate is suitably biased. If the doping of the second channel is high enough then said layer of first conductivity type mobile charge carriers will neither be at the same potential than the second gate nor act as part of the second gate, but when a quasi-stationary state has been reached (particularly with respect to the layer of mobile first conductivity type charge carriers beneath the second auxiliary gate) the second channel should be nonconductive—otherwise one should remove part of the charge carriers or all of the charge carriers in the layer of mobile first conductivity type charge carriers located beneath the second auxiliary gate e.g. by pulsing the second auxiliary gate from time to time at a potential that is less reverse biased (i.e. more forward biased) with respect to the second source than what is the baseline second auxiliary gate potential in order to maintain a nonconductive second channel. The downside of this would naturally be that during afore said pulsing the second channel would be conductive increasing thus the overall power consumption.

If in the short circuit current mitigating semiconductor logic element the second FET comprises a second gate corresponding solely to an external gate then the second gate can be either forward or reverse biased with respect to the second source provided that the second channel is nonconductive when the input is at first input logic potential and that the second channel is conductive when the input is at second input logic potential. Furthermore, if in the short circuit mitigating semiconductor logic element the second FET comprises a second gate that corresponds solely to an external gate then the second gate will not be clamped at the second source irrespective of the fact whether the second FET is a depletion mode or an enhancement mode field effect transistor. The case when the second gate corresponds solely to an external gate is particularly well suited for the short circuit mitigating semiconductor logic element since one can considerably mitigate the short circuit current induced switching related power consumption or even prevent it by enabling more precise control on the current flow from the output. This is an advantage when compared to the traditional CCIS logic wherein the input corresponds solely to an external gate and wherein there is less control on the current flow from the output increasing thus short circuit current induced switching related power consumption.

If in the short circuit current mitigating semiconductor logic element
 the second FET is a surface channel enhancement mode field effect transistor,
 the second FET comprises a second gate corresponding solely to an external gate, and
 the second FET comprises a second auxiliary gate and there is a pn and/or Schottky junction between the first auxiliary gate and the second source;
then the forward bias on the second gate (being part of the internal node) with respect to the second source needs to be larger than the threshold voltage of the second FET when the input is second input logic potential, i.e., when first auxiliary gate induced clamping of the internal node takes place the absolute value of the potential difference between the first source and the internal node has to be larger than the sum of
 the absolute value of the potential difference between the first source and the first output logic potential, and
 the absolute value of the threshold voltage of the second FET. Furthermore, the second auxiliary gate is preferably electrically connected to the second source.

Furthermore, if in the short circuit current mitigating semiconductor logic element the second FET
 comprises a second gate corresponding solely to an external gate,
 comprises a second conductivity type channel doping corresponding to the second channel,
 comprises a second auxiliary gate having a pn and/or Schottky junction in between the second auxiliary gate and the second channel, and
 there is a conductive path between the second auxiliary gate and a location inside the semiconductor material situated immediately underneath the external gate;
then there will be a layer of first conductivity type mobile charge carriers directly underneath the second gate and being at the same potential and acting as part of the second auxiliary gate when the second gate is certain amount more reverse biased (assuming neutral gate insulator) than the second auxiliary gate with respect to the second source. From the point onwards when the layer of first conductivity type mobile charge carriers is formed directly underneath the second gate the potential on the second gate does not affect the potential on the internal node and if this is the case when the input is at first input logic potential then the second channel has to be nonconductive.

Moreover, if the short circuit current mitigating semiconductor logic element comprises a second FET wherein
 there is a second gate corresponding solely to an external gate,
 there is a second conductivity type channel doping corresponding to the second channel,
 there is a second auxiliary gate having a pn and/or Schottky junction in between the second auxiliary gate and the second channel, and
 there is no conductive path between the second auxiliary gate and a location inside the semiconductor material situated immediately underneath the external gate, but the doping of the second channel is so low that a layer of first conductivity type mobile charge carriers will be formed directly underneath the second gate that is at the same potential and acts part of the second auxiliary gate when the reverse bias on the second gate with respect to the second source exceeds a certain value. If the doping of the second channel is high enough then said layer of first conductivity type mobile charge carriers will neither be at the same potential than the second auxiliary gate nor act as part of the second auxiliary gate, but when a quasi-stationary state has been reached (particularly with respect to the layer of first conductivity type mobile charge carriers beneath the second gate) the second channel should be nonconductive—otherwise one should remove part of the charge carriers or all of the charge carriers in the layer of first conductivity type mobile charge carriers located beneath the second gate e.g. by pulsing the second auxiliary gate from time to time at a potential that is less reverse biased (i.e. more forward biased) with respect to the second source in order to maintain a nonconductive second channel.

It should be noted that when it is described that a clamping resistant semiconductor logic element, and/or a short circuit current mitigating semiconductor logic element, and/or input capacitance minimizing semiconductor logic element, and/or semiconductor logic element according to PCT/FI2016/050014 comprises in the first FET a first conductivity type channel doping corresponding to the first channel then the first conductivity type channel doping extends preferably or necessarily from the first conductivity type first source to the first conductivity type first drain. Furthermore, when it is described that a clamping resistant semiconductor logic element, and/or a short circuit current mitigating semiconductor logic element, and/or input capacitance minimizing semiconductor logic element, and/or semiconductor logic element according to PCT/FI2016/050014 comprises in the second FET a second conductivity type channel doping corresponding to the second channel then the second conductivity type channel doping extends preferably or necessarily from the second conductivity type second source to the second conductivity type second drain.

Before the drawing related descriptions of the embodiments of the invention (i.e. before the descriptions concerning FIGS. 3 and 4), general aspects of the clamping resistant semiconductor logic element, of the short circuit current mitigating semiconductor logic elements, of the input capacitance minimizing semiconductor logic element, and of semiconductor logic element according to PCT/FI2016/050014 are given next with reference to the invented semiconductor logic element. The reason is that said general aspects apply to all of the four: clamping resistant semiconductor logic element, short circuit current mitigating semiconductor logic element, input capacitance minimizing semiconductor logic element, and semiconductor logic element according to PCT/FI2016/050014.

In traditional complementary logic the traditional second conductivity type semiconductor logic element (CISFET, CSFET, or JFET having second conductivity type source and drain and in between them a channel capable of transporting mobile second conductivity type charge carriers) can be replaced with the invented semiconductor logic element. When this is done the gate (i.e. the input) of the traditional semiconductor logic element corresponds to above described gate of the first FET, but in a broader sense it corresponds to the joint entity comprising the first FET and the internal node. The source of the traditional semiconductor logic element corresponds to above described source of the second FET, the drain (i.e. the output) of the traditional semiconductor logic element corresponds to above described drain of the second FET, and the channel of the traditional semiconductor logic element corresponds to the channel of the second FET. It should be noted that the gate (i.e. the input) of the traditional semiconductor logic element can be coupled either to a first or second input logic potential, that the source of the traditional semiconductor logic element can be coupled to a first output logic potential, and that the drain could be either at a first output logic potential or at a second logic potential.

By changing the dopings of the invented semiconductor logic element to opposite type, by providing a complementary first input logic potential corresponding to the second input logic potential of the invented semiconductor logic element, by providing a complementary second input logic potential corresponding to the first input logic potential of the invented semiconductor logic element, by providing a complementary first output logic potential corresponding to the second output logic potential of the invented semiconductor logic element, by providing a complementary second output logic potential corresponding to the first output logic potential, and by providing a complementary first source potential an invented complementary semiconductor logic element is established.

In traditional complementary logic the traditional second conductivity type semiconductor logic element (CISFET, CSFET, or JFET having second conductivity type source and drain) can be replaced with an invented semiconductor logic element and the traditional complementary first conductivity type semiconductor logic element (CISFET, CSFET, or JFET having first conductivity type source and drain) can be replaced with an invented complementary semiconductor logic element in order to achieve novel type of complementary logic. When this is done the gate (i.e. the input) of the traditional complementary semiconductor logic element corresponds to the gate of the first FET in the invented complementary semiconductor logic element. The source of the traditional complementary semiconductor logic element corresponds to the source of the second FET in the invented complementary semiconductor logic element, and the drain of the traditional complementary semiconductor logic element corresponds to the drain of the second FET in the invented complementary semiconductor logic element. It should be noted that the gate of the traditional complementary semiconductor logic element can be coupled either to a first or second input logic potential, that the source of the traditional complementary semiconductor logic element can be coupled to a second output logic potential, and that the drain could be either at a first output logic potential or at a second logic potential.

Based on afore said invented complementary semiconductor logic is established either by combining together invented semiconductor logic elements and first conductivity type traditional semiconductor logic elements or by combining together invented semiconductor logic elements and invented complementary semiconductor logic elements. If the invented semiconductor logic element is used to replace a second conductivity type enhancement mode CISFET in traditional CCIS logic, then the input of the invented semiconductor logic element corresponds to the external gate of the CISFET. If the invented complementary semiconductor logic element is used to replace a first conductivity type enhancement mode CISFET in traditional CCIS logic, then the input of the invented complementary semiconductor logic element corresponds to the external gate of the CISFET. It is possible in traditional CCIS logic to replace the second conductivity type CISFET with the invented semiconductor logic element and/or to replace the first conductivity type CISFET with the invented complementary semiconductor logic element.

The benefit of a complementary logic circuitry based on the invented semiconductor logic element and/or on the invented complementary semiconductor logic element is that during steady state there are no conductive current paths between nodes that are at different potentials resulting in small power consumption. A further benefit is that since the internal node is located in between the first gate and the second source/drain the first gate node is well isolated from the second source node and from the second drain node. This means that a single defect cannot result in the formation of a permanent conductive path between the first gate node as well as the second source node and/or the second drain node, i.e., the formation of a conductive path between two logic lines is mitigated. Thus the damage caused by a defect is easier to isolate, countermeasures against defects are easier to design, and complete device breakage is less likely resulted in. Yet another benefit of the invented semiconductor logic element and of the invented complementary semiconductor logic element is that multiple complementary logic level pairs can be easily established in the novel complementary logic circuitry. Besides, depending on the specific arrangement of the invented semiconductor logic element or of the invented complementary semiconductor logic one can also avoid further problems related to the traditional CCIS logic that have been described in the background of the invention section in the document PCT/FI2016/050014.

It is important to note that the invented semiconductor element according can be bidirectional like the corresponding CISFET in traditional CCIS logic in case the back-gate doping of the CISFET is not connected to the source doping, i.e., when ever desired one could interchange the function of the second source and the second drain. For example, one could revert the biasing of the invented semiconductor logic element via suitable associated circuitry so that the second drain doping would be connected to the first output logic potential and so that the second source doping would become the output. This means that the roles of the second source and the second drain can be interchangeable in the invented semiconductor logic element.

It is also important to note that the input, the second source and/or the second drain of the invented semiconductor logic element can be connected to any number of
outputs, inputs, second sources, and second drains of other semiconductor logic elements,
complementary outputs (or shortly: outputs), complementary inputs (or shortly: inputs), complementary second sources (or shortly: second sources), and complementary second drains (or shortly: second drains) of complementary semiconductor logic elements, outputs, inputs, sources, and drains of traditional semiconductor logic elements including enhancement mode CISFETs, and complementary outputs (or shortly: outputs), complementary inputs (or shortly: inputs), complementary sources (or shortly: sources), and complementary drains (or shortly: drains) of complementary traditional semiconductor logic elements including enhancement mode CISFETs provided that during steady state a conductive path is not generated between nodes that are biased at different potentials.

For example the output of the semiconductor logic element could be connected to the second source of another semiconductor logic element in order to realize part of a NAND logic gate or part of a NOR logic gate. Based on the NAND or the NOR logic gates one can realize all other logic gates (like e.g. AND, OR, XOR, XNOR, NOT). In this example the output and the second source of different semiconductor logic elements could be fused together so that a wiring would not be required between them (in this case the biasing of the second source would take place inside the semiconductor substrate).

As already explained before one can replace a CISFET in traditional CCIS logic with a similar type invented semiconductor logic element in a manner wherein the source of the CISFET corresponds to the second source of the second FET, wherein the drain of the CISFET corresponds to the second drain of the second FET, and wherein the gate of the CISFET corresponds to the first gate of the first FET. For example in order to realize an inverter according to the invention one would connect the second source of the second FET in the invented semiconductor logic element to the first output logic potential and the complementary second source of the complementary second FET in the invented complementary semiconductor logic element to the second output logic potential of the invented semiconductor logic element. Next one would connect the first gate of the first FET in the invented semiconductor logic element to the complementary first gate of the complementary first FET in the invented complementary semiconductor logic element as the input of the inverter. Finally one would connect the second drain of the second FET in the invented semiconductor logic element to the complementary second drain of the complementary second FET in the invented complementary semiconductor logic element as the output of the inverter. The input of the inverter would be biased either at the first input logic potential or at the second input logic potential. If the input of the inverter would be biased at the first input logic potential the output of the inverter would be at the second output logic potential and if the input of the inverter would be biased at the second input logic potential the output of the inverter would be at the first output logic potential. In this invented inverter configuration the first input logic potential and the first output logic potential can be different or the same; similarly the second input logic potential and the second output logic potential can be different or the same.

In order to realize a simple switch one would connect the second source of an invented semiconductor logic element and the complementary second source of an invented complementary semiconductor logic element together as one node of the switch, and in addition one would connect the second drain of the invented semiconductor logic element and the complementary second drain of the invented complementary semiconductor logic element together as another node of the switch. Next one would connect the input of the invented semiconductor logic element to the input of an inverter and finally the output of the inverter to the input of the invented complementary semiconductor logic element. Now the input of the invented semiconductor logic element would act as the input of the switch. Depending on the state of the input of the switch (either at first or second input logic potential) the switch either blocks or passes through from one node to another voltages that are between the first and second output logic potentials (or at least either blocks or passes through from one node to another voltages that are either the first or second output logic potential).

Beside the fact that the second source of a certain invented semiconductor logic element may not be biased to the first output logic potential it is crucial to understand that there must be at least one invented semiconductor logic element in the complementary logic circuitry wherein the second source is connected to the first output logic potential since otherwise the invented complementary logic circuitry would not work. This does, however, neither restrict the use of different biasing schemes in the invented semiconductor logic element nor limit the scope of protection of this invention. For example in some conjunction and/or at some point of time the second source could be connected to the second output logic potential or it could be floating or one could interchange the roles of the second source and the second drain.

In addition it is important to note that it is possible to realize an invented semiconductor logic element wherein there is more than one first FET which could be connected e.g. in parallel or in series meaning that in this manner one invented semiconductor logic element could have several inputs. In the parallel configuration one would connect the first drains of the multiple first FETs to the second gate of the second FET, i.e., the size and therefore the overall capacitance of the internal node would increase. The problem is, however, that capacitive coupling between an individual first gate node and the internal node would decrease due to the larger overall capacitance of the internal node which may likely reduce the switching speed.

In the series connection of first FETs the first drain of a first FET would be connected to a first source of another first FET. The problem is, however, that the internal node comprises only the first drain of the first FET that is next to the second FET. In other words, only one input is capacitively coupled to the internal node which could seriously affect the switching speed. One could handle this situation e.g. by utilizing plate capacitors between the internal node and all the inputs of the in series connected first FETs which would, however, increase the capacitance of the internal node thus likely decreasing the switching speed. Another option would be to remove (or mitigate as much as possible) the capacitive coupling between the internal node and the input that is located next to the internal node and to implant impurity atoms having mid band gap states (like e.g. Gold in Silicon) beneath the first drain of the first FET which first drain is connected to the second gate of the second FET. In this manner one could improve the switching speed of the series connection of first FETs to an acceptable level but it would increase considerably the steady state power consumption.

One could also have several second FETs per one single first FET wherein the internal node would comprise the first drain of the first FET and the second gates of the several second FETs. The problem with this arrangement is, however, that it may reduce the switching speed and that it consumes also more area. The former is due to larger internal node capacitance and the latter one is due to the fact that one could achieve the same effect with a single second FET by coupling multiple wiring paths to the second drain of the second FET. One could also realize an invented semiconductor logic element comprising multiple first FETs and multiple second FETs.

In addition it is possible to utilize multiple independent gates in the first FET and/or in the second FET so that the first FET would have multiple inputs and/or the second FET would have multiple internal nodes that are connected to multiple independent first FETs if the multiple independent gates are isolated from each other. In other words the independent gates should correspond to external gates of CIS or Schottky type (comprising a Conductor Semiconductor stack). In case the first FET comprises multiple independent first gates it suffers from the same problems than when multiple first FETs are connected in series (i.e. when the first drain of a first FET is connected to the first source of another first FET). In case the second FET comprises multiple independent second gates wherein each of the independent second gate is connected to the first drain of a separate first FET then the switching speed is not affected when compared to the case that there is only one first FET per one second FET but a reduction in area is achieved. This fact could be exploited e.g. in the NAND configuration.

For the reason of simplicity only the case wherein the invented semiconductor logic element comprises one first FET and one second FET is considered later on in the text. In addition wherever it is not specifically mentioned otherwise the first input logic potential is assumed to be the same as the first output logic potential and referred to as first logic potential, the second input logic potential is assumed to be the same as the second output logic potential and referred to as the second logic potential, and the second source is assumed to be connected to first logic potential. However, this neither restricts the use of different kind of semiconductor logic elements and different kind of biasing schemes nor limits the scope of protection of this invention. Besides the invented/novel semiconductor logic element is hereinafter also simply referred to as the semiconductor logic element and the novel/invented complementary semiconductor logic element is hereinafter also simply referred to as the complementary semiconductor logic element.

In the above description and later on in the text the term node potential refers to the Fermi level of the node that could be deduced e.g. on a wiring that is or would be electrically connected to the node corresponding to the situation wherein all the wirings electrically connected to the nodes of the semiconductor logic element or to the complementary semiconductor logic element are formed of the same material (Ohmic contact is naturally required). One could, however, use for biasing different wiring materials at different nodes or one could omit the wires by biasing the different nodes e.g. through a conductive path located inside semiconductor material.

As was already said previously listed aspects of the invented semiconductor logic elements apply to the semiconductor logic element according to PCT/FI2016/050014, clamping resistant semiconductor logic element, short circuit current mitigating semiconductor logic element, and input capacitance minimizing semiconductor logic element.

Figure 3:
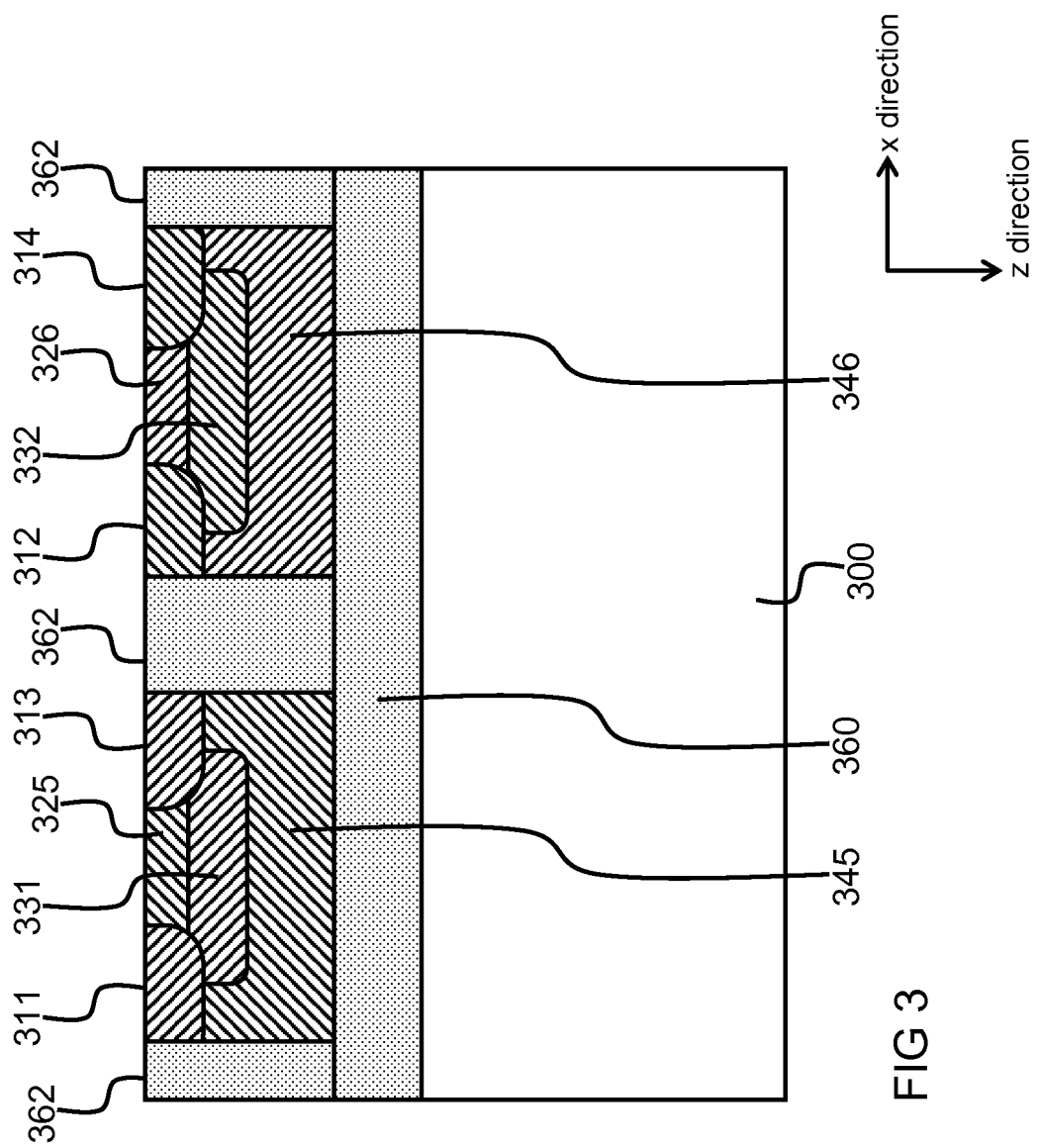
FIG. 3 illustrates a schematic cross-section of a semiconductor logic element.
Figure 4:
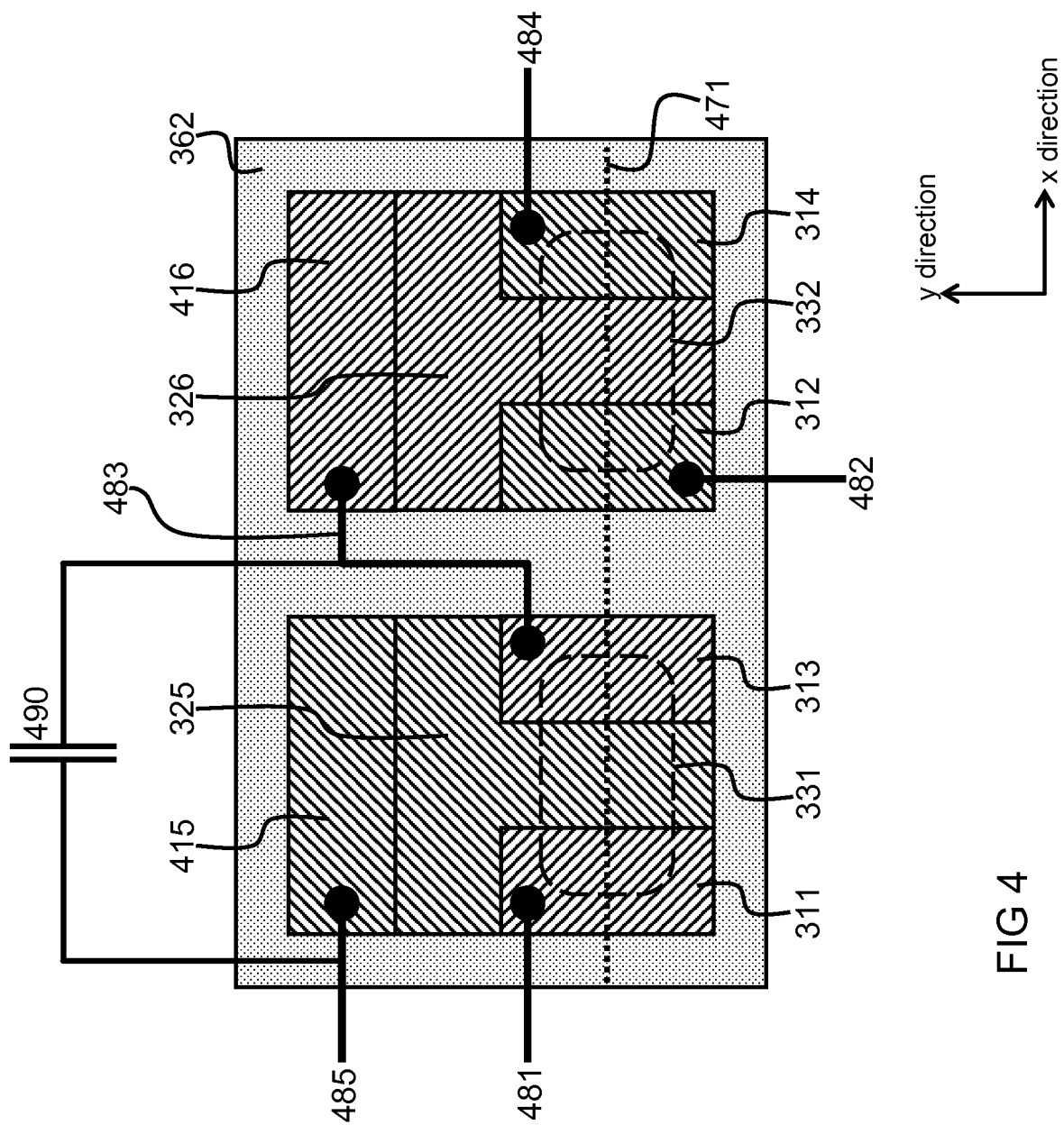
FIG. 4 illustrates the schematic layout of the semiconductor logic element according to FIG. 3.

FIGS. 3 and 4 illustrate a semiconductor logic element corresponding to the semiconductor logic element according to PCT/FI2016/050014, or to the clamping resistant semiconductor logic element, or to the input capacitance minimizing semiconductor logic element. FIG. 4 corresponds to a schematic layout and FIG. 3 to a schematic cross-section along the dashed line 471 in FIG. 4 of the semiconductor logic element. The semiconductor logic element of FIGS. 3 and 4 comprises on the left hand side the first FET and on the right hand side the second FET. In FIG. 3 the horizontal x-direction corresponds to a direction located on the surface of the semiconductor logic element and the vertical z-direction refers to a direction being perpendicular to the surface of the semiconductor logic element. In FIG. 4 the horizontal x-direction is located on the surface of the semiconductor logic element and it is parallel to the dashed line 471. In FIG. 4 the vertical y-direction is located also on the surface of the semiconductor logic element and it is perpendicular to the x-direction.

The first FET comprises a first conductivity type source 311 corresponding to the first source, a first conductivity type drain 313 corresponding to the first drain, a first conductivity type channel doping 331 located between the first source and the first drain and corresponding to the first channel capable of carrying mobile first conductivity charge carriers, and a first gate controlling/confining the first channel. The first gate comprises a second conductivity type upper gate doping 325, a second conductivity type lower gate doping 345, and a second conductivity type contact doping 415. The upper gate doping 325 controls/confines the first channel from above and the lower gate doping 345 controls/confines the first channel from below.

The second FET comprises a second conductivity type source 312 corresponding to the second source, a second conductivity type drain 314 corresponding to the second drain, a second conductivity type channel doping 332 located between the second source and the second drain and corresponding to the second channel capable of carrying mobile second conductivity type charge carriers, and a second gate controlling/confining the second channel. The second gate comprises a first conductivity type upper gate doping 326, a first conductivity type lower gate doping 346, and a first conductivity type contact doping 416. The upper gate doping 326 controls/confines the second channel from above and the lower gate doping 346 controls/confines the second channel from below.

In FIG. 4 the first channel 331 and the second channel 332 are presented for illustrative reason by dashed lines since they are not located at the surface of the semiconductor material but deeper inside the semiconductor material. The insulator layer 360 is part of a Semiconductor On Insulator (SOI) structure. The trench 362 reaches to the insulator layer 360 and surrounds the first FET and the second FET providing thereby isolation for both of the FETs. The layer 300 supports the above situated SOI arrangement.

The first source node comprises the first source and associated wiring 481 and it is configured to be coupled via the wiring 481 to a first source potential. The first gate node corresponds to the input and it comprises the first gate and associated wiring 485 and it is configured to be coupled via the wiring 485 either to a first input logic potential or to a second input logic potential. The second source node comprises the second source and associated wiring 482 and it is configured to be coupled via the wiring 482 to the first output logic potential. The second drain node corresponds to the output and comprises the second drain and associated wiring 484. The internal node comprises the first drain, the second gate, and wiring 483 connecting the first drain and the second gate together. In between the input and the internal node there is also an optional 'drag-along' capacitor 490.

For the reason of importance the special case of the semiconductor logic element is analyzed wherein the first input logic potential corresponds to the first output logic potential (both referred to as first logic potential), wherein the second input logic potential corresponds to the second output logic potential (both referred to as second logic potential), and wherein the band-gap width corresponds roughly to silicon. This special case is analyzed with respect to the semiconductor logic element of FIGS. 3 and 4 with the help of FIGS. 5-10 corresponding to the operation of a clamping resistant semiconductor logic. In FIGS. 5-10 the physical x, y, and z directions are depicted by a horizontal direction and the electrostatic potential is depicted by a vertical direction. In FIGS. 5-10 the curved lines separated by a constant distance from each others refer to valence and conduction band edges (the upper line corresponds to the conduction band edge, the lower one to the valence band edge, and in between them is situated the forbidden gap) of the semiconductor material. The lines constituted of straight vertical and horizontal sections refer, on the other hand, to wirings external to the semiconductor material and belonging to different nodes. In FIGS. 5-10 the potential of the valence and conduction band edges inside the semiconductor material is represented by the vertical direction as a function of a physical direction (x, y, and/or z), which corresponds to the horizontal direction. It is important to note that in FIGS. 5-10 the electrostatic potential and the physical directions apply inside the semiconductor material only and that they do not apply to the wirings situated outside the semiconductor material. In FIGS. 5-10 mobile negative charge carriers, i.e., electrons are illustrated with black dots 2551 and mobile positive charge carriers, i.e., holes are illustrated with circles 2552. Furthermore, in FIGS. 5-10 the horizontal dashed lines 2553 illustrate Fermi and quasi-Fermi levels.

Figure 5:
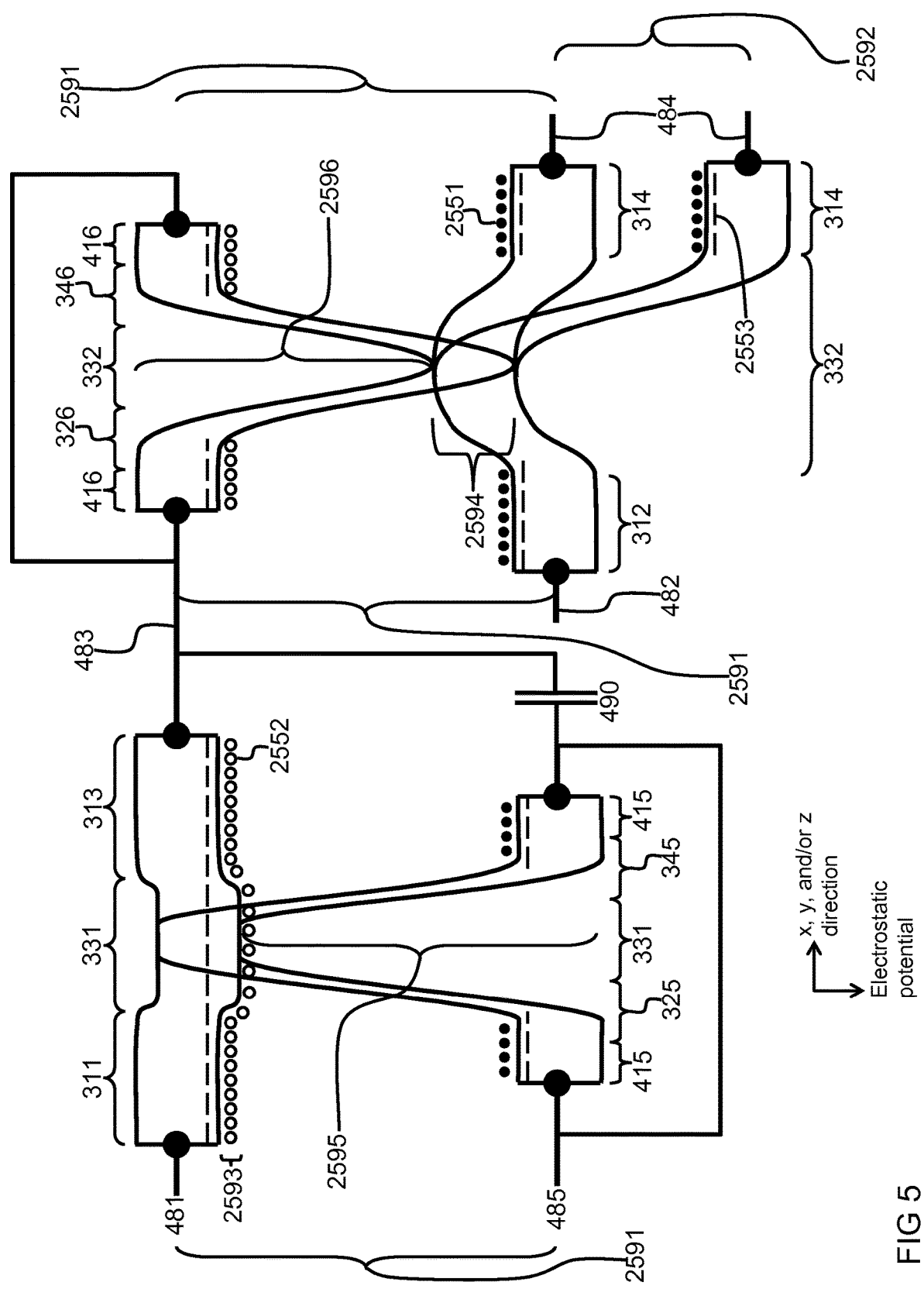
FIG. 5 illustrates an operational potential diagram of a clamping resistant semiconductor logic element.
Figure 7:
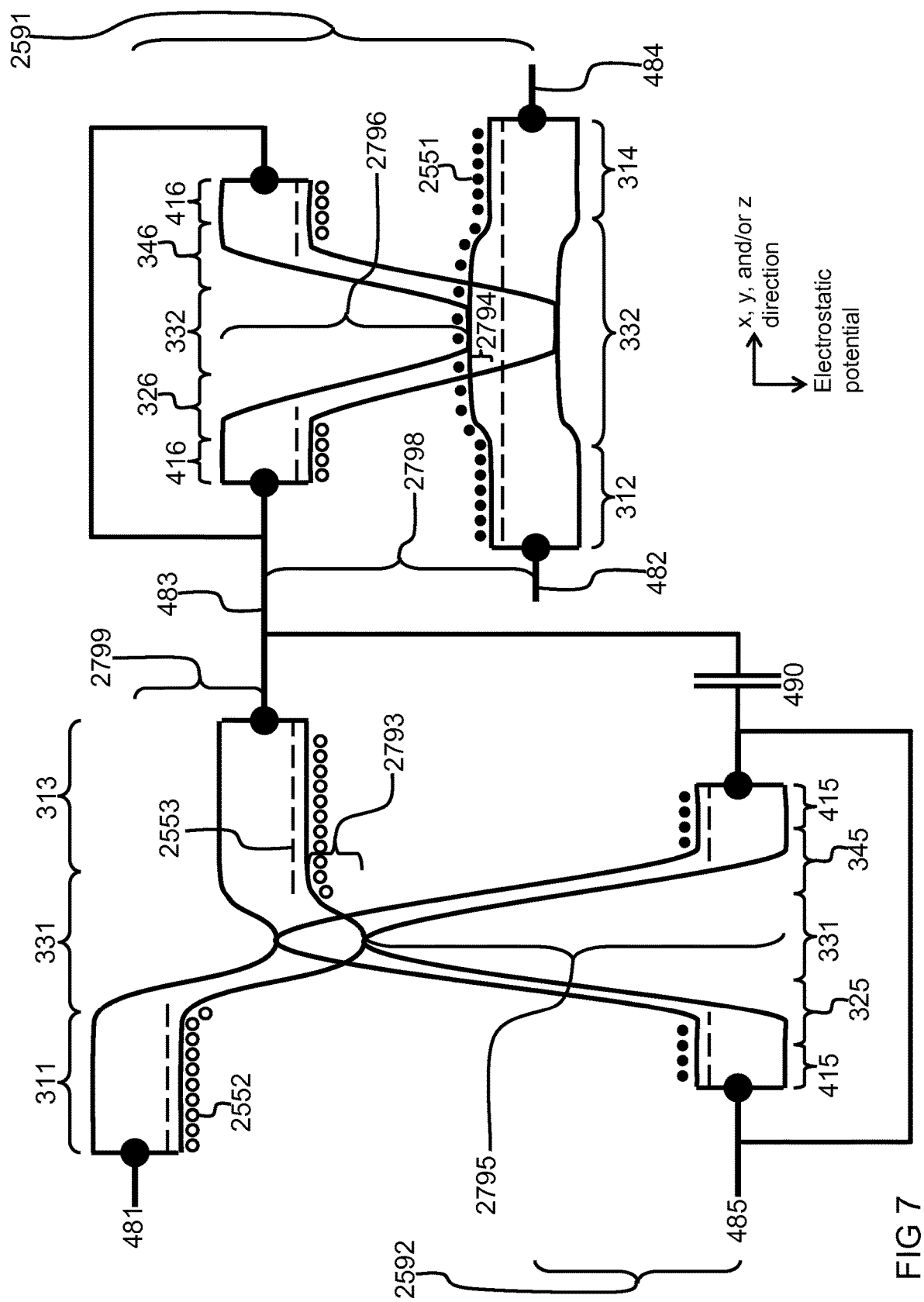
FIG. 7 illustrates yet another operational potential diagram of the same clamping resistant semiconductor logic element as in FIG. 5.

FIG. 5 corresponds to first FET being of p type (p type source and drain, hole channel), the second FET being of n type (n type source and drain, electron channel), and the first gate node (i.e. the input) being connected to the first logic potential being e.g. 0 V. The first source node is coupled to the first source potential being e.g. −5 V and the second source node is connected to the first logic potential. FIG. 7 refers, on the other hand, to the case when the input is connected to the second logic potential being e.g. 3 V.

A situation when the gate node of a transistor is biased at such a potential that the channel of the transistor is less conductive than in case the gate node would be biased at the potential of the source node is referred to as gate node being reverse biased with respect to the source node. A larger reverse bias on the gate node is referred to as a situation wherein the channel is less conductive. Similarly a situation when the gate node of a transistor is biased at such a potential that the channel of the transistor is more conductive than in case the gate node would be biased at the source node potential is hereinafter referred to as gate node being forward biased with respect to the source node. A larger forward bias on the gate node is referred to as a situation wherein the channel is more conductive.

In the semiconductor logic elements according to FIGS. 5-7 and FIGS. 8-10 the first logic potential and the second logic potential on the first gate node are both reverse biases with respect to the first source potential at which the first source node is biased. Furthermore, the second logic potential is a larger reverse bias than the first logic potential with respect to the first source potential meaning that the first channel is less conductive when the first gate node is biased at the second logic potential than at the first logic potential.

A fundamentally important operational feature of the semiconductor logic elements according to FIGS. 5-10 is shown in FIG. 5, namely, that even though the input being at the first logic potential is reverse biased with respect to the first source node being at the first source potential the first channel is still conductive. This can be deduced from the fact that in FIG. 5 the first channel doping 331 comprises a section wherein the valence and conduction band edges are represented by flat horizontal lines (meaning that the channel is not essentially fully depleted; a flat horizontal section in the valence and conduction edges means generally that there is no potential gradient and that the corresponding section is not depleted). Another indication is that in FIG. 5 the vertical distance 2593 corresponding to potential barrier for first source's (p type in FIG. 5) majority carriers (holes in FIG. 5) to enter into the first channel doping 331 (p type in FIG. 5) is very small, i.e., this barrier is only due to the change of doping concentration in neutral region of similar doping type corresponding to high source/drain doping versus lower channel doping and thus the barrier does not limit the flow of first source's majority carriers into the first channel and further to the first drain (p type in FIG. 5). This means that the internal node comprising the first drain and the second gate will be biased at the same potential than the first source node, i.e. at the first source potential (e.g. −5 V), and thus the internal node will be reverse biased with respect to the second source node being at the first logic potential (e.g. 0 V). The words vertical distance and potential barrier (or just barrier) according to FIGS. 5-10 are hereinafter referred to as the absolute magnitude of a potential difference, i.e., the corresponding value is always positive and has the quantity Volt.

FIG. 5 shows also another fundamentally important operational feature of the semiconductor logic elements according to FIGS. 5-10, namely, that when the reverse biasing between the internal node and the second source node is such that the internal node is at first source potential and the second source node is at first logic potential then the second channel is nonconductive. This can be deduced from the fact that the second channel 332 does not comprise a flat horizontal section wherein the valence and conduction band edges would be presented by a flat horizontal line (meaning that the channel is essentially fully depleted). Another more significant indication is that in FIG. 5 the vertical distance 2594 corresponding to potential barrier for second source's (n type in FIG. 5) majority carriers (electrons in FIG. 5) to enter into the second channel 332 (n type in FIG. 5) is large enough to prevent the flow of second source's majority carriers to the second drain (n type in FIG. 5). Thus the output of the semiconductor logic element may be either at first logic potential or at second logic potential, i.e., the application of the first logic potential to the input means that the semiconductor logic element has no control of the potential on the output.

The vertical distance 2595 corresponds to the potential barrier that first source's majority carriers located in the bottom of the conductive first channel (p type in FIG. 5) need to overcome in order to enter into the neutral part of the first gate (n type in FIG. 5) when input is at first logic potential. The vertical distance 2596 corresponds to the potential barrier that second source's majority carriers located in the bottom of the nonconductive second channel (n type in FIG. 5) need to overcome in order to enter into the neutral part of the second gate (p type in FIG. 5) when input is at first logic potential. In order for semiconductor logic elements according to FIGS. 5-7 and FIGS. 8-10 to work it is fundamentally important that the vertical distance 2595 is considerably larger than the vertical distance 2596 when similar gate to source reverse bias is applied in both FETs. In other words the first FET has a deeper channel or larger channel depth than the second FET so that when the first source node is at first source potential, when the first gate node is at first logic potential, when the second source node is at first logic potential, and when the internal node comprising the second gate is at first source potential then the first channel of the first FET is conductive and the second channel of the second FET is nonconductive.

In FIG. 5 the vertical distance 2591 corresponds to the absolute magnitude of the potential difference between the first source and the first gate, which equals to the absolute magnitude of the potential difference between the first source potential (e.g. −5 V) and the first logic potential (e.g. 0 V) plus built-in Voltage Vbi (vertical distance 2591 being e.g. 5 V+Vbi; Vbi>0 V). The vertical distance 2591 equals to the sum of the potential barriers 2595 and 2593. Similarly the vertical distance 2591 equals to the sum of the potential barriers 2596 and 2594. In FIG. 5 it is further highlighted that since at this stage the input has no control over the output, the output node comprising the wiring 484 may be either at first logic potential (e.g. 0 V) or at second logic potential (e.g. 3 V). In FIG. 5 the vertical distance 2592 corresponds to the absolute magnitude of the potential difference between the first logic potential and the second logic potential.

Figure 6:
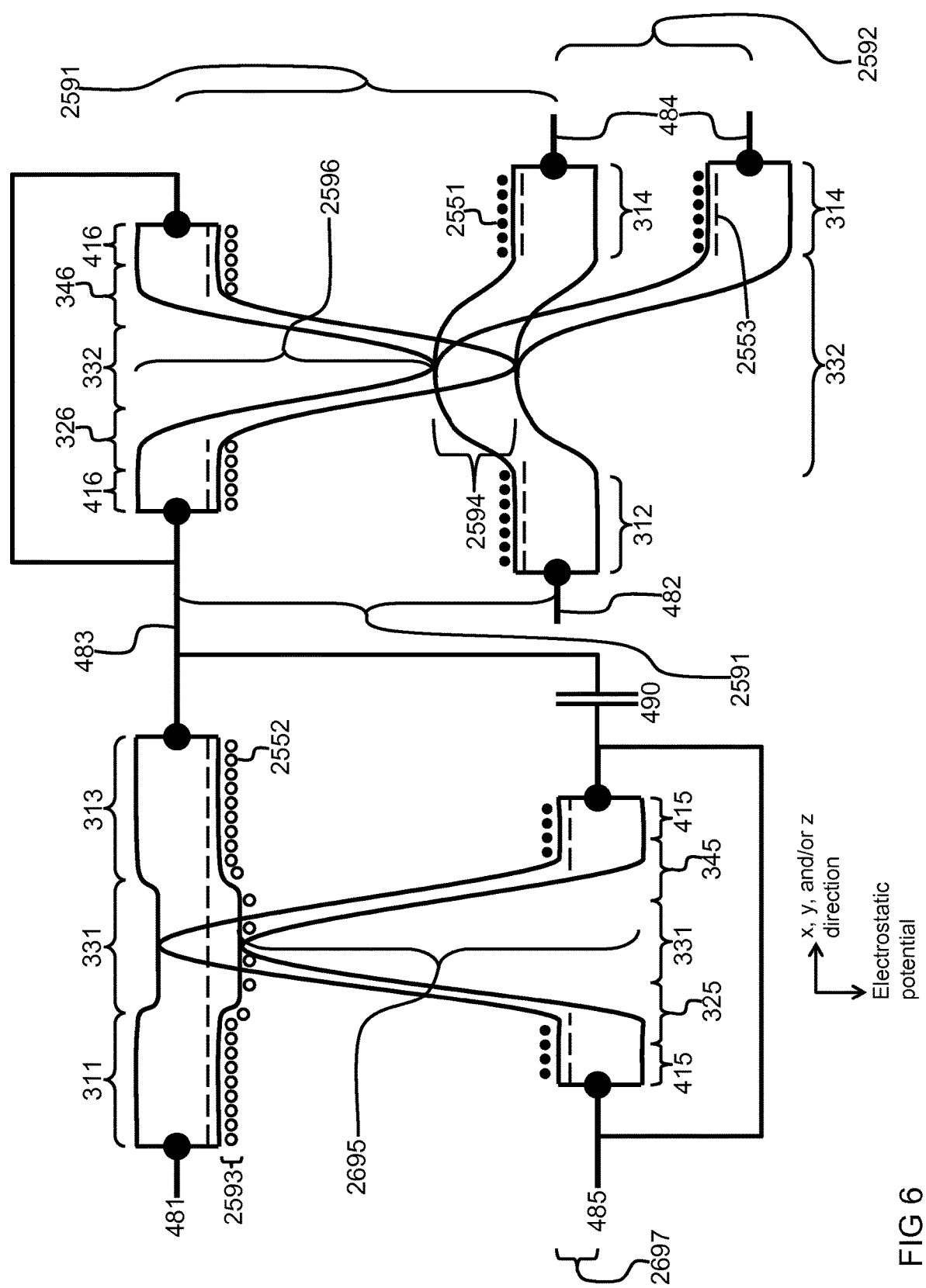
FIG. 6 illustrates another operational potential diagram of the same clamping resistant semiconductor logic element as in FIG. 5.

FIG. 6 corresponds to the situation when the input node comprising the wiring 485 is in the process of being pulled from the first logic potential (e.g. 0 V) to the second logic potential (e.g. 3 V). The specific timing of FIG. 6 corresponds exactly to when the first channel (p type in this case) is pinched off (i.e. intermediate stage of the channel in between conductive and nonconductive stages) and when the influence of the changing input potential on the second FET cannot be compensated anymore by current flow through the first channel, i.e. the potential of the internal node starts to follow strongly the potential of the input (i.e. first gate node) via the first gate to first drain capacitance and possibly via an optional 'drag-along' plate capacitor 490. This has the effect on the second FET that the second gate starts to be less reverse biased with respect to the second source. The vertical distance 2697 refers to the absolute magnitude of the potential difference in the first gate between the situation when the first gate node (i.e. input) is at first logic potential and when the first gate node is at the potential when the first channel is pinched off. In FIG. 6 the vertical distance 2695 refers to the potential barrier that the first source's majority carriers located in the bottom of the first channel need to overcome in order to enter into the neutral part of the first gate when the first channel is at pinch off, i.e. the vertical distance 2695 refers to the channel depth of the first FET at channel pinch-off. It can be clearly seen also from FIG. 6 that the first channel is considerably deeper than the second channel, i.e., the vertical distance 2695 is clearly bigger than the vertical distance 2596.

FIG. 7 corresponds to the situation when the input node has already reached the second logic potential (e.g. 3 V). It can be clearly seen that at this stage the internal node comprising the wiring 483 has not been clamped at the second source being at first logic potential but instead the second gate (being part of the internal node) is adjusted to a potential causing the second gate to be reverse biased with respect to the second source as well as causing the second channel to be conductive. The potential to which the internal node is adjusted to is defined mainly by the channel depth 2795, by the potential difference between the first source potential and the second logic potential, as well as by the temperature and the band-gap (which define the size of the potential barrier 2793). In FIG. 7 the vertical distance 2794 refers to the potential barrier of second source's majority carriers to enter into the second channel when the second channel is conductive. In FIG. 7 the vertical distance 2796 refers to the potential barrier that the second source's majority carriers located in the bottom of the second channel need to overcome in order to enter into the neutral part of the second gate, i.e. the vertical distance 2796 refers to the channel depth of the second channel when the input is at second input logic potential. In FIG. 7 the vertical distance 2798 corresponds to the reverse bias of the internal node with respect to the second source equaling to the sum of the potential barrier 2794 and the potential barrier 2796. In FIG. 7 the vertical distance 2793 refers to the potential barrier for first drain's majority carriers to enter into the first channel and further into the first source. In FIG. 7 the vertical distance 2795 refers to the potential barrier that first source's majority carriers located in the bottom of the nonconductive first channel need to overcome in order to enter into the neutral part of the first gate when the input is at second logic potential, i.e. the vertical distance 2795 refers to the channel depth of the first channel when input is at second logic potential.

One can deduce from FIG. 7 that the second channel is at this stage conductive due to the fact that the second channel doping 332 comprises a flat horizontal section (i.e. the channel is not fully depleted) and due to the fact that the potential barrier 2794 is so small (i.e. the barrier is only due to the change of doping concentration in a neutral region of similar doping type corresponding to high source/drain doping versus lower channel doping) that it does not prevent second source's majority carriers from entering in to the second channel and further into the second drain (i.e. output). The fact that the second channel is conductive means that the output node will be biased at the same potential as the second source node, namely, at first logic potential.

Similarly one can deduce from FIG. 7 that the first channel is at this stage nonconductive due to the facts that there is no flat horizontal section in the first channel 331 and that the potential barrier 2793 is big enough to prevent first drain's majority carriers (holes in this case) from entering into the first channel and further into the first source. The fact that the first channel is nonconductive means that the internal node is no more biased at the first source potential, but on the contrary the potential of the internal node is adapted to a potential which is reverse biased with respect to the second source and causing the second channel to be conductive.

To summarize, in order for the semiconductor logic element to work it is a fundamentally important point that when the input is set to the second logic potential the first channel is nonconductive since this feature enables the potential of the internal node to be disconnected from the first source potential and thus enabling the potential of the internal node to adapt to a potential adjusting the second channel conductive, which means that the output is set to first logic potential.

The adaptation of the internal node to a potential transforming the second channel conductive can be achieved via the inherently present capacitance between the first gate node and the internal node (comprising the capacitance between the first gate and first drain) and/or via the optional 'drag-along' plate capacitor which does actually not have to have the form of two opposite plates separated by a small gap. Besides, according to FIG. 7 even without any capacitance between the first gate node and the internal node the potential at the internal node would settle down to the first logic potential when the input is set to second logic potential since thermally generated first type mobile charge carriers collected by the internal node would settle the potential on the internal node to potential depicted in FIG. 7. However, if there were no capacitance between the first gate node (i.e. input) and the internal node the settling time of the internal node could be much longer than when the internal node would be pulled to first logic potential via the capacitance between the input and the internal node. Since the speed of operation is important for semiconductor logic elements it may be beneficial to utilize an optional 'drag-along' plate capacitor. It may also be beneficial to cover the internal node with a biased conductor acting as a shield to the internal node since in this manner unwanted external capacitive coupling to the internal node can be prevented.

Figure 8:
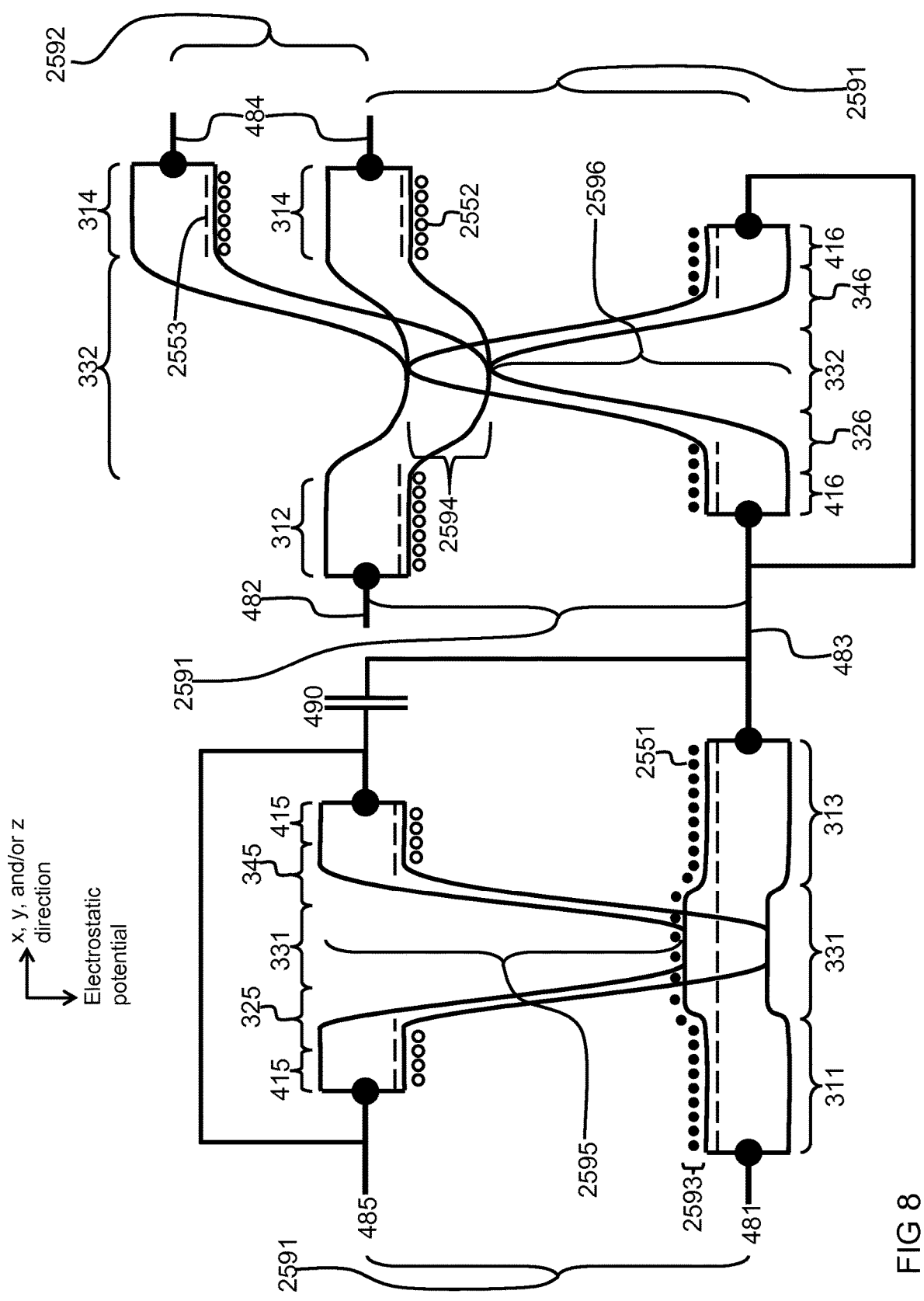
FIG. 8 illustrates an operational potential diagram of a clamping resistant semiconductor logic element that is complementary to the clamping resistant semiconductor logic element of FIG. 5.
Figure 9:
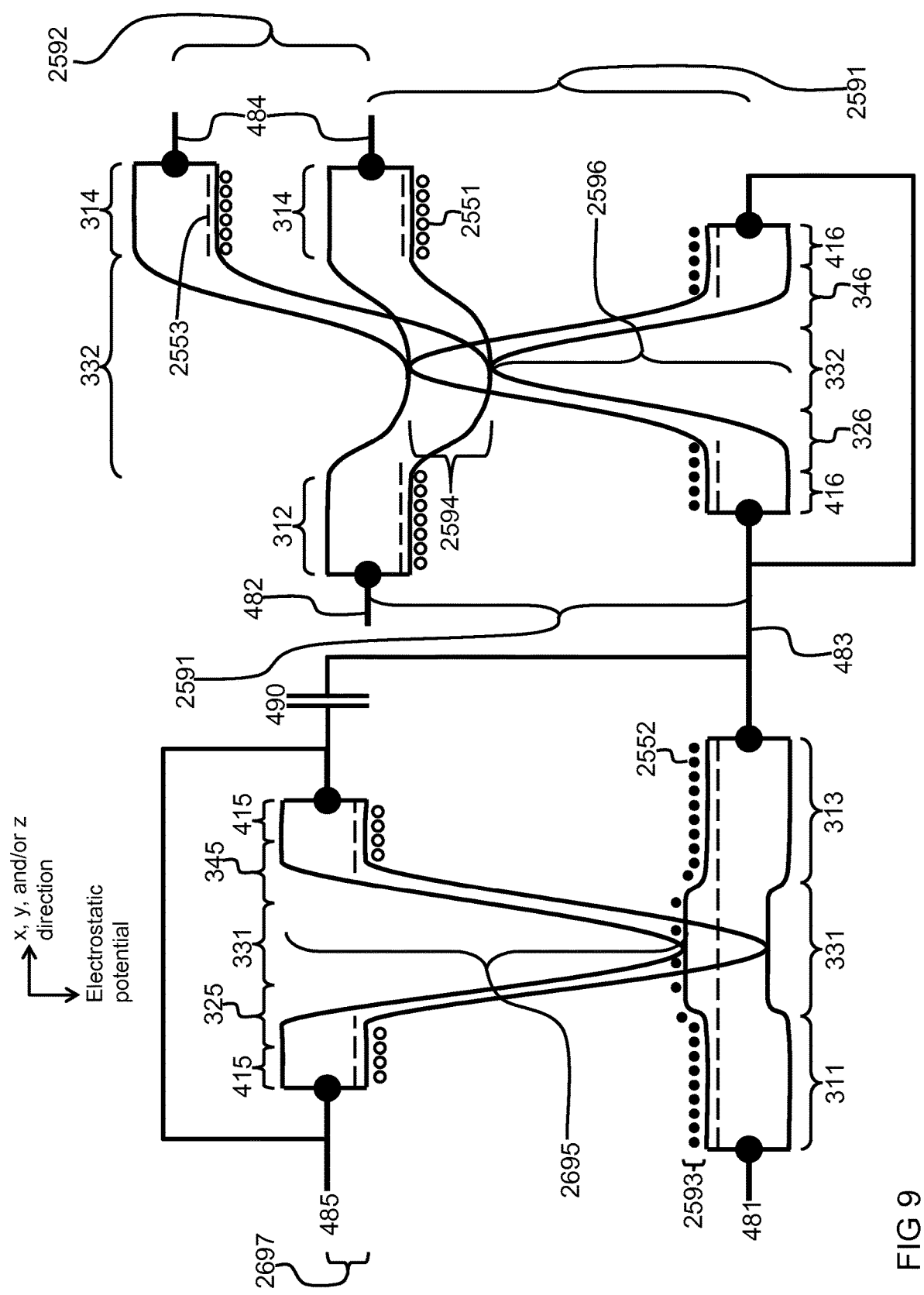
FIG. 9 illustrates another operational potential diagram of the same clamping resistant semiconductor logic element as in FIG. 8.
Figure 10:
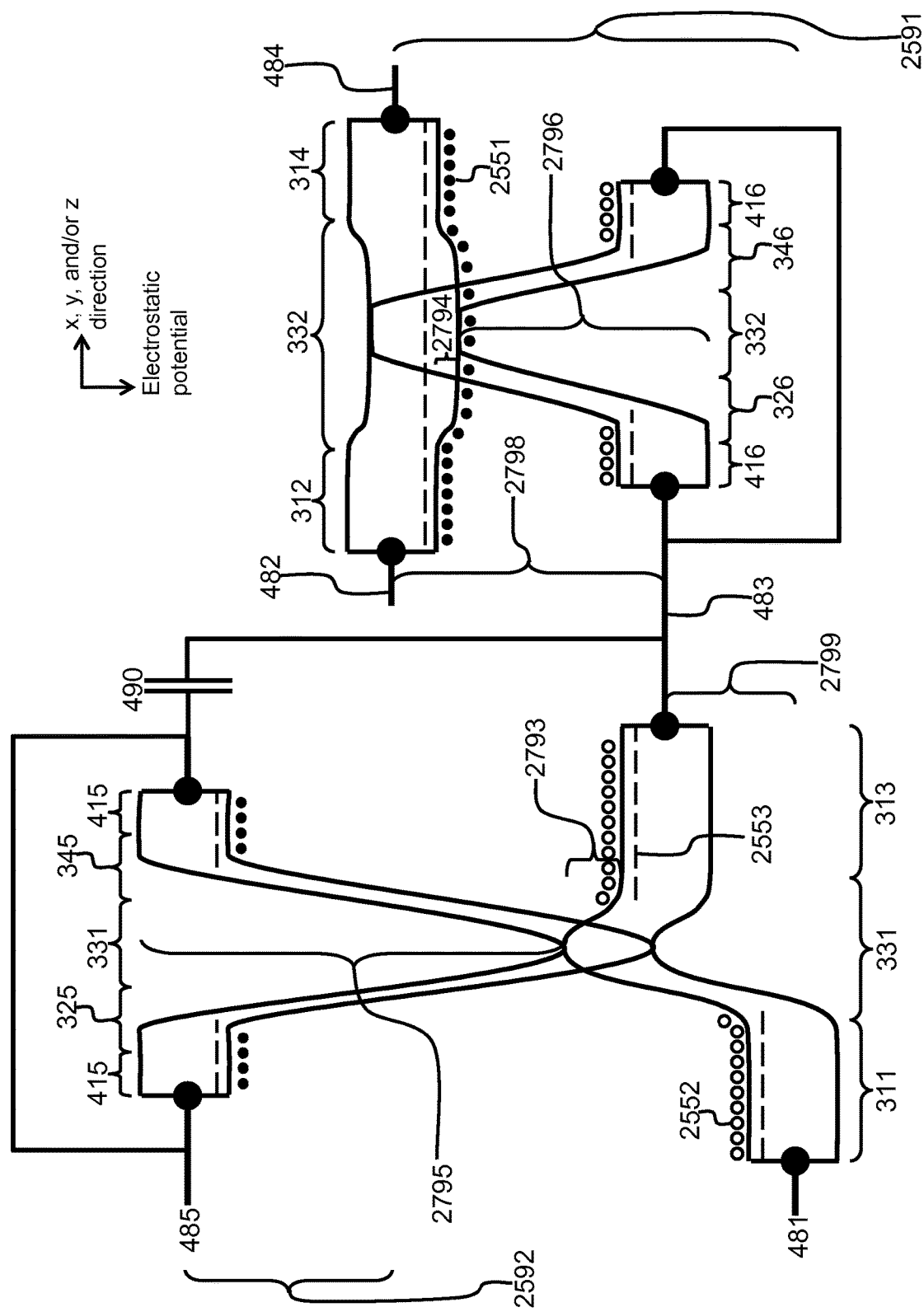
FIG. 10 illustrates yet another operational potential diagram of the same clamping resistant semiconductor logic element as in FIG. 8.

As already said FIGS. 5-7 correspond to the situation when the first FET is p type and the second FET is n type. The opposite is true for FIGS. 8-10 wherein the first FET is n type (n type source and drain, electron channel) and the second FET is p type (p type source and drain, hole channel). The only differences between FIGS. 8-10 and FIGS. 5-7 are that every p type doping atom is changed to n type doping atom and vice versa and that the polarities of the potentials are changed. In addition a level shift may be asserted to all of the potentials. Otherwise everything else remains the same. Afore said means that FIG. 8 is a vertical mirror image of FIG. 5, that FIG. 9 is a vertical mirror image of FIG. 6, and that FIG. 10 is a vertical mirror image of FIG. 7.

In FIG. 8 the first source node is connected to first source potential which is e.g. 8 V, the second source node is connected to first logic potential which is e.g. 3 V. When the input is connected to the first logic potential (e.g. 3 V) the first channel is conductive thus biasing the internal node to first source potential (e.g. 8 V) causing the second channel to be nonconductive, which enables the output to be either at the first logic potential (e.g. 3 V) or at the second logic potential (e.g. 0 V). On the other hand, in FIG. 10 when the input is connected to the second logic potential (e.g. 0 V) the first channel is nonconductive enabling the internal node to adjust to a potential rendering the second channel conductive thus biasing the output at the first logic potential (e.g. 3 V). FIG. 9 illustrates a transition stage in between the initial stage (when input was biased at first logic potential) and the final stage (when input will be biased at the second logic potential) exactly at the moment when the first channel is pinched off.

As already said FIG. 6 (or FIG. 9) presents transition from the stage presented in FIG. 5 (or FIG. 8) wherein the input being at first logic potential has no control over the potential of the output to the stage presented in FIG. 7 (or FIG. 10) wherein the input is at second logic potential setting the output to first logic potential. When the transition is performed to the other direction, i.e., when the potential of the input is being transformed from the second logic potential to the first logic potential then the intermediate stage concerning the second FET would look slightly different since when the input is transformed to smaller reverse bias with respect to the first source the 'drag-along' capacitance (comprising an inherently preset first gate to first drain capacitance and an optional plate 'drag-along' capacitor) pushes the internal node to larger reverse bias with respect to the second source. In this process the internal node may be pushed to a larger reverse bias with respect to the second source than what is the reverse bias of the internal node biased at first source potential with respect to the second source node being biased at first logic potential. However, at the moment when the potential on the input reaches first channel's pinch-off reverse bias with respect to the first source node then the internal node will be biased to first source potential through the conductive first channel.

In the embodiments corresponding to FIGS. 3, 4, and 5-10 both the first FET and the second FET in FIGS. 3 and 4 are lateral Junction FETs (JFETs). The gate of a JFET is formed in the same region of semiconductor material than the source, the drain, and the channel. Besides the JFET channel is located inside the semiconductor material, i.e., the JFET comprises a buried channel. In a lateral JFET the current flows laterally in a plane that is beneath the semiconductor interface and parallel with respect to the surface (in FIGS. 3 and 4 along the x-direction). Besides in semiconductor logic elements corresponding to FIGS. 3, 4, and 5-10 both the first FET and the second FET in FIGS. 3 and 4 are depletion mode FETs. In addition, in the first FET the channel remains conductive at higher gate to source reverse bias levels than in the second FET. To summarize, in semiconductor logic elements corresponding to FIGS. 3, 4, and 5-10 the first FET and second FET are depletion mode lateral JFET of opposite type and the first FET has a deeper buried channel than the second FET.

The term depletion mode FET refers hereinafter to a FET wherein the channel is conductive when the gate is connected to the same potential than the source. The term enhancement mode FET refers hereinafter to a FET wherein the channel is nonconductive when the gate is connected to the same potential than the source. It should be noted that in first FET and second FET designs comprising an auxiliary gate the biasing of the auxiliary gate may define whether the transistor corresponds to depletion or enhancement mode.

The term buried channel FET refers hereinafter to a channel wherein at least a part of the current and beneficially all the current flows inside the semiconductor material. This is enabled by deploying a channel doping that is of the same conductivity type than the source and drain. In a JFET being in the conductive stage all the current flows inherently inside the semiconductor material. In a buried channel CISFET being in the conductive stage all the current can be forced to flow inside the semiconductor material by biasing the external gate properly so that the mobile charge carriers in the channel (being of the same type as the majority carriers in the source/drain of the corresponding buried channel CISFET) are pushed away from the interface (between the semiconductor and the gate insulator layer) located beneath the external gate.

Yet another point is that in the semiconductor logic elements corresponding to FIGS. 3, 4, and 5-10 the first FET and the second FET comprise a wrap around gate, i.e., the channel is confined by the gate from four sides. In case the width of the channel (y-direction) is considerably larger than the thickness of the channel (z-direction) it would not make a big difference if the channel would be confined only from above and below (i.e. from two sides), which would be the case if the channel would be confined in y-direction from both sides by insulator trenches. If the channel would be confined by a trench in y-direction only from one side the channel would be confined by the gate from three sides.

In FIGS. 5-10 it is assumed for the reason of simplicity that the first FET and the second FET are formed of the same semiconductor material. Thus the location of the valence and conduction band edges in both first FET and second FET match if the doping concentration, the doping type, and the potential of the node match. The first FET and the second FET could, however, be also made of different semiconductor materials and this may even be beneficial since in this manner the performance of the semiconductor logic element could be better optimized. In addition, it is assumed that the material of the wiring is the same in all the nodes but one could naturally utilize different wiring material in different wirings.

Figure 2:
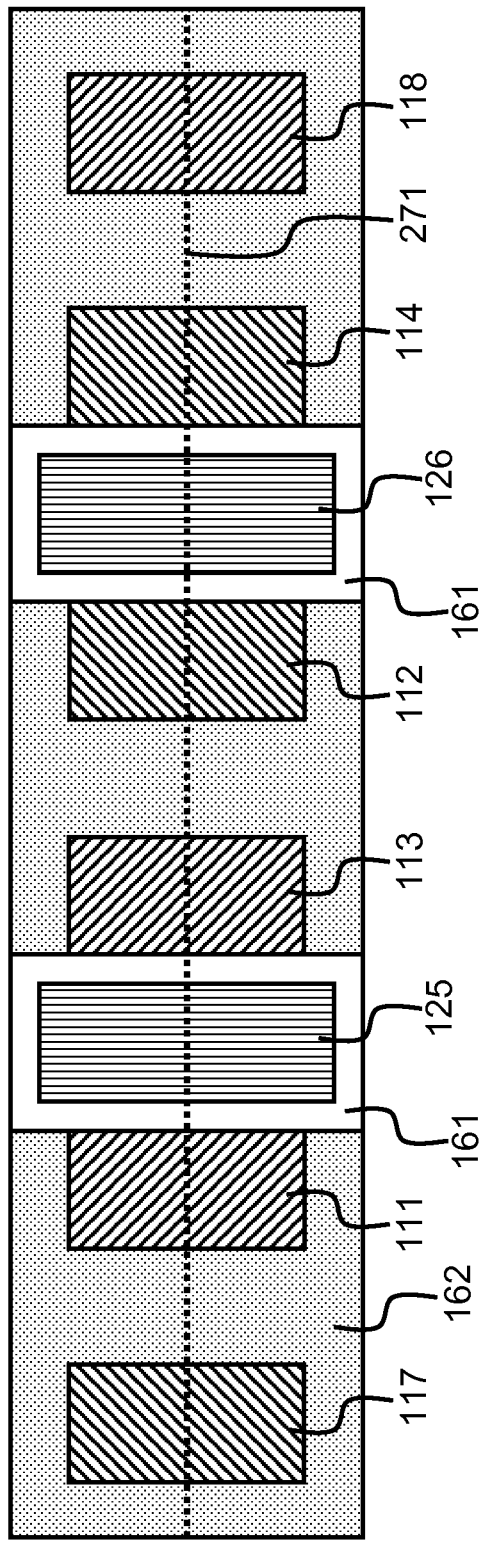
FIG. 2 illustrates a schematic layouts of the prior art semiconductor logic element on the right and of the prior art complementary semiconductor logic element on the left presented in FIG. 1.

As already previously mentioned in FIGS. 1 and 2 two semiconductor logic elements are presented, namely, two enhancement mode surface channel CISFETs of opposite type. It is important to note that the traditional CCIS logic is realized with only these two basic semiconductor logic elements. The semiconductor logic element on the right hand side of FIGS. 1 and 2 (i.e. right hand side CISFET) corresponds to the semiconductor logic element presented in FIGS. 3 and 4. A complementary semiconductor logic element wherein the n and p type doping in FIGS. 3 and 4 are interchanged, i.e., wherein the semiconductor regions marked with slash lines are changed to backslash lines and vice versa corresponds to the semiconductor logic element presented on the left hand side of FIGS. 1 and 2. The invented semiconductor logic elements and/or the invented complementary semiconductor logic elements enable the realization of specific complementary logic, which is hereinafter referred to Modified Standard Complementary Logic (MSCL).

The term Traditional Standard Complementary Logic (TSCL) refers to complementary logic circuitry comprising a set of logic elements corresponding to traditional semiconductor logic elements comprising a gate, a second conductivity type source, a second conductivity type drain, and a channel in between the source and the drain; when the source is at a first output logic potential and the gate is at a first input logic potential then the channel is nonconductive; when the source is at the first output logic potential and the gate is at a second input logic potential then the channel is conductive; and traditional complementary semiconductor logic elements comprising a gate, a first conductivity type source, a first conductivity type drain, and a channel in between the source and the drain; when the source is at a complementary first output logic potential and the gate is at a complementary first input logic potential then the channel is nonconductive; when the source is at the complementary first output logic potential and the gate is at a complementary second input logic potential then the channel is conductive;

and wherein the first input logic potential, the first output logic potential, the complementary second input logic potential, and the complementary second output logic potential are all the same throughout afore said set of logic elements and correspond to first logic potential, the second input logic potential, the second output logic potential, the complementary first input logic potential, and the complementary first output logic potential are all the same throughout afore said set of logic elements and correspond to second logic potential, and during a steady state there are no conductive paths between two nodes that are at different potentials.

It important to note that TSCL circuitry can be a part of a larger complementary logic circuitry or a part of different types of logic and mixed mode circuitries.

The term MSCL refers to complementary logic that is composed of a set of logic elements comprising
 invented semiconductor logic elements,
 invented complementary semiconductor logic elements and/or traditional complementary semiconductor logic elements, and
 possibly traditional semiconductor logic elements.

Furthermore, in the set of logic elements corresponding to MSCL when in the invented semiconductor logic elements the source of the first type first FET is at a first source potential, the source of the second type second FET is at a first output logic potential, and the gate of the first FET is at a first input logic potential then the channel of the second FET is nonconductive, when in the invented semiconductor logic elements the source of the first FET is at the first source potential, the source of the second FET is at the first output logic potential, and the gate of the first FET is at a second input logic potential then the channel of the first FET is nonconductive and the channel of the second FET is conductive, when in the invented complementary semiconductor logic elements (if present in the set of logic elements) the source of the second type complementary first FET is at a complementary first source potential, the source of the first type complementary second FET is at a complementary first output logic potential, and the gate of the complementary first FET is at a complementary first input logic potential then the channel of the complementary second FET is nonconductive, when in the invented complementary semiconductor logic elements (if present in the set of logic elements) the source of the complementary first FET is at the complementary first source potential, the source of the complementary second FET is at the complementary first output logic potential, and the gate of the complementary first FET is at a complementary second input logic potential then the channel of the complementary first FET is nonconductive and the channel of the complementary second FET is conductive, when in the traditional semiconductor logic elements (comprising a gate, a second conductivity type source, a second conductivity type drain, and a channel in between the source and the drain; and if present in the set of logic elements) the source is at the first output logic potential and the gate is at the first input logic potential then the channel is nonconductive, when in the traditional semiconductor logic elements (if present in the set of logic elements) the source is at the first output logic potential and the gate is at the second input logic potential then the channel is conductive, when in the traditional complementary semiconductor logic elements (comprising a gate, a first conductivity type source, a first conductivity type drain, and a channel in between the source and the drain; and if present in the set of logic elements) the source is at the complementary first output logic potential and the gate is at the complementary first input logic potential then the channel is nonconductive, when in the traditional complementary semiconductor logic elements (if present in the set of logic elements) the source is at the complementary first output logic potential and the gate is at the complementary second input logic potential then the channel is conductive, the first input logic potential, the first output logic potential, the complementary second input logic potential, and the complementary second output logic potential are all the same throughout afore said set of logic elements and correspond to first logic potential, the second input logic potential, the second output logic potential, the complementary first input logic potential, and the complementary first output logic potential are all the same throughout afore said set of logic elements and correspond to second logic potential, and during the steady state there are no conductive paths between two nodes that are at different potentials.

In the above description of the MSCL the invented semiconductor logic elements refer to semiconductor logic elements according to PCT/FI2016/050014, and/or to clamping resistant semiconductor logic elements, and/or to short circuit current mitigating semiconductor logic elements, and/or to input capacitance minimizing semiconductor logic elements. In addition, in the above description of the MSCL the invented complementary semiconductor logic elements refer to complementary semiconductor logic elements according to PCT/FI2016/050014, and/or to clamping resistant complementary semiconductor logic elements, and/or to short circuit current mitigating complementary semiconductor logic elements, and/or to input capacitance minimizing complementary semiconductor logic elements. It is important to note that MSCL circuitry can replace TSCL circuitry and that MSCL circuitry can be a part of a larger complementary logic circuitry or a part of different types of logic and mixed mode circuitries. Particularly MSCL can replace traditional CCIS logic corresponding to TSCL.

Concerning the MSCL incorporating semiconductor logic elements according to FIGS. 5-10 a mandatory requirement is naturally that the first logic potential of FIGS. 5-7 corresponds to the second logic potential of FIGS. 8-10 and that the second logic potential of FIGS. 5-7 corresponds to the first logic potential of FIGS. 8-10, i.e., the first logic potential and the second logic potential of FIGS. 8-10 are interchanged when compared to the semiconductor logic element of FIGS. 5-7. In addition a complementary first source potential (e.g. 8 V) needs to be provided for the complementary semiconductor logic element. Other mandatory requirements of MSCL incorporating semiconductor logic elements according to FIGS. 5-10 are that the channel depth at channel pinch-off in the first FET is larger than the channel depth at channel pinch-off in the second FET and that the channel depth at channel pinch-off in the complementary first FET is larger than the channel depth at channel pinch-off in the complementary second FET.

It is important to note that the fact that in a MSCL comprising clamping resistant semiconductor logic elements and corresponding clamping resistant complementary semiconductor logic element according to FIGS. 5-10 the potential spread is relatively large, i.e. 13 V. However, the dynamical potential swing is only 3 V which contributes to the switching related power consumption. This fact, the fact that one can avoid clamping induced as well as short circuit induced switching related power consumption, and the facts that the capacitances at the input and output are fairly small mean that the switching related power consumption is small. It should be also noted that the dynamical potential swing could be further reduced in order to further reduce the switching related power consumption. The fact that the static potential spread of 13 V is relatively large means that there is a relatively large amount of depleted semiconductor material that contributes to the static power consumption. The static power consumption is, however, only a problem at room temperature in relatively small band-gap semiconductor materials. If semiconductor materials like gallium arsenide or even larger band-gap semiconductor materials are utilized in stead of silicon then the static power consumption could be dramatically reduced when compared to silicon based TSCL. Furthermore, since in many IoT applications the clock frequency can be very low it is actually possible with the MSCL corresponding to FIGS. 5-10 to dramatically reduce the power consumption of corresponding IoT devices enabling thus an unprecedented increase in the battery life.

Hereinafter the term Complementary Semiconductor logic (CS logic) is utilized for invented complementary logic comprising semiconductor logic elements according to PCT/FI2016/050014, and/or clamping resistant semiconductor logic elements, and/or short circuit current mitigating semiconductor logic elements, and/or input capacitance mitigating semiconductor logic elements as well as comprising complementary semiconductor logic elements according to PCT/FI2016/050014, and/or clamping resistant complementary semiconductor logic elements, and/or short circuit current mitigating complementary semiconductor logic elements, and/or input capacitance mitigating semiconductor logic elements wherein the first FETs, the complementary first FETs, the second FETs, and the complementary second FETs are all composed of JFETs (like e.g. in FIGS. 5-10). A very beneficial aspect of the CS logic is that in the first FET and second FET the gate is formed in the same semiconductor region than the source and the drain, i.e., the gate is not comprised of a CIS stack and thus the semiconductor logic element is not affected by gate insulator electric breakdown, by leakage through the gate insulator, by variations in thickness and/or in k value of the gate insulator, or by buildup of insulator charge (e.g. positive oxide charge in Silicon) in the gate insulator. This means that CS logic is much more resistant against process variations than the traditional CCIS logic which improves considerably the manufacturing yield. This means also that CS logic has a much longer life time and it is much more tolerant to radiation induced soft and hard failures than traditional CCIS logic meaning that CS logic is particularly well suited for high radiation environments like space.

Another big benefit of the CS logic when compared to traditional CCIS logic is that the temperature required to form a high quality CIS stack may be considerably higher than the temperature required to anneal the implantation damage and to activate the implanted dopant atoms, which is the case e.g. in silicon with respect to poly-silicon silicon-dioxide silicon CIS stack. Thus in such a case the removal of the CIS stack processing from the manufacturing process enables the thermal budget of the manufacturing to be considerably reduced. This means that doped regions that would have to be implanted before the CIS stack manufacturing would diffuse considerably less in case the CIS stack manufacturing is omitted. The smaller diffusion of doped regions results in better control over the process variations in the manufacturing process improving further the yield and facilitating also transistor scaling. Yet another advantage is that the lack of the CIS stack manufacturing steps simplifies and eases manufacturing which compensates along the improved yield at least to some degree the cost of the larger chip area that is required in the CS logic when compared to traditional CCIS logic.

A mandatory requirement for traditional CCIS logic to work is that an inversion layer of mobile minority charge carriers can be established at the Semiconductor Insulator (SI) interface beneath the external gate corresponding to the CIS stack. In order to enable the formation of the inversion layer a high quality SI interface is required. Many semiconductor materials lack, however, a high quality interface and thus the interface is often pinned at a certain potential preventing the formation of the inversion layer meaning that such semiconductor materials are not suited for traditional CCIS logic. Therefore only a few semiconductor materials like e.g. Silicon, Silicon Germanium, Silicon Carbide, and Silicon Carbide Germanium are well suited for traditional CCIS logic. Yet another great benefit of the CS logic is that a high quality interface is not required meaning that CS logic can be established virtually in any semiconductor material.

It should be noted that it is also possible to construct the clamping resistant semiconductor logic element or the short circuit current mitigating semiconductor logic element in such a manner that the first source potential corresponds to first input logic potential and that the first output logic potential is shifted with respect to the first input logic potential towards the second input logic potential. For example, one could construct a silicon based clamping resistant semiconductor logic element according to FIGS. 3 and 4 wherein first conductivity type corresponds to p type and second conductivity type corresponds to n type,
the first source potential is −4 V,
the first channel depth at channel pinch-off is 4.5 V,
the second channel depth at channel pinch-off is 5 V,
the first input logic potential correspond to 0 V,
second input logic potential corresponds to 3 V, and
the second source is biased at first output logic potential corresponding to 2.5 V.

In this manner it is actually possible to establish a clamping resistant semiconductor logic element wherein the channel depth at channel pinch-off in the second FET is larger than the channel depth at channel pinch-off in the first FET. If the second channel depth at channel pinch-off were 4.5 V, the first output logic potential were 2 V, and the rest would remain the same one could establish a clamping resistant semiconductor logic element wherein the first and second channel depths at channel pinch-off would be the same.

Figure 11:
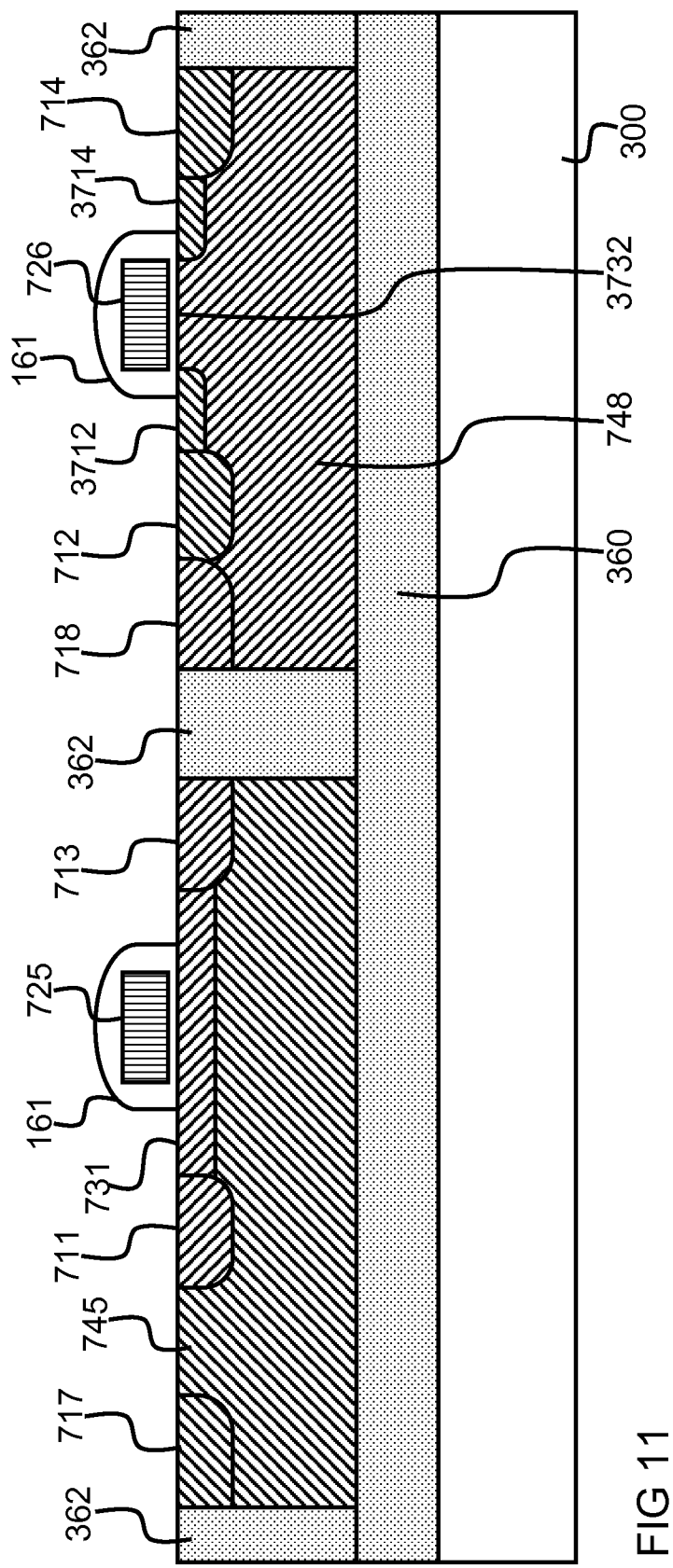
FIG. 11 illustrates a schematic cross-section of a semiconductor logic element.
Figure 12:
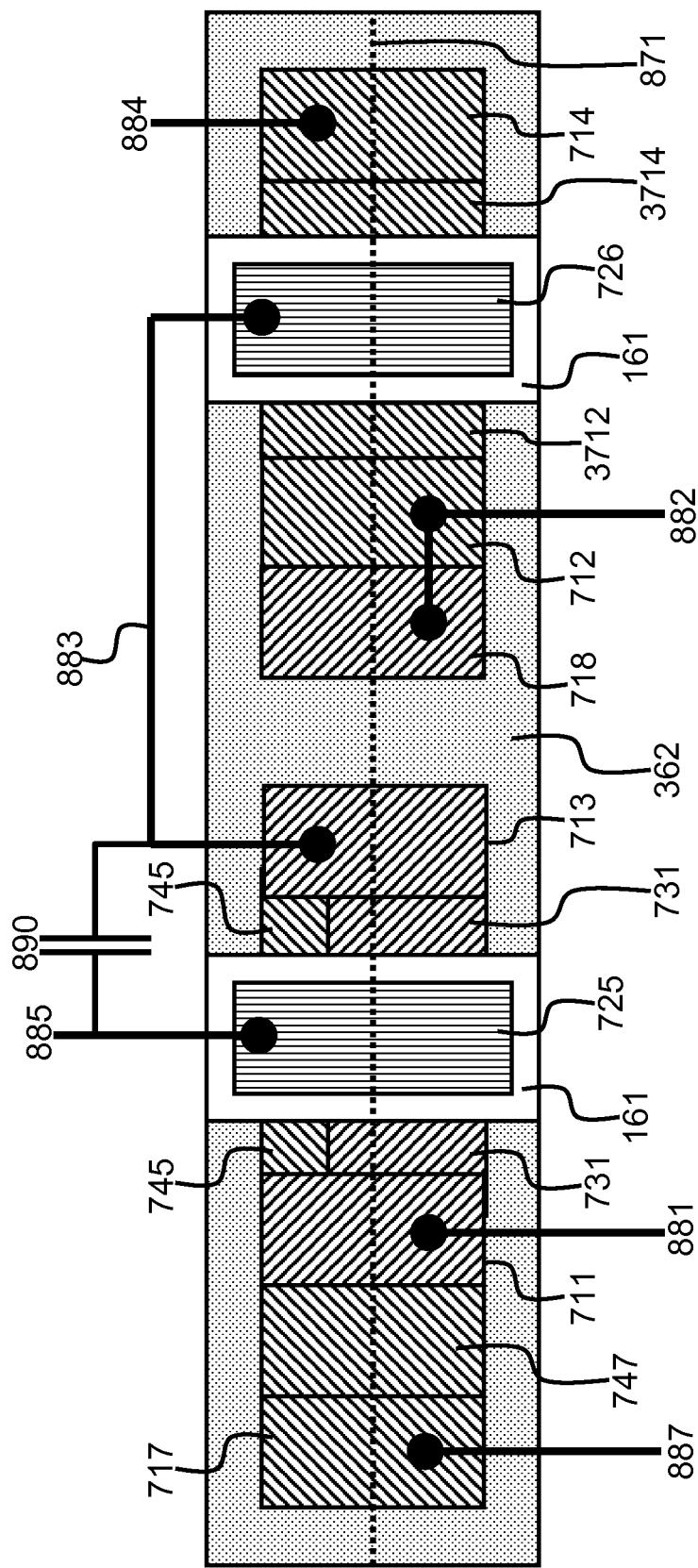
FIG. 12 illustrates the schematic layout of the semiconductor logic element according to FIG. 11.

FIGS. 11 and 12 illustrate a semiconductor logic element comprising two opposite type lateral CISFETs wherein the first FET on the left hand side corresponds to a lateral buried channel depletion mode CISFET wherein the external gate corresponds to the first gate node (i.e. input) and wherein there is a first auxiliary gate node. The second FET on the right hand side corresponds to a lateral enhancement mode surface channel CISFET wherein the external gate corresponds to the second gate and wherein the auxiliary gate is electrically connected to the second source node. FIG. 12 corresponds to a schematic layout of the semiconductor logic element and the cross-section along the dashed line 871 corresponds to the schematic cross-section presented in FIG. 11. In FIGS. 11 and 12 it is illustrated regarding the first FET (wherein the first conductivity type first channel doping 731 is located in between the first conductivity type source doping 711 and the first conductivity type drain doping 713) that the first source 711 and the first drain 713 can be placed further away from the external gate 725 in order to increase the voltage handling capacity of a buried channel FET and in order to reduce the overall capacitance of the input node. In FIGS. 11 and 12 it is also illustrated regarding the second FET that a lower doped source extension doping 3712 and a lower doped drain extension doping 3714 can be deployed in order to increase the voltage handling capacity of a surface channel FET and/or in order to lower the second gate to second source/drain capacitance. The voltage handling capacity of a surface channel FET can be also increased by incorporating halo implants in to the back-gate doping the halo implants being of the same conductivity type as the back-gate doping but the halo implants are not illustrated in FIG. 11 although they would be beneficially utilized.

In FIG. 11 the second FET comprises a surface channel 3732 located in between the second source (comprising the source extension doping 3712) and the drain (comprising the drain extension doping 3714) and corresponding to the second channel, an external gate 726 corresponding to the second gate, and an additional second auxiliary gate. The second auxiliary gate comprises a first conductivity type back-gate doping 748 and a first conductivity type contact doping 718. The second auxiliary gate is electrically coupled to the second source node 882 that comprises also the second conductivity type second source doping 712 corresponding to the second source. The internal node comprises the second gate, the first conductivity type first drain doping 713, and associated wiring 883. The input comprises the first gate and associated wiring 885. Between the internal node and the input there is an optional 'drag-along' plate capacitor 890. The first source node comprises the first conductivity type first source doping 711 and associated wiring 881. The second source node comprises the second conductivity type second source doping 712 and associated wiring 882. The input corresponds to the second conductivity type second drain doping 714. The fact that the second auxiliary gate is electrically connected to the second auxiliary gate means the semiconductor logic element according to FIGS. 11 and 12 is unidirectional and not bidirectional.

The semiconductor logic element of FIGS. 11 and 12 can be operated e.g. according to a semiconductor logic element corresponding to PCT/FI2016/050014 or according to a short circuit current mitigating semiconductor logic element. In both cases during operation the first source node is coupled to first source potential, the second source node is coupled to the first output logic potential, the first auxiliary gate node is coupled to a suitable auxiliary gate node potential, and the input is coupled either to first input logic potential or to second input logic potential. When the input is connected to first input logic potential the first channel (corresponding to the first channel doping 731) will be conductive and the internal node is set to first source potential rendering the second channel (corresponding to the second channel 3732) nonconductive and thus the output may be either at first output logic potential or at second output logic potential, i.e. the input has no control of the potential level of the output. On the other hand, when the input is connected to second input logic potential the first channel will be nonconductive enabling the internal node to settle to a potential rendering the second channel conductive and thus forcing the output to first output logic potential.

Figure 13C:
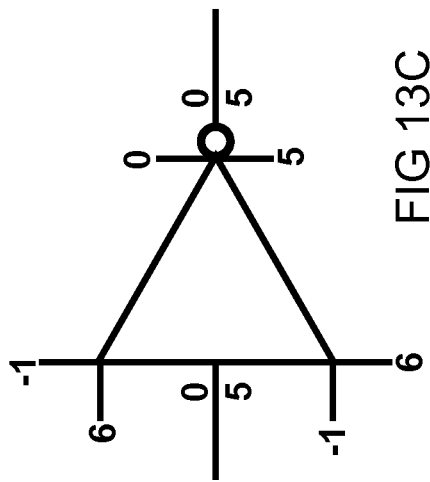
FIG. 13C illustrates an inverter configuration according to FIGS. 13A and 13B.
Figure 13F:
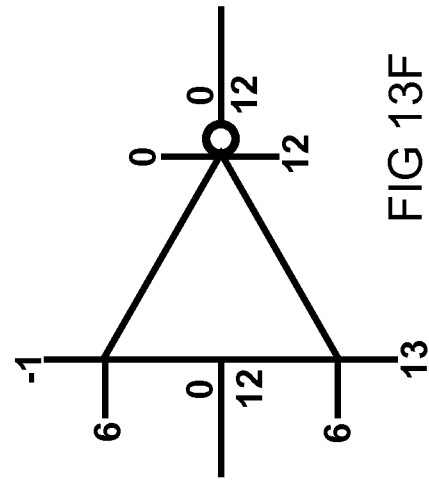
FIG. 13F illustrates an inverter configuration according to FIGS. 13D and 13E.
Figure 13B:
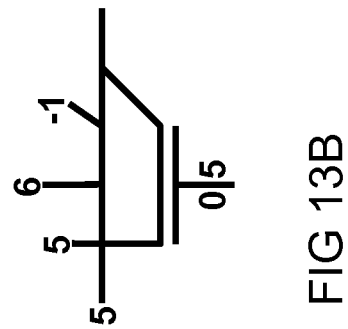
FIG. 13B illustrates a possible biasing configuration of another semiconductor logic element corresponding to FIGS. 11 and 12.
Figure 13E:
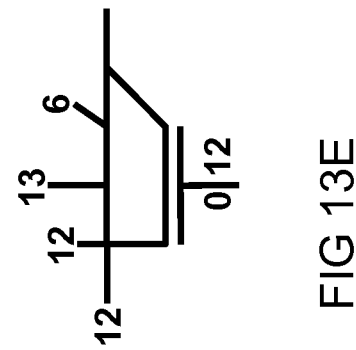
FIG. 13E illustrates a possible biasing configuration of another semiconductor logic element corresponding to FIGS. 11 and 12.
Figure 13A:
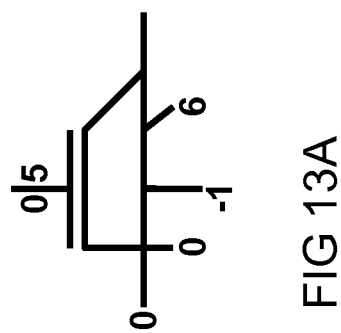
FIG. 13A illustrates a possible biasing configuration of a semiconductor logic element corresponding to FIGS. 11 and 12.

In case the semiconductor logic element of FIGS. 11 and 12 corresponds to PCT/FI2016/050014 then the first auxiliary gate node is coupled to a sufficiently large reverse bias with respect to the first source node so that first auxiliary gate induced clamping of the internal node is not realized when the input is at second input logic potential. Examples of such a configuration are illustrated by FIGS. 13A and 13B corresponding to semiconductor logic elements that are complementary to each others. It should be noted that the semiconductor logic elements of FIGS. 13A and 13B can be joined together as an inverter as presented in FIG. 13C. In FIGS. 13A, 13B and 13C a marking convention according to PCT/FI2016/050014 is utilized.

Figure 13D:
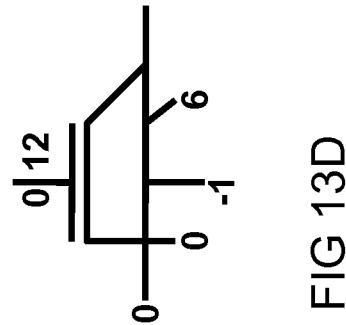
FIG. 13D illustrates a possible biasing configuration of a semiconductor logic element corresponding to FIGS. 11 and 12.

In case the semiconductor logic element of FIGS. 11 and 12 corresponds to a short circuit current mitigating semiconductor logic element then the first auxiliary gate is biased such that first auxiliary gate induced clamping is realized when the input is at second input logic potential. Examples of such a configuration are illustrated by FIGS. 13D and 13E corresponding to semiconductor logic elements that are complementary to each others. It should be noted that the semiconductor logic elements of FIGS. 13D and 13E can be joined together as an inverter as presented in FIG. 13F. In FIGS. 13D, 13E and 13F a marking convention according to PCT/FI2016/050014 is utilized. In the semiconductor logic element of FIGS. 11 and 12 there is clearly a conductive path between the first auxiliary gate and a location situated inside the semiconductor material at the semiconductor interface above the first channel doping 731 and directly underneath the external gate 725 corresponding to the first gate—this can be deduced from the fact that the back-gate doping 745 is visible in FIG. 12. In the examples of FIGS. 13D, 13E and 13F the first auxiliary gate node is biased at 6 V. The channel depth of the first channel could be e.g. 4.5 V when the first auxiliary gate induced clamping takes place (i.e. a layer of second conductivity type mobile charge carriers is formed directly underneath the first gate) whereas the first channel would be conductive when the input (i.e. the first gate) were at first input logic potential. If it is assumed that the barrier for the first conductivity mobile charge carriers from the first drain over the depleted first channel to the first source were roughly 0.5 V in room temperature then the potential swing on the internal node were roughly 2 V. Furthermore, when the input were at second input logic potential the second gate would be roughly 1 V reverse biased with respect to the second source. This means that the gate insulator layer in the second FET should be very thin which is possible if the second drain region is properly designed (e.g. the doping of the drain extension doping 3714 could be relatively small or it could be removed completely). Both the inverter arrangements in FIGS. 13C and 13F correspond to MSCL.

Figure 14:
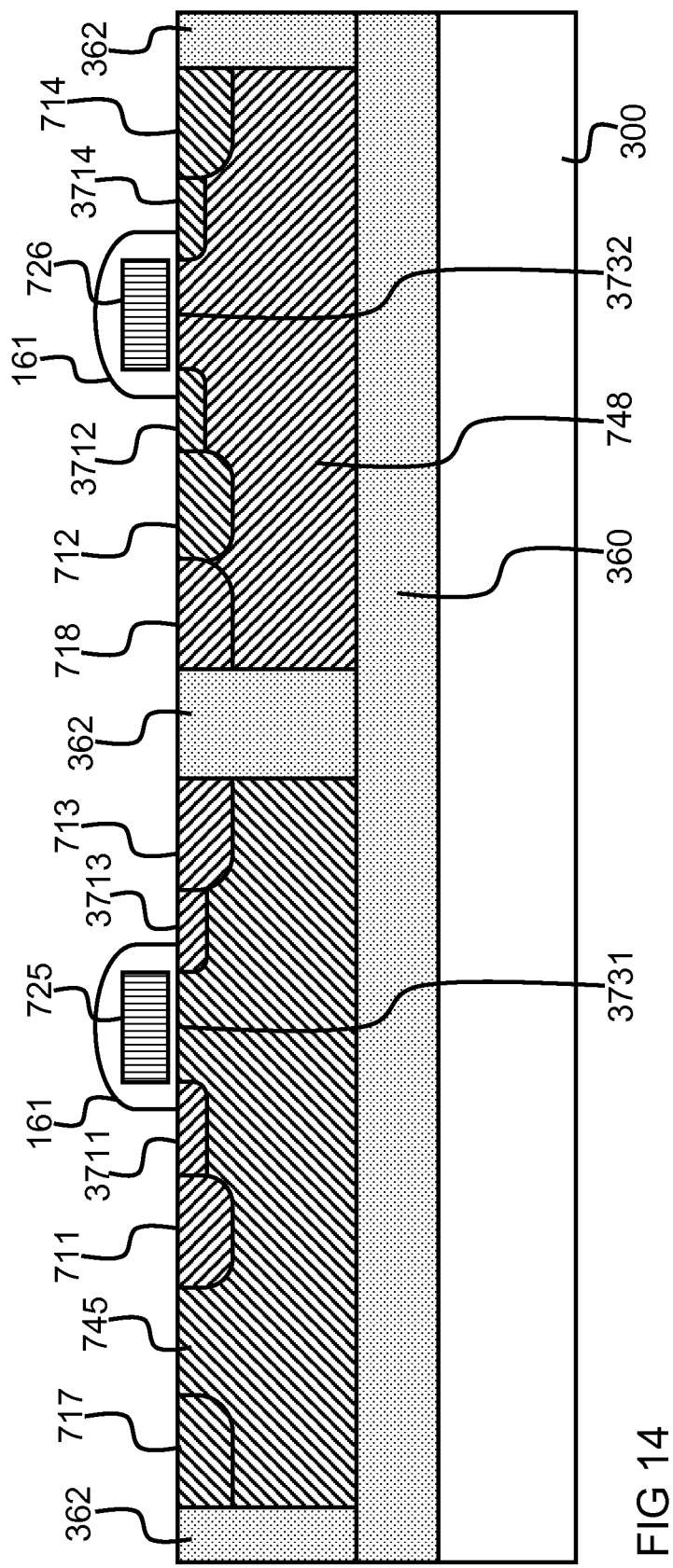
FIG. 14 illustrates a schematic cross-section of a semiconductor logic element.
Figure 15:
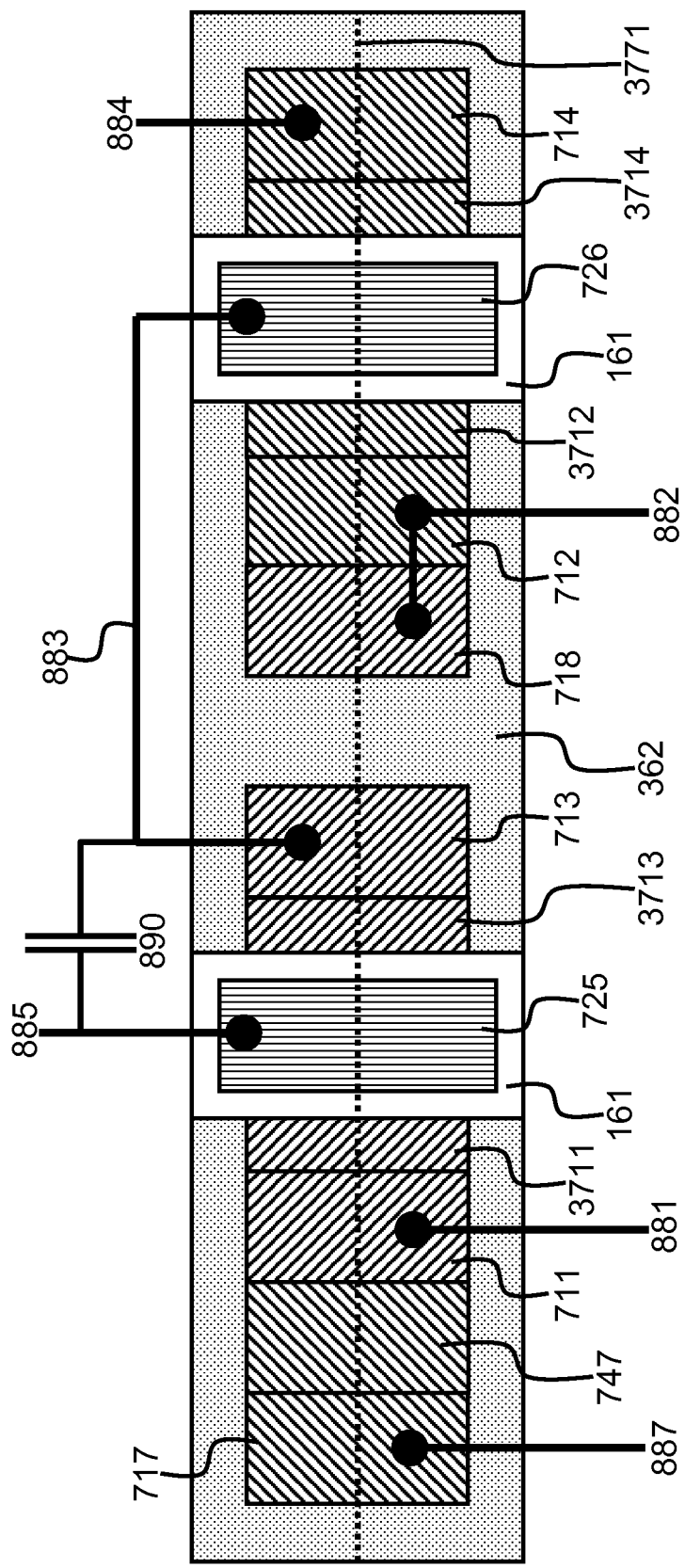
FIG. 15 illustrates the schematic layout of the semiconductor logic element according to FIG. 14.

The semiconductor logic element illustrated in FIGS. 14 and 15 is otherwise exactly the same than the semiconductor logic element of FIGS. 11 and 12 except that the first FET on the left is a surface channel enhancement mode CISFET wherein there is a first source extension doping 3711 and a first drain extension doping 3713 and wherein there is a surface channel 3731 instead of a first conductivity type first channel doping. FIG. 15 corresponds to a schematic layout of the semiconductor logic element and the cross-section along the dashed line 3771 corresponds to the schematic cross-section presented in FIG. 14. In a similar manner than the semiconductor logic element illustrated in FIGS. 11 and 12 the semiconductor logic element illustrated in FIGS. 14 and 15 can be operated e.g. according to a semiconductor logic element corresponding to PCT/FI2016/050014 or according to a short circuit current mitigating semiconductor logic element.

Figure 16C:
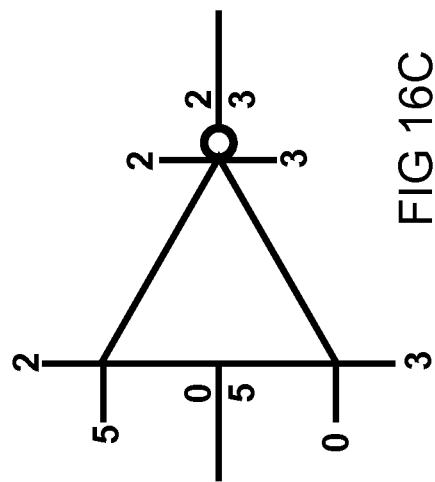
FIG. 16C illustrates an inverter configuration according to FIGS. 16A and 16B.
Figure 16F:
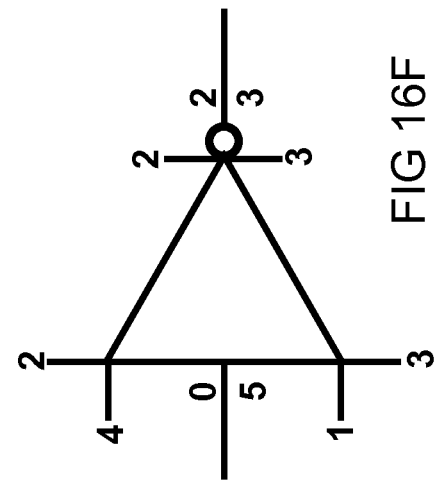
FIG. 16F illustrates an inverter configuration according to FIGS. 16D and 16E.
Figure 16B:
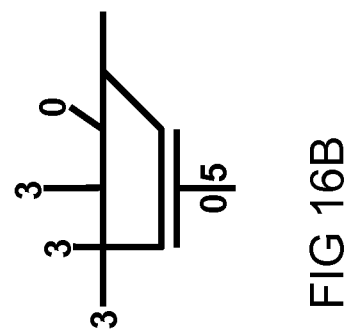
FIG. 16B illustrates a possible biasing configuration of another semiconductor logic element corresponding to FIGS. 14 and 15.
Figure 16E:
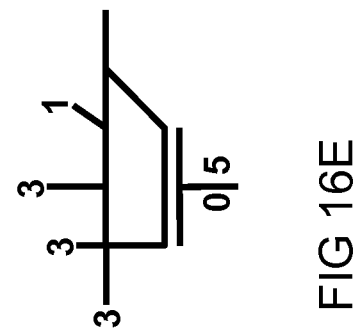
FIG. 16E illustrates a possible biasing configuration of another semiconductor logic element corresponding to FIGS. 14 and 15.
Figure 16A:
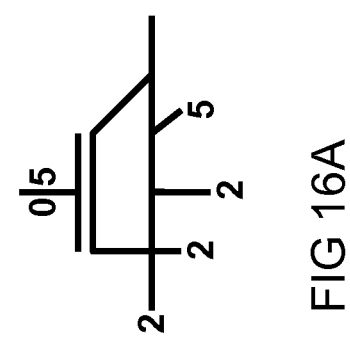
FIG. 16A illustrates a possible biasing configuration of a semiconductor logic element corresponding to FIGS. 14 and 15.

In case the semiconductor logic element of FIGS. 14 and 15 corresponds to PCT/FI2016/050014 then the first auxiliary gate node is coupled to a sufficiently large reverse bias with respect to the first source node so that first auxiliary gate induced clamping of the internal node is not realized when the input is at second input logic potential. Examples of such a configuration are illustrated by FIGS. 16A and 16B corresponding to semiconductor logic elements that are complementary to each others. In both cases according to FIGS. 16A and 16B the potential swing on the internal node between the states when input is at first input logic potential and at second input logic potential is roughly 3 V. It should be noted that the semiconductor logic elements of FIGS. 16A and 16B can be joined together as an inverter as presented in FIG. 16C. In FIGS. 16A, 16B and 16C a marking convention according to PCT/FI2016/050014 is utilized.

Figure 16D:
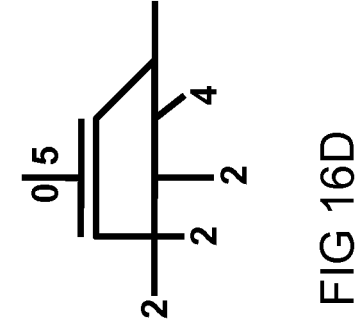
FIG. 16D illustrates a possible biasing configuration of a semiconductor logic element corresponding to FIGS. 14 and 15.

In case the semiconductor logic element of FIGS. 14 and 15 corresponds to a short circuit current mitigating semiconductor logic element then the first auxiliary gate is biased such that first auxiliary gate induced clamping is realized when the input is at second input logic potential. Examples of such a configuration are illustrated by FIGS. 16D and 16E corresponding to semiconductor logic elements that are complementary to each others. It should be noted that the semiconductor logic elements of FIGS. 16D and 16E can be joined together as an inverter as presented in FIG. 16F. In FIGS. 16D, 16E and 16F a marking convention according to PCT/FI2016/050014 is utilized. In the semiconductor logic element corresponding to FIG. 16D the first auxiliary gate node is biased at 4 V meaning that the internal node is clamped at roughly 4 V when the input is at second input logic potential (5 V). In the semiconductor logic element corresponding to FIG. 16E the first auxiliary gate node is biased at 1 V meaning that the internal node is clamped at roughly 1 V when the input is at second input logic potential (0 V). In both cases according to FIGS. 16D and 16E the potential swing on the internal node between the states when input is at first input logic potential and at second input logic potential is roughly 2 V. Neither one of the inverter arrangements in FIGS. 16C and 16F correspond to MSCL.

For the sake of readability it is hereby repeated that a gate that is reverse biased when compared to the source refers to a potential difference between the source and the gate that corresponds to a less conductive channel than when the source and gate are at the same potential. A gate that is forward biased when compared to the source refers to a potential difference between the source and the gate that corresponds to a more conductive channel than when the source and gate are at the same potential. The depletion mode FET means that the channel is conductive when the source and gate are at the same potential and that above a certain gate to source reverse bias the channel is nonconductive. In an enhancement mode FET the channel is nonconductive when the gate and the source are at the same potential and above a certain gate to source forward bias the channel is conductive. It should be also noted that in low power logic the preferred way to realize an enhancement mode FET is to utilize a CISFET configuration wherein the gate node corresponds to the external gate since in this manner the gate can be forward biased with respect to the source without generating a current flow between the gate and source nodes.

In the semiconductor logic element one can also utilize the definition that when the first gate is at the second input logic potential it is more reverse (or less forward) biased with respect to the first source than when the first gate is biased at first input logic potential. Similarly one can say that the first source potential on the second gate is more reverse (less forward) biased with respect to the second source biased at first output logic potential than if the second gate were biased at first output logic potential. If in the semiconductor logic element the first FET is an enhancement mode CISFET then the input corresponds preferably to the first external gate.

It is actually also possible to operate semiconductor logic elements according to PCT/FI2016/050014, clamping resistant semiconductor logic elements, and short circuit mitigating semiconductor logic elements, in a manner that the potential on the first source is set so much more reverse biased with respect to the first gate that the first channel is nonconductive in both cases when the input is at first input logic potential and when the input is at second logic potential. In this case afore described semiconductor logic element correspond to input capacitance minimizing semiconductor logic elements. When the input is at first input logic potential the internal node adjusts to a potential corresponding to a thermal equilibrium similarly as in the case when the input is at second input logic potential.

Furthermore, it is possible to operate complementary semiconductor logic elements according to PCT/FI2016/050014, clamping resistant complementary semiconductor logic elements, and short circuit mitigating complementary semiconductor logic elements, in a manner that the potential on the complementary first source is set so much more reverse biased with respect to the complementary first gate that the complementary first channel is nonconductive in both cases when the complementary input is at complementary first input logic potential and when the complementary input is at complementary second input logic potential. In this case afore described complementary semiconductor logic element correspond to input capacitance minimizing complementary semiconductor logic elements. When the input is at complementary first input logic potential the complementary internal node adjusts to a potential corresponding to a thermal equilibrium similarly as in the case when the complementary input is at complementary second input logic potential.

Moreover it is beneficial in input capacitance minimizing semiconductor logic elements, in semiconductor logic elements according to PCT/FI2016/050014, in clamping resistant semiconductor logic elements, and in short circuit mitigating semiconductor logic elements, to utilize an optional 'drag along' plate capacitor in between the input and the internal node. In addition, it is beneficial in input capacitance minimizing complementary semiconductor logic elements, in complementary semiconductor logic elements according to PCT/FI2016/050014, in clamping resistant complementary semiconductor logic elements, and in short circuit mitigating complementary semiconductor logic elements to utilize an optional 'drag along' plate capacitor in between the (complementary) input and the (complementary) internal node.

The benefit of the input capacitance minimizing semiconductor logic element and of the input capacitance minimizing complementary semiconductor logic element is that the input capacitance (the complementary input capacitance is also referred to as input capacitance) can be reduced which reduces also the current running in the input node during switching. This fact decreases the switching related power consumption and increases thus also the battery life which is very important for mobile and IoT applications.

It should be noted that in a novel inverter it is possible to utilize one semiconductor logic element of the following list:

semiconductor logic element according to PCT/FI2016/050014, clamping resistant semiconductor logic element, short circuit mitigating semiconductor logic element, input capacitance minimizing semiconductor logic element, in conjunction with one suitable complementary semiconductor logic element of the following list:

complementary semiconductor logic element according to PCT/FI2016/050014, clamping resistant complementary semiconductor logic element, short circuit mitigating complementary semiconductor logic elements, input capacitance minimizing complementary semiconductor logic element, traditional complementary semiconductor logic element.

The term inverter should also be understood broadly as a binary logic level device wherein there is at least one input node and at least one output node that are connected to other binary logic level devices, wherein a first input logic potential at the input provides a second output logic potential at the output, and wherein a second input logic potential at the input provides a first output logic potential at the output, i.e. an inverter may comprise multiple logic elements providing also additional functionalities other than the inverter functionality. Particularly the inverter could correspond to a NAND or NOR element which have been down converted to inventors. In order to test whether a binary logic level device corresponds to an inverter one can remove all the other input/output nodes of the binary logic level device except two nodes, remove all the other logic elements in the binary logic level device except two logic elements, and check whether a first input logic potential at first node provides a second output logic potential at the second node, and whether a second input logic potential at the first node provides a first output logic potential at the second output.

It is important to note that a channel is always located in between a source and drain, that the gate insulator material between the semiconductor material and the gate could be replaced by vacuum or by a gas (particularly whenever it is beneficial to utilize low k insulators), that in all the invented semiconductor logic elements the first source is biased at first source potential and that the in all the invented complementary semiconductor logic elements the complementary first source is biased at complementary first source potential. It should be noted also that the biasing in the given examples are well suited for silicon but may not necessarily work for other semiconductor materials. In all of the embodiments of the invention it is possible to utilize band-gap engineering e.g. in order to create High Electron Mobility Transistors (HEMTs) that are based on CISFET, CSFET, or JFET. In addition it is possible to utilize the embodiments that are based on polycrystalline or amorphous semiconductor material for example as Thin Film Transistors (TFTs) to be utilized e.g. in displays. In addition the invented semiconductor logic elements and the invented complementary semiconductor logic elements could also be based e.g. on graphene, carbon nano tubes, and $MoS_2$ (particularly when in two dimensional form like graphene). Yet another important observation is that with the help of the invented semiconductor logic element and/or the invented complementary semiconductor logic element it is possible to reduce power consumption when compared to traditional CCIS logic since it is possible to avoid leakage through the channel and through the gate insulator material.

One could actually also utilize four different type transistors for the first FET, second FETs, complementary first FET, and complementary second FET; it is even possible to utilize a different semiconductor material for each of the four FETs. As already previously said in a semiconductor logic element embodiment according to the invention may comprise different types of transistors as the first FET and second FET. Similarly the first FET and the second FET in the complementary semiconductor logic element embodiment according to the invention may comprise two more different types of transistors. For example one could use a first type lateral JFET, a second type surface channel CISFET, second type perpendicular JFET, and first type buried channel CISFET. The four different transistors could be also formed of one, two, three, or four different types of semiconductor materials. One could also use different gate insulator layers corresponding to different thicknesses in each CISFET. One could even utilize more than four different transistors in order to form different types of semiconductor logic elements and/or of complementary semiconductor logic elements to be utilized at different parts of the chip in order to optimize the performance of the chip. In addition, as it was already previously explained one can also have multiple first FETs and/or multiple second FETs in a semiconductor logic element and all of these could be made of different kinds of FETs and/or of different kind of semiconductor material. Besides, instead of having only one gate and/or auxiliary gate one could also have multiple independent gates and/or multiple independent auxiliary gates belonging to the first FET and/or to the second FET in case the gates and/or auxiliary gates are of external gate type corresponding to a CIS stack or to a Schottky gate (corresponding to Conductor Semiconductor (CS) stack).

Instead of using a SOI layer it is also possible to provide isolation for the different FETs by utilizing suitable wells as it is described in the document PCT/FI2016/050014. Furthermore, if the FETs are made of different semiconductor materials one could use a wafer comprising as many stacked layers of semiconductor materials (possibly isolated by SOI layers) as there are FETs made of different semiconductor materials. Particularly, there could be altogether 4 different stacked layers of different semiconductor materials. Furthermore, one could utilize any kind of charge pumps in the corresponding chips to create suitable voltages. Particularly one could utilize Dickson charge pumps comprising enhancement mode junction field effect transistors.

In the particular case wherein the second FET of the invented semiconductor logic element comprises multiple independent CIS gates that are connected to the first drains of independent first FETs the multiple independent inputs of the first FETs need to be at second input logic potentials in order to turn the second channel conductive, i.e. in order to have the output biased at the first output logic potential. In this arrangement the multiple independent gates of the second FET are not clamped at first output logic potential and it has the benefits that it provides fast switching speed, that it requires less area, and that it can be exploited e.g. in the part of NAND (or NOR) configuration wherein semiconductor logic elements are connected in series. Furthermore, in case the invented complementary semiconductor logic element comprises multiple independent first FETs having first drains connected to the second gate of a single second FET this arrangement could be exploited in the part of the NAND (or NOR) configuration wherein complementary semiconductor logic elements are connected in parallel in order save area. If this arrangement is properly designed the reduction in switching speed should be marginal and especially so in case of two logic gate NAND (or NOR) cell. In afore described manner only 6 transistors are required to for a two logic gate NAND (or NOR) cell corresponding to the invented modified CCIS logic of the second kind. In a similar manner one can reduce the amount of transistors e.g. in a AND, OR, NOR, XOR, XNOR, and Static Random Access Memory (SRAM) cells.

In stead of the term perpendicular JFET that is utilized in this text one could have also used the term vertical JFET. Beside the lateral CISFET it is naturally also possible to utilize perpendicular(/vertical) CISFETs like the ones utilized in Insulated Gate Bipolar Transistors (IGBTs) wherein the channel current runs also in the perpendicular(/vertical) direction. Other possibility would be to utilize a CISFET wherein the gate is located inside a trench so that the channel current runs in the perpendicular (/vertical) direction. In such embodiments the drain could be located at the same surface or on the surface on the opposite side. In a similar manner the drain of a perpendicular(/vertical) JFET could be also located on a surface that is on the opposite side when compared to the surface comprising the source. There could be also wiring on both surfaces.

Another benefit of the invented semiconductor logic element is small power consumption at idle since channel leakage can be avoided and thus leakage current is only generated from reverse biased pn junctions. It should be also noted that highly doped semiconductor material in the CIS gate (like e.g. strongly doped poly-silicon) is also referred to as conductor.

The contact dopings according to different embodiments are actually not necessary in case no wiring is used or in case the Fermi levels of the wiring and of the semiconductor material of the corresponding conductivity type to which the contact is made are appropriate. It would be also possible to replace the CIS stacks corresponding to external gates with Schottky gates (i.e. the CIS stack would be replaced by a CS stack). The insulator trenches or even the SOI layer could incorporate metal in order to reduce capacitive coupling between different FETs (e.g. between different semiconductor logic elements and/or between the first FET and second FET of the same semiconductor logic element). One could also pack many first FETs or second FETs to the same well dopings (like to isolation wells) when possible in order to save area. Similarly one could fuse together different parts belonging to different semiconductor logic elements and/or complementary semiconductor logic elements when possible in order to save area. In case the first drain and the second gate are electrically fused together inside the semiconductor material they may not have to be part of a similarly doped region but they could be also electrically fused together through side by side positioned n+p+n+ or p+n+p+ junctions. One can also omit the wiring in a node in case other means of biasing is provided—e.g. one could bias a source, drain, or gate of the first FET or second FET through the semiconductor substrate. Thus in the figures illustrating and in the text describing an embodiment of the invention all the wirings could be omitted if afore said other biasing means are provided.

It is important to note also that in the invented semiconductor logic element the second source belonging to the second FET must not always be biased at first output logic potential. However, at a certain time point in a complementary logic circuitry comprising previously described invented semiconductor logic elements there must be at least one invented semiconductor logic element wherein the second source is biased at first output logic potential. Thus although in figures illustrating and/or text describing the case wherein the second source of the invented semiconductor logic element is connected to first output logic potential it could be very well that at another point of time or in another semiconductor logic element the second source is not connected to the first output logic potential. Besides the invented semiconductor logic element can be also designed to be bidirectional so that the function of the second source and the second drain can be interchanged during the operation of the invented complementary logic circuitry. Yet another point is that the first source of the first FET may not be always connected to the first source potential for example if there are multiple first FETs that are connected in series in the invented semiconductor logic element.

The term configured to be coupled means that at a certain moment the device may not be coupled to a power source but when it is the nodes are coupled at least during a certain time point to the specific potentials described by the term configured to be coupled. Besides in case the same numbering is utilized for a certain object illustrated in different figures corresponding to different embodiments of the invention the object and/or the function of this certain object may not be repeatedly explained but instead the explanation can be read from the embodiment wherein the function of the object is described for the first time in the text.

A major benefit of the semiconductor logic elements and complementary semiconductor logic elements corresponding to the invention is that a single defect cannot establish a permanent conductive path between the first gate node as well as the second source node and/or second drain node due to the fact that in between them there is the internal node. By providing better defect isolation so that a defect is less likely to result in a permanent conductive path between two logic lines means that the damage caused by a defect is easier to isolate, that countermeasures against defects are easier to design, and that complete device breakage is less likely resulted in.

The purpose of the invention is to replace at least part of the semiconductor logic elements of the traditional CCIS logic with invented semiconductor logic elements and/or to replace at least part of the complementary semiconductor logic elements in the traditional CCIS logic with invented complementary semiconductor logic elements in order to improve tolerance against defects. An alternative purpose of the invention is to replace at least part of the semiconductor logic elements of the traditional CCIS logic with invented semiconductor logic elements according and to replace at least part of the complementary semiconductor logic elements in the traditional CCIS logic with invented complementary semiconductor logic elements in order to provide novel semiconductor logic having comparable power consumption and better defect isolation than traditional CCIS logic. Yet another purpose of the invention is to provide novel semiconductor logic enabling the application of multiple logic level pairs for example in mixed mode chips, power electronics, Micro Electro Mechanical Systems (MEMS), memory chips like SRAM and Dynamic RAM (DRAM) chips, and/or sensors and detectors. In radiation detectors one could for example provide interconnected logic that is situated in side several drift rings.

Finally invented semiconductor logic elements can be utilized for replacing traditional n type surface channel CISFET semiconductor logic elements with invented semiconductor logic elements in germanium based logic circuitries since functioning n type surface channel CISFETs have been very difficult to realize in germanium due to surface pinning. The benefit of complementary logic based on germanium over silicon is that one could reach with germanium much higher operation speeds than with silicon.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A first semiconductor logic element comprising a field effect transistor of a first conductivity type hereinafter referred to as a first FET of the first semiconductor logic element and a field effect transistor of a second conductivity type hereinafter referred to as a second FET of the first semiconductor logic element;

wherein the first semiconductor logic element comprises an internal node of the first semiconductor logic element wherein the internal node of the first semiconductor logic element is at least partly formed with a drain of the first FET of the first semiconductor logic element and a gate of the second FET of the first semiconductor logic element, wherein a gate of the first FET of the first semiconductor logic element is hereinafter referred to as an input of the first semiconductor logic element, wherein the input of the first semiconductor logic element is configured to be coupled either to a first input logic potential of the first semiconductor logic element or to a second input logic potential of the first semiconductor logic element, wherein a drain of the second FET of the first semiconductor logic element is referred to as an output of the first semiconductor logic element, wherein a source of the second FET of the first semiconductor logic element is the source of the first semiconductor logic element, wherein the first semiconductor logic element is configured so that when a source of the first FET of the first semiconductor logic element is arranged at a first source potential of the first logic element and when the source of the second FET of the first semiconductor logic element is at a first output logic potential of the first semiconductor logic element and when the input of the first semiconductor logic element is at the first input logic potential of the first semiconductor logic element, a nonconductive channel is established between the source of the first FET of the first semiconductor logic element and the drain of the first FET of the first semiconductor logic element adjusting the internal node of the first semiconductor logic element to a potential causing a channel between the source of the second FET of the first semiconductor logic element and the drain of the second FET of the first semiconductor logic element to be in a nonconductive state thus enabling the output of the first semiconductor logic element to be either at the first output logic potential of the first semiconductor logic element or at a second output logic potential of the first semiconductor logic element, and wherein the first semiconductor logic element is further configured so that when the source of the first FET of the first semiconductor logic element is arranged at the first source potential of the first semiconductor logic element and when the source of the second FET of the first semiconductor logic element is at the first output logic potential of the first semiconductor logic element and when the input of the first semiconductor logic element is at the second input logic potential of the first semiconductor logic element, the channel between the source of the first FET of the first semiconductor logic element and the drain of the first FET of the first semiconductor logic element is arranged to be in a nonconductive state enabling the internal node of the first semiconductor logic element to adjust to a potential establishing a conductive channel comprising mobile second conductivity type charge carriers between the source of the second FET of the first semiconductor logic element and the drain of the second FET of the first semiconductor logic element thereby adjusting the output of the first semiconductor logic element to the first output logic potential of the first semiconductor logic element.

2. The first semiconductor logic element as claimed in claim 1, wherein the internal node of the first semiconductor logic element comprises one of the following: a single doped region acting both as first drain of the first semiconductor logic element and at least part of second gate of the first semiconductor logic element, a first drain doping of the first semiconductor logic element and a second gate of the first semiconductor logic element.

3. The first semiconductor logic element as claimed in claim 1, wherein at least one of the following: the first FET of the first semiconductor logic element, the second FET of the first semiconductor logic element is a depletion mode field effect transistor.

4. The first semiconductor logic element as claimed in claim 1 wherein at least one of the following: the first FET of the first semiconductor logic element, the second FET of the first semiconductor logic element is an enhancement mode field effect transistor.

5. The first semiconductor logic element as claimed in claim 1 wherein the first FET of the first semiconductor logic element is one of the following: a junction field effect transistor, a conductor insulator semiconductor field effect transistor, a conductor semiconductor field effect transistor.

6. The first semiconductor logic element as claimed in claim 1, wherein the second FET of the first semiconductor logic element is one of the following: a junction field effect transistor, a conductor insulator semiconductor field effect transistor, a conductor semiconductor field effect transistor.

7. The first semiconductor logic element as claimed in claim 3, wherein at least one of the following: the first FET of the first semiconductor logic element, the second FET of the first semiconductor logic element is a depletion mode conductor insulator semiconductor field effect transistor comprising an auxiliary gate corresponding to an external gate as well as a back-gate doping corresponding to the gate.

8. The first semiconductor logic element as claimed in claim 7, wherein
if the first FET of the first semiconductor logic element is a depletion mode conductor insulator semiconductor field effect transistor the auxiliary gate of the first FET of the first semiconductor logic element is configured to be biased so that a layer of mobile second conductivity type charge carriers is established at the insulator semiconductor interface beneath the external gate of the first FET of the first semiconductor logic element irrespective of whether the input of the first semiconductor logic element is biased at first input logic potential of the first semiconductor logic element or at second input logic potential of the first semiconductor logic element, and the said layer of mobile second conductivity type charge carriers acting as a part of the first gate of the first semiconductor logic element and controlling the first channel of the first semiconductor logic element from the opposite side than the second conductivity type back-gate doping, and
if the second FET of the first semiconductor logic element is a depletion mode conductor insulator semiconductor field effect transistor the auxiliary gate of the second FET of the first semiconductor logic element is configured to be biased so that a layer of mobile first conductivity type charge carriers is established at the insulator semiconductor interface beneath the external gate of the second FET of the first semiconductor logic element irrespective of whether the input is biased at first input logic potential of the first semiconductor logic element or at second input logic potential of the first semiconductor logic element, and the said layer of mobile first conductivity type charge carriers acting as a part of the second gate of the first semiconductor logic element and controlling the second channel of the first semiconductor logic element from the opposite side than the first conductivity type back-gate doping.

9. The first semiconductor logic element as claimed in claim 3, wherein
if comprising a depletion mode conductor insulator semiconductor field effect transistor then the gate comprises both an external gate as well as a back-gate doping,
if comprising a depletion mode conductor semiconductor field effect transistor then the gate comprises both an external Schottky gate as well as a back-gate doping, and
if comprising a depletion mode junction field effect transistor having a front-gate doping and a back-gate doping then the gate comprises both the front-gate doping and the back-gate doping.

10. The first semiconductor logic element as claimed in claim 3, wherein
if comprising a depletion mode conductor insulator semiconductor field effect transistor then the gate corresponds either to an external gate or to a back-gate doping and wherein the gate controls the channel only from the side where the gate is located,
if comprising a depletion mode conductor semiconductor field effect transistor then the gate corresponds either to an external Schottky gate or to a back-gate doping and wherein the gate controls the channel only from the side where the gate is located, and
if comprising a depletion mode junction field effect transistor having a front-gate doping and a back-gate doping then the gate corresponds either to the front-gate doping or to the back-gate doping and wherein the gate controls the channel only from the side where the gate is located.

11. The first semiconductor logic element as claimed in claim 5, wherein the second FET of the first semiconductor logic element is one of the following: a junction field effect transistor, a conductor insulator semiconductor field effect transistor, a conductor semiconductor field effect transistor, and
wherein the second FET of the first semiconductor logic element corresponds to an enhancement mode conductor insulator semiconductor field effect transistor wherein the gate of the second FET of the first semiconductor logic element corresponds to an external gate and the first FET of the first semiconductor logic element corresponds to one of the following: a depletion mode junction field effect transistor that comprises a gate confining the channel at least from two sides, a depletion mode conductor semiconductor field effect transistor wherein a gate corresponds to a Schottky gate and a back-gate doping, a depletion mode conductor insulator semiconductor field effect transistor that corresponds to one of the following:

an external gate corresponding to an auxiliary gate configured to be biased so that a layer of mobile second conductivity type charge carriers is established at the insulator semiconductor interface beneath the external gate of the first FET of the first semiconductor logic element irrespective of the fact whether the input of the first semiconductor logic element is biased at first input logic potential of the first semiconductor logic element or at second input logic potential of the first semiconductor logic element, and the said layer of mobile second conductivity type charge carriers acting as a part of the first gate of the first semiconductor logic element and controlling the first channel of the first semiconductor logic element from the opposite side than the second conductivity type back-gate doping, a gate corresponding to an external gate and a back-gate doping.

12. The first semiconductor logic element as claimed in claim 1, wherein the first conductivity type is p type and the second conductivity type is n type.

13. The first semiconductor logic element as claimed in claim 1, wherein the first conductivity type is n type and the second conductivity type is p type.

14. A logic circuitry comprising at least one first semiconductor logic element as claimed in claim 1 and at least one second semiconductor logic element;

the second semiconductor logic element comprising a field effect transistor of the second conductivity type hereinafter referred to as a first FET of the second semiconductor logic element and a field effect transistor of the first conductivity type hereinafter referred to as a second FET of the second semiconductor logic element;

wherein the second semiconductor logic element comprises an internal node of the second semiconductor logic element wherein the internal node of the second semiconductor logic element is at least partly formed with a drain of the first FET of the second semiconductor logic element and a gate of the second FET of the second semiconductor logic element, wherein a gate of the first FET of the second semiconductor logic element is hereinafter referred to as an input of the second semiconductor logic element, wherein the input of the second semiconductor logic element is configured to be coupled either to a first input logic potential of the second semiconductor logic element or to a second input logic potential of the second semiconductor logic element, wherein a drain of the second FET of the second semiconductor logic element is referred to as an output of the second semiconductor logic element, wherein a source of the second FET of the second semiconductor logic element is the source of the second semiconductor logic element, wherein the second semiconductor logic element is configured so that when a source of the first FET of the second semiconductor logic element is arranged at a first source potential of the second semiconductor logic element and when the source of the second FET of the second semiconductor logic element is at a first output logic potential of the second semiconductor logic element and when the input of the second semiconductor logic element is at the first input logic potential of the second semiconductor logic element, a conductive channel comprising mobile second conductivity type charge carriers is established between the source of the first FET of the second semiconductor logic element and the drain of the first FET of the second semiconductor logic element adjusting the internal node of the second semiconductor logic element to the first source potential of the second semiconductor logic element and thereby causing a channel between the source of the second FET of the second semiconductor logic element and the drain of the second FET of the second semiconductor logic element to be in a nonconductive state thus enabling the output of the second semiconductor logic element to be either at the first output logic potential of the second semiconductor logic element or at a second output logic potential of the second semiconductor logic element, and wherein the second semiconductor logic element is further configured so that when the source of the first FET of the second semiconductor logic element is arranged at the first source potential of the second semiconductor logic element and when the source of the second FET of the second semiconductor logic element is at the first output logic potential of the second semiconductor logic element and when the input of the second semiconductor logic element is at the second input logic potential of the second semiconductor logic element, the channel between the source of the first FET of the second semiconductor logic element and the drain of the first FET of the second semiconductor logic element is arranged to be in a nonconductive state enabling the internal node of the second semiconductor logic element to adjust to a potential establishing a conductive channel comprising mobile first conductivity type charge carriers between the source of the second FET of the second semiconductor logic element and the drain of the second FET of the second semiconductor logic element thereby adjusting the output of the second semiconductor logic element to the first output logic potential of the second semiconductor logic element.

15. A logic circuitry as claimed in claim 14 wherein the first input logic potential of the second semiconductor logic element corresponds to the second input logic potential of the first semiconductor logic element, the second input logic potential of the second semiconductor logic element corresponds to the first input logic potential of the first semiconductor logic element, the first output logic potential of the second semiconductor logic element corresponds to the second output logic potential of the first semiconductor logic element, and the second output logic potential of the second semiconductor logic element corresponds to the first output logic potential of the first semiconductor logic element.

16. The logic circuitry as claimed in claim 15, wherein the logic circuit is configured to operate as an inverter configuration as follows:

in the first semiconductor logic element the second source is connected to the first output logic potential of the first semiconductor logic element, in the second semiconductor logic element the second source is connected to the second output logic potential of the first semiconductor logic element, wherein the inputs of the first semiconductor logic element and the second semiconductor logic element are connected together as an input of the inverter configuration, the outputs of the first semiconductor logic element and the second semiconductor logic element are connected together as the output of the inverter configuration, and the input of the inverter configuration is configured to be coupled either to the first or the second input logic potential of the first semiconductor logic element wherein when the input of the inverter configuration is coupled to the first input logic potential of the first semiconductor logic element the output of the inverter configuration sets to the second output logic potential of the first semiconductor logic element, and when the input of the inverter configuration is coupled to the second input logic potential of the first semiconductor logic element the output of the inverter configuration sets to the first output logic potential of the first semiconductor logic element.

17. The logic circuitry as claimed in claim 15, wherein the first input logic potential of the first semiconductor logic element is the same as the first output logic potential of the first semiconductor logic element and the second input logic potential of the first semiconductor logic element is the same as the second output logic potential of the first semiconductor logic element.

18. A logic circuitry comprising at least one first semiconductor logic element as claimed in claim 1, wherein the first conductivity type is p type and the second conductivity type is n type, and at least one third semiconductor logic element corresponding to the first semiconductor logic element as claimed in claim 1, wherein the first conductivity type is n type and the second conductivity type is p type.

19. A logic circuitry comprising:

a first semiconductor logic element as claimed in claim 1, wherein the first conductivity type is p type and the second conductivity type is n type, and a third semiconductor logic element corresponding to the first semiconductor logic element as claimed in claim 1, wherein the first conductivity type is n type and the second conductivity type is p type, wherein the first input logic potential of the third semiconductor logic element corresponds to the second input logic potential of the first semiconductor logic element, the second input logic potential of the third semiconductor logic element corresponds to the first input logic potential of the first semiconductor logic element, the first output logic potential of the third semiconductor logic element corresponds to the second output logic potential of the first semiconductor logic element, and the second output logic potential of the third semiconductor logic element corresponds to the first output logic potential of the first semiconductor logic element.

20. The logic circuitry as claimed in claim 19, wherein the logic circuit is configured to operate as an inverter configuration as follows:

in the first semiconductor logic element the second source is connected to the first output logic potential of the first semiconductor logic element, in the third semiconductor logic element the second source is connected to the second output logic potential of the first semiconductor logic element, wherein the inputs of the first semiconductor logic element and the third semiconductor logic element are connected together as an input of the inverter configuration, the outputs of the first semiconductor logic element and the third semiconductor logic element are connected together as the output of the inverter configuration, and the input of the inverter configuration is configured to be coupled either to the first or the second input logic potential of the first semiconductor logic element wherein when the input of the inverter configuration is coupled to the first input logic potential of the first semiconductor logic element the output of the inverter configuration sets to the second output logic potential of the first semiconductor logic element, and when the input of the inverter configuration is coupled to the second input logic potential of the first semiconductor logic element the output of the inverter configuration sets to the first output logic potential of the first semiconductor logic element.

21. The logic circuitry as claimed in claim 19, wherein the first input logic potential of the first semiconductor logic element is the same as the first output logic potential of the first semiconductor logic element and the second input logic potential of the first semiconductor logic element is the same as the second output logic potential of the first semiconductor logic element.

22. A logic circuitry comprising at least one first semiconductor logic element as claimed in claim 1 and at least one complementary semiconductor logic element corresponding to a first conductivity type field effect transistor.

23. A logic circuitry comprising:

a first semiconductor logic element as claimed in claim 1, and a first conductivity type field effect transistor, the field effect transistor comprising:

a first conductivity type source, a first conductivity type drain, and a gate, the second source of the first semiconductor logic element is connected to the first output logic potential of the first semiconductor logic element, in the first conductivity type field effect transistor the source is connected to the second output logic potential of the first semiconductor logic element, wherein the first conductivity type drain of the field effect transistor and the output of the first semiconductor logic element are connected together as an output of the inverter configuration, and the gate of the field effect transistor and the input of the first semiconductor logic element are connected together as an input of the inverter configuration;

the input of the inverter configuration is configured to be coupled either to the first or the second input logic potential of the first semiconductor logic element, wherein when the input of the inverter configuration is coupled to the first input logic potential of the first semiconductor logic element, a conductive channel comprising mobile first conductivity type charge carriers is established between the source and the drain of the field effect transistor so that the output of the inverter configuration sets to the second output logic potential of the first semiconductor logic element, and when the input of the inverter configuration is coupled to the second input logic potential of the first semiconductor logic element, the channel of the first conductivity type field effect transistor is nonconductive causing the output of the inverter configuration to the first output logic potential of the first semiconductor logic element.

24. The logic circuitry as claimed in claim 23, wherein the field effect transistor is one of the following: conductor insulator semiconductor field effect transistor, junction field effect transistor, conductor semiconductor field effect transistor.

25. The logic circuitry as claimed in claim 23, wherein the first input logic potential of the first semiconductor logic element is the same as the first output logic potential of the first semiconductor logic element and the second input logic potential of the first semiconductor logic element is the same as the second output logic potential of the first semiconductor logic element.

\* \* \* \* \*